(12) United States Patent
Akasawa et al.

(10) Patent No.: US 10,964,700 B2
(45) Date of Patent: *Mar. 30, 2021

(54) SEMICONDUCTOR DEVICE AND MEMORY DEVICE INCLUDING THE SEMICONDUCTOR DEVICE

(71) Applicant: Semiconductor Energy Laboratory Co., Ltd., Kanagawa-ken (JP)

(72) Inventors: Fumika Akasawa, Kanagawa (JP); Hiroki Inoue, Kanagawa (JP); Takashi Nakagawa, Kanagawa (JP); Yoshiyuki Kurokawa, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/885,742

(22) Filed: May 28, 2020

(65) Prior Publication Data

US 2020/0295006 A1    Sep. 17, 2020

Related U.S. Application Data

(60) Continuation of application No. 16/175,174, filed on Oct. 30, 2018, now Pat. No. 10,672,771, which is a
(Continued)

(30) Foreign Application Priority Data

Dec. 28, 2015  (JP) .............................. JP2015-256428

(51) Int. Cl.
   *H01L 33/00*  (2010.01)
   *H01L 21/00*  (2006.01)
   *H01L 27/108* (2006.01)

(52) U.S. Cl.
   CPC .. *H01L 27/10805* (2013.01); *H01L 27/10808* (2013.01)

(58) Field of Classification Search
   CPC ................................................. H01L 27/10805
   (Continued)

(56) References Cited

U.S. PATENT DOCUMENTS 5,282,175 A   1/1994  Fujita et al.
5,445,987 A   8/1995  Kuroda et al.
(Continued)

FOREIGN PATENT DOCUMENTS

JP     05-002895 A    1/1993
JP     06-061458 A    3/1994
(Continued)

*Primary Examiner* — Calvin Lee
(74) *Attorney, Agent, or Firm* — Husch Blackwell LLP

(57) ABSTRACT

To provide a semiconductor device that can reduce power consumption and retain data for a long time and a memory device including the semiconductor device. The semiconductor device includes a word line divider, a memory cell, a first wiring, and a second wiring. The word line divider is electrically connected to the first wiring and the second wiring. The memory cell includes a first transistor with a dual-gate structure. A first gate of the first transistor is electrically connected to the first wiring, and a second gate of the first transistor is electrically connected to the second wiring. The word line divider supplies a high-level potential or a low-level potential to the first wiring and supplies a predetermined potential to the second wiring, whereby a threshold voltage of the first transistor is changed. With such a configuration, a semiconductor device that can reduce power consumption and retain data for a long time is driven.

6 Claims, 36 Drawing Sheets

Related U.S. Application Data division of application No. 15/390,957, filed on Dec. 27, 2016, now Pat. No. 10,128,249.

(58) Field of Classification Search
USPC .......... 438/239, 284; 257/265, 266, 298–300
See application file for complete search history.

(56) References Cited

U.S. PATENT DOCUMENTS

| | | |
|---|---|---|
| 5,610,420 A | 3/1997 | Kuroda et al. |
| 6,061,267 A | 5/2000 | Houston |
| 8,709,889 B2 | 4/2014 | Saito |
| 9,024,317 B2 | 5/2015 | Endo et al. |
| 9,029,929 B2 | 5/2015 | Saito |
| 9,312,280 B2 | 4/2016 | Kobayashi |
| 9,318,484 B2 | 4/2016 | Matsubayashi |
| 9,349,751 B2 | 5/2016 | Yamazaki et al. |
| 9,583,177 B2 | 2/2017 | Ishizu |
| 9,685,500 B2 * | 6/2017 | Yamazaki ......... H01L 29/78696 365/155 |
| 9,735,179 B2 | 8/2017 | Endo et al. |
| 10,068,906 B2 | 9/2018 | Matsubayashi |
| 10,128,249 B2 * | 11/2018 | Akasawa .......... H01L 27/10808 257/298 |
| 10,672,771 B2 * | 6/2020 | Akasawa ................. G11C 8/08 438/239 |
| 2012/0161139 A1 | 6/2012 | Endo et al. |
| 2012/0292615 A1 | 11/2012 | Saito |
| 2012/0294061 A1 | 11/2012 | Nagatsuka et al. |
| 2014/0231799 A1 | 8/2014 | Matsubayashi |
| 2015/0231799 A1 | 8/2015 | Wittbold et al. |
| 2015/0287749 A1 | 10/2015 | Miyake |
| 2017/0179160 A1 | 6/2017 | Takahashi |
| 2017/0179294 A1 | 6/2017 | Kato et al. |
| 2017/0186355 A1 | 6/2017 | Takahashi et al. |
| 2017/0186473 A1 | 6/2017 | Ikeda et al. |
| 2017/0186749 A1 | 6/2017 | Ohshima et al. |
| 2017/0186777 A1 | 6/2017 | Toyotaka et al. |
| 2017/0187360 A1 | 6/2017 | Uesugi et al. |
| 2018/0174647 A1 | 6/2018 | Takahashi et al. |

FOREIGN PATENT DOCUMENTS

| | | |
|---|---|---|
| JP | 2004-234713 A | 8/2004 |
| JP | 2012-146965 A | 8/2012 |
| JP | 2012-256877 A | 12/2012 |
| JP | 2013-008434 A | 1/2013 |
| JP | 2014-186788 A | 10/2014 |

\* cited by examiner

103B

MB3[i,j]

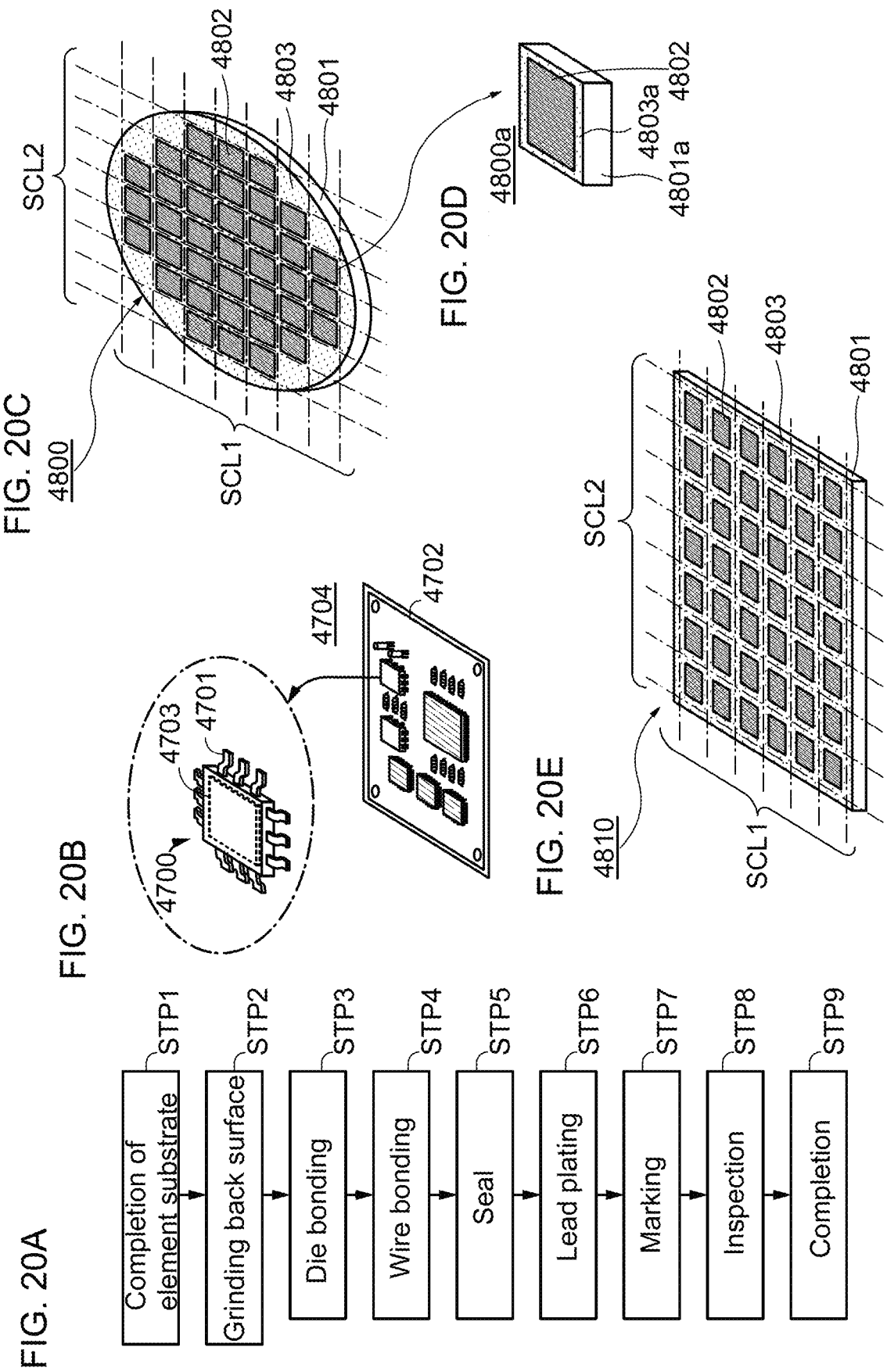

FIG. 22A
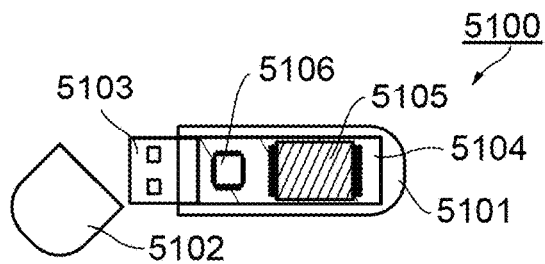
FIG. 22B
FIG. 22C
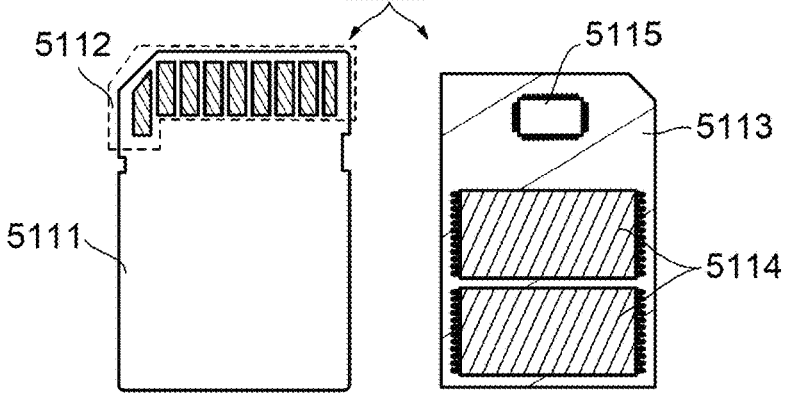
FIG. 22D
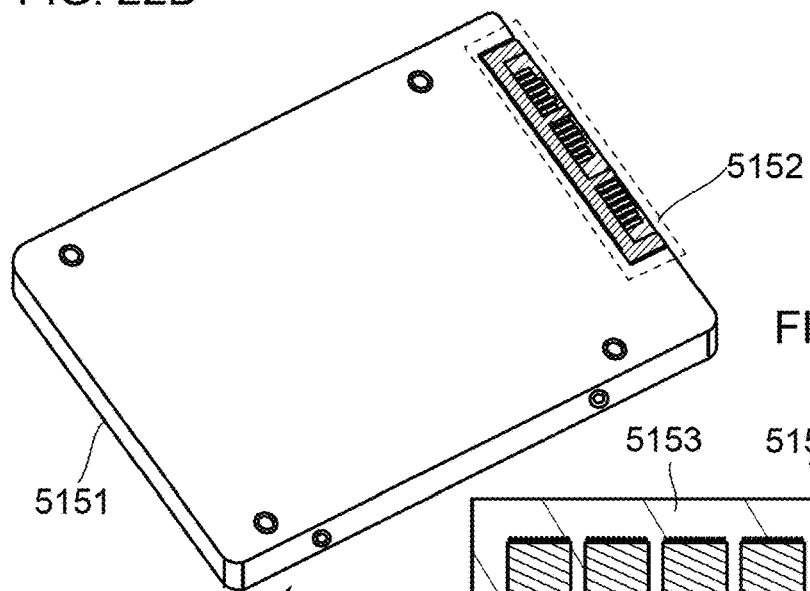
FIG. 22E
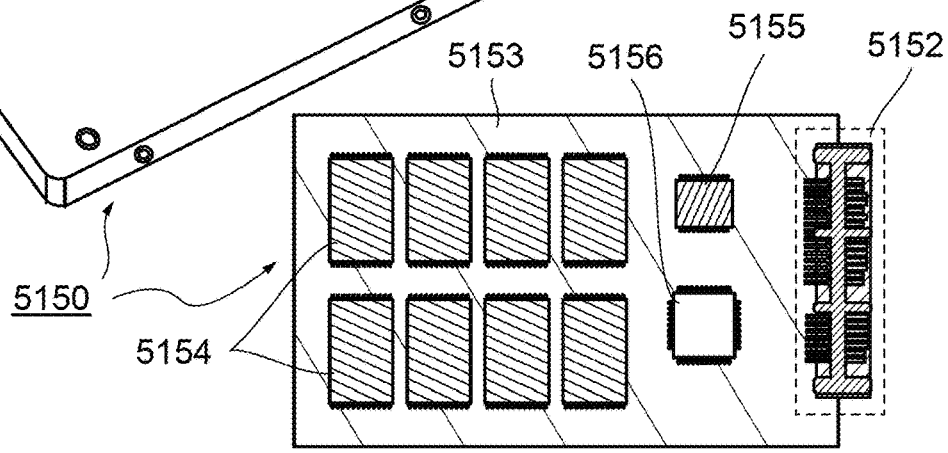

4000

4000

4000

4000

4000

4000

FIG. 30A
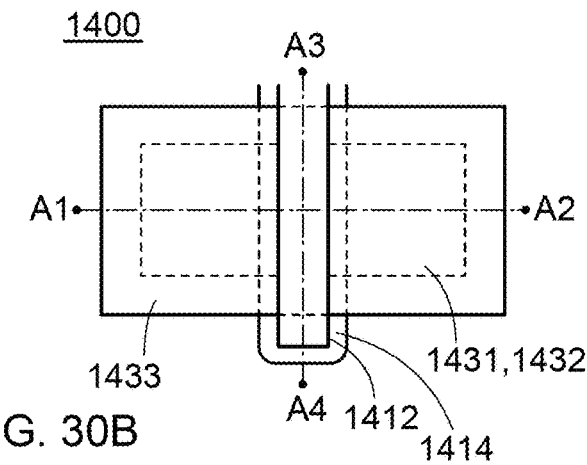
FIG. 30B
FIG. 30C
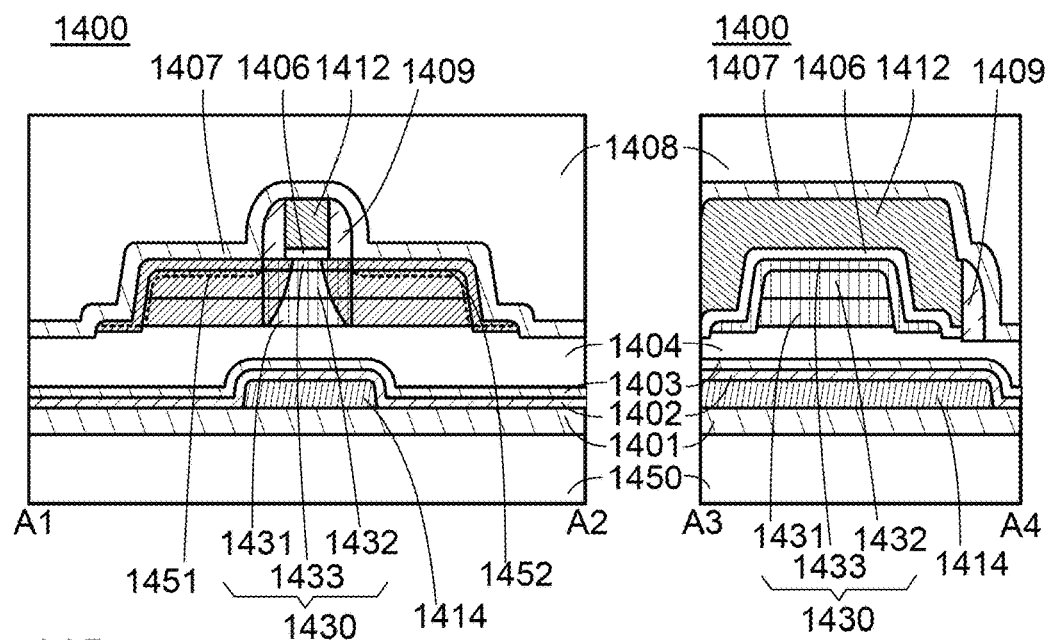
FIG. 30D
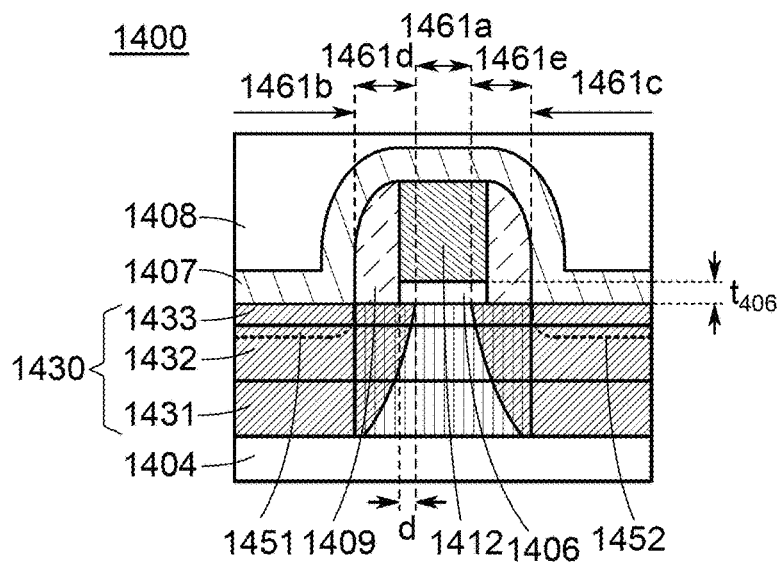

SEMICONDUCTOR DEVICE AND MEMORY DEVICE INCLUDING THE SEMICONDUCTOR DEVICE

This application is a continuation of U.S. application Ser. No. 16/175,174, filed on Oct. 30, 2018 (now U.S. Pat. No. 10,672,771, issued Jun. 2, 2020), which is a divisional of U.S. application Ser. No. 15/390,957, filed on Dec. 27, 2016 (now U.S. Pat. No. 10,128,249, issued Nov. 13, 2018), which are all incorporated herein by reference.

BACKGROUND OF THE INVENTION

1. Field of the Invention

One embodiment of the present invention relates to a semiconductor device and a memory device including the semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, electronic components such as central processing units (CPUs), memory devices, and sensors have been used in various electronic devices such as personal computers, smart phones, and digital cameras. The electronic components have been improved to achieve miniaturization, lower power consumption, and other various objectives.

In particular, the data amount processed in the electronic devices has increased in recent years, and thus, the development of memory devices that can retain a large amount of data has progressed. With an increase in capacity of the memory device, methods relating data writing and data reading have progressed; for example, the methods are for preventing data loss, for writing/reading data at high-speed operation, for reducing power consumption, for integration, and the like.

REFERENCE

Patent Document

[Patent Document 1] Japanese Published Patent Application No. 2013-008434
[Patent Document 2] Japanese Published Patent Application No. 2004-234713

SUMMARY OF THE INVENTION

A memory cell of a dynamic random access memory (DRAM) generally includes an access transistor (hereinafter, referred to as "selection transistor" in some cases) and a capacitor. When a memory cell array in which memory cells are located in matrix as an arrangement form of memory cells is employed, gates of a plurality of access transistors are electrically connected to one word line, and first or second terminals of the plurality of access transistors are electrically connected to one bit line.

When one memory cell in the DRAM is selected, a potential is applied to a gate of an access transistor in the memory cell. At this time, the potential is applied also to gates of access transistors in memory cells in the same row as that in the selected memory cell. Thus, data held by the memory cells which are not subjected to the writing/reading data is lost in some cases.

As the countermeasure, the following operation and configuration have been devised: a refresh operation in which data is rewritten at the time of writing or reading data to/from DRAM; a configuration in which a plurality of memory cells of DRAM electrically connected to a word line is divided into blocks, and a switching element is provided between the word line and each of the blocks, so that the potential is prevented from being applied to gates of access transistors in the memory cells which are not subjected to the writing/reading data (see Patent Document 1). A method for dividing one word line with use of a transistor has also been devised (see Patent Document 2).

However, with the method for dividing a word line described in Patent Document 2, the potential of a sub word line (corresponding to a sub word line in Patent Document 2) is gradually changed due to leakage current of a transistor connected to a word line (corresponding to a main word line in Patent Document 2) and the sub word line, so that a memory cell connected to the sub word line is in a selected state. In particular, when a memory cell is unintentionally selected in a DRAM, retained data is lost in some cases.

An object of one embodiment of the present invention is to provide a novel semiconductor device. Another object of one embodiment of the present invention is to provide a memory device or a module including the novel semiconductor device. Another object of one embodiment of the present invention is to provide an electronic device using the memory device or module including the novel semiconductor device. Another object of one embodiment of the present invention is to provide a system with the memory device or module including the novel semiconductor device.

Another object of one embodiment of the present invention is to provide a memory device with high memory capacity. Another object of one embodiment of the present invention is to provide a memory device with low power consumption. Another object of one embodiment of the present invention is to provide a memory device with a novel data writing and reading method. Another object of one embodiment of the present invention is to provide an electronic device including the memory device.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1)

One embodiment of the present invention is a semiconductor device including a first circuit, a memory cell, a first wiring, and a second wiring, where the memory cell includes a first transistor, where the first transistor has a dual-gate structure and includes a first gate and a second gate, where the first circuit is electrically connected to the first wiring and a second wiring, where the first wiring is electrically connected to the first gate of the first transistor, where the second wiring is electrically connected to the second gate of the first transistor, and where the first circuit has a function of applying a high-level potential or a low-level potential to the first wiring and a function of applying a first potential to the second wiring to shift a threshold voltage of the first transistor.

(2)

Another embodiment of the present invention is the semiconductor device according to (1), where the first circuit includes a second transistor, a third transistor, a fourth transistor, a first capacitor, and a second capacitor, where a polarity of the second transistor is different from a polarity of the third transistor, where a first terminal of the second transistor is electrically connected to a first terminal of the third transistor, where the first terminal of the second transistor is electrically connected to a first terminal of the first capacitor, where the first terminal of the second transistor is electrically connected to the first wiring, where a gate of the second transistor is electrically connected to a gate of the third transistor, where the first terminal of the third transistor is electrically connected to the first wiring, where a first terminal of the fourth transistor is electrically connected to a second terminal of the first capacitor, where the first terminal of the fourth transistor is electrically connected to the first terminal of the second capacitor, and where first terminal of the fourth transistor is electrically connected to the second wiring.

(3)

Another embodiment of the present invention is the semiconductor device according to (2), where the fourth transistor includes an oxide semiconductor in a channel formation region.

(4)

Another embodiment of the present invention is the semiconductor device according to (2) or (3), where the first circuit includes a fifth transistor, and where a first terminal of the fifth transistor is electrically connected to the first terminal of the fourth transistor.

(5)

Another embodiment of the present invention is the semiconductor device according to (4), where the fifth transistor includes an oxide semiconductor in a channel formation region.

(6)

Another embodiment of the present invention is a semiconductor device including a first circuit, a memory cell, and a first wiring, where the memory cell includes a first transistor, where the first circuit includes a second transistor and a third transistor, where a polarity of the second transistor is different from a polarity of the third transistor, where a first terminal of the second transistor is electrically connected to the first wiring, where the first terminal of the second transistor is electrically connected to a first terminal of the third transistor, where a gate of the second transistor is electrically connected to a gate of the third transistor, and where the first wiring is electrically connected to a gate of the first transistor.

(7)

Another embodiment of the present invention is the semiconductor device according to any one of (2) to (6), where the second transistor includes silicon in a channel formation region, and where the third transistor includes silicon in a channel formation region.

(8)

Another embodiment of the present invention is a memory device including the semiconductor device according to any one of (1) to (7) and a driver circuit.

(9)

Another embodiment of the present invention is a semiconductor wafer including a plurality of the semiconductor devices according to any one of (1) to (7) or a plurality of the memory devices according to (8), and a region for dicing.

(10)

Another embodiment of the present invention is an electronic device including the memory device according to (8) and a housing.

According to one embodiment of the present invention, a novel semiconductor device can be provided. According to one embodiment of the present invention, a memory device or module including the novel semiconductor device can be provided. According to one embodiment of the present invention, an electronic device using the memory device or module including the novel semiconductor device can be provided. According to one embodiment of the present invention, a system with the memory device including the novel semiconductor device can be provided.

According to one embodiment of the present invention, a memory device with high memory capacity can be provided. According to one embodiment of the present invention, a memory device with low power consumption can be provided. According to one embodiment of the present invention, a memory device with a novel data writing and reading method can be provided. According to one embodiment of the present invention, an electronic device including the above-described memory device can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIG. 20A is a flow chart showing a process for manufacturing an electronic component, and FIGS. 20B to 20E are each a schematic perspective view illustrating the electronic component.

FIGS. 22A to 22E are each a perspective view of an electronic device.

FIGS. 30A to 30D are a top view and cross-sectional views illustrating a structure example of a transistor.

DETAILED DESCRIPTION OF THE INVENTION

An "electronic device", an "electronic component", a "module", and a "semiconductor device" are described. In general, an "electronic device" may refer to a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

In this specification, an oxide semiconductor is referred to as an OS in some cases. Thus, a transistor including an oxide semiconductor in a channel formation region is referred to as an OS transistor in some cases.

Embodiment 1

In this embodiment, a structure of a semiconductor device in one embodiment of the present invention will be described.

Figure 1:
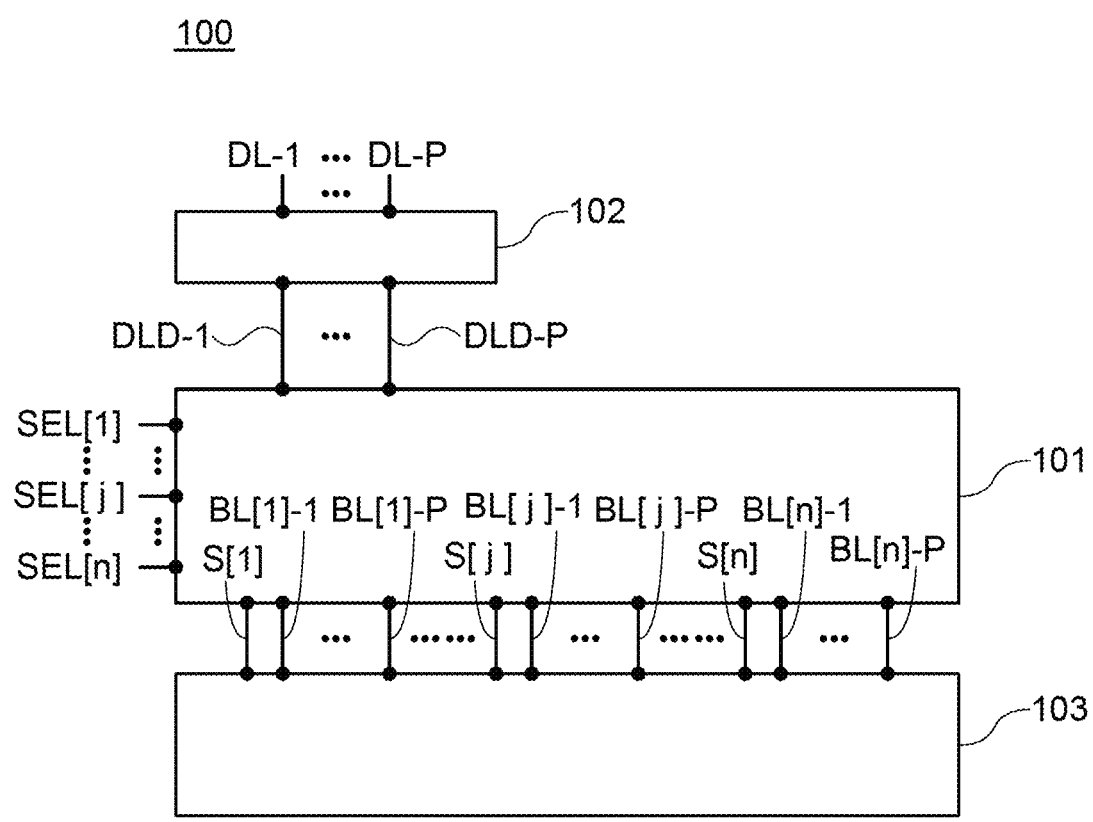
FIG. 1 is a block diagram showing an example of a semiconductor device.

FIG. 1 illustrates an example of a semiconductor device of the disclosed invention. A semiconductor device 100 includes a selector circuit 101, a sense amplifier/precharge circuit 102, and a memory cell array 103.

The sense amplifier/precharge circuit 102 is electrically connected to wirings DL-1 to DL-P (P is an integer greater than or equal to 1). In addition, the sense amplifier/precharge circuit 102 is electrically connected to the selector circuit 101 via wirings DLD-1 to DLD-P. The selector circuit 101 is electrically connected to the memory cell array 103 via wirings BL[1]-1 to BL[n]-P (n is an integer greater than or equal to 1). Note that the wirings BL[1]-1 to BL[n]-P are a wiring group consisting of n sets where one set comprises wirings BL[j]-1 to BL[j]-P (j is an integer greater than or equal to 1 and less than or equal to n), that is, constituted by n×P wirings in total.

The selector circuit 101 is electrically connected to wirings SEL[1] to SEL[n]. The selector circuit 101 is electrically connected to the memory cell array 103 via wirings S[1] to S[n].

The sense amplifier/precharge circuit 102 is provided with a sense amplifier that amplifies the voltages of the wirings DL-1 to DL-P and the wirings DLD-1 to DLD-P up to the level at which the voltages can be treated as a digital level, and a precharge circuit that applies a predetermined potential to the wirings DLD-1 to DLD-P when data is read out from the memory cell array 103.

In particular, in the case of DRAM, data retained in a memory cell is damaged and lost once the data is read out from the memory cell. To prevent the data loss, the sense amplifier is driven to amplify the data after the data is read out, and the amplified data is rewritten to the memory cell.

The selector circuit 101 has a function of dividing and inputting a signal that is inputted to the wirings DLD-1 to DLD-P into P wirings in the wirings BL[1]-1 to BL[n]-P, and a function of selecting any of the wirings from the wirings BL[1]-1 to BL[n]-P and inputting a signal of the selected wiring into the wirings DLD-1 to DLD-P. The wirings SEL[1] to SEL[n] are wirings which supply an address signal. When receiving the address signal, the selector circuit 101 has a function of writing the signal that is inputted to the wirings DL-1 to DL-P into an address of the memory cell array 103 stored in the address signal, and a function of reading data that is held by the address stored in the address signal from the memory cell array 103.

The selector circuit 101 has a function of generating a signal that controls a word line divider included in the memory cell array 103 and supplying the signal to the wirings S[1] to S[n]. Note that the word line divider is described below.

Note that in FIG. 1, only the following components are shown: the selector circuit 101; the sense amplifier/precharge circuit 102; the memory cell array 103; the wiring DL-1; the wiring DL-P; the wiring DLD-1; the wiring DLD-P; the wiring SEL[1]; the wiring SEL[j]; the wiring SEL[n]; the wiring BL[1]-1; the wiring BL[1]-P; the wiring BL[j]-1; the wiring BL[j]-P; the wiring BL[n]-1; the wiring BL[n]-P; the wiring S[1]; the wiring S[j]; and the wiring S[n]. Other reference numerals, symbols, wirings, circuits, and the like are not shown.

Configuration Example 1 of Memory Block

Figure 2A:
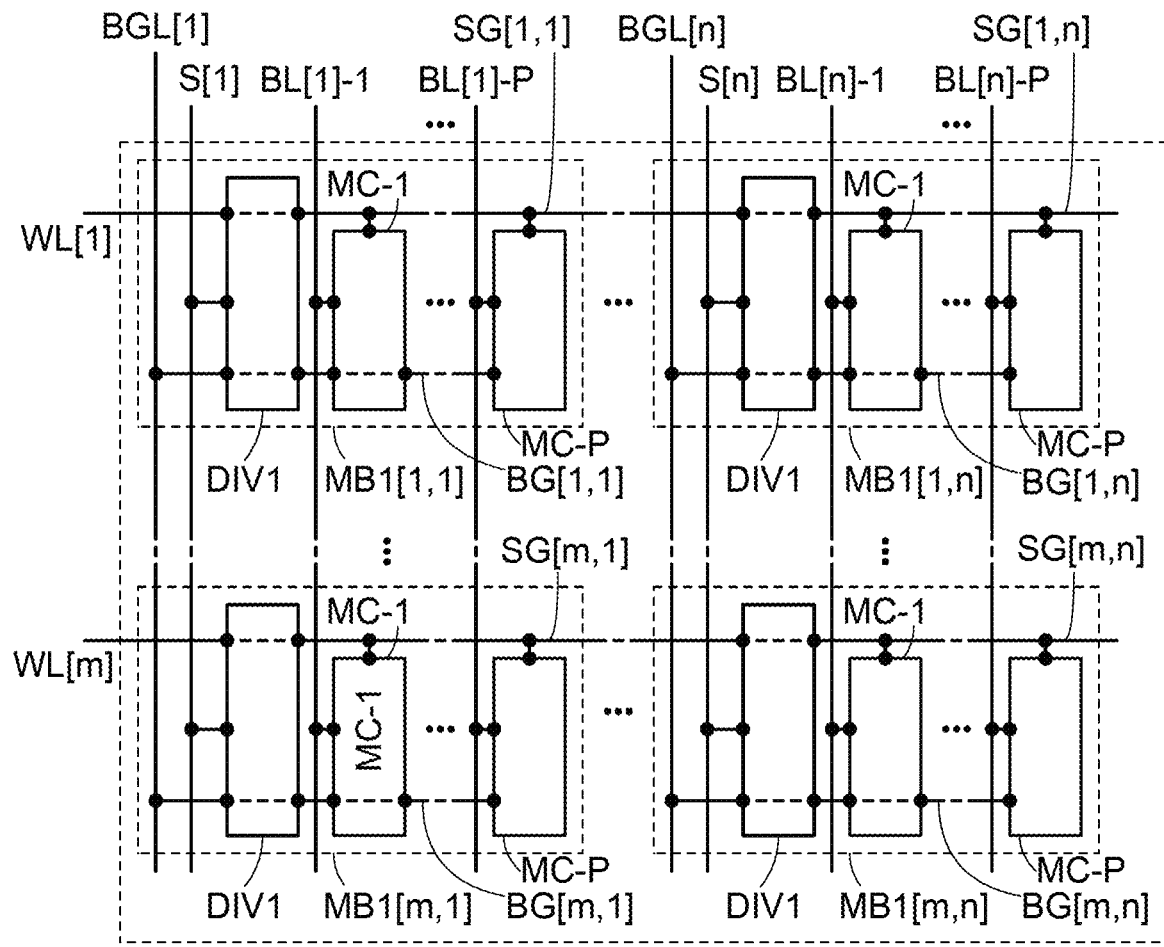
FIGS. 2A and 2B are block diagrams each showing an example of a semiconductor device.

The memory cell array 103 is described. FIG. 2A shows a memory cell array 103A that is an example of a configuration in the memory cell array 103 in FIG. 1. In the memory cell array 103A, memory blocks MB1 are provided in matrix of n columns and m rows, i.e., m×n memory blocks MB1 are provided. FIG. 2A also shows a memory block MB1[i,j] in an i-th row (i is an integer greater than or equal to 1) and a j-th column (j is an integer greater than or equal to 1). In this specification, memory blocks MB1[1,1] to MB1[m,n] are collectively referred to as memory block MB1 in some cases.

Figure 2B:
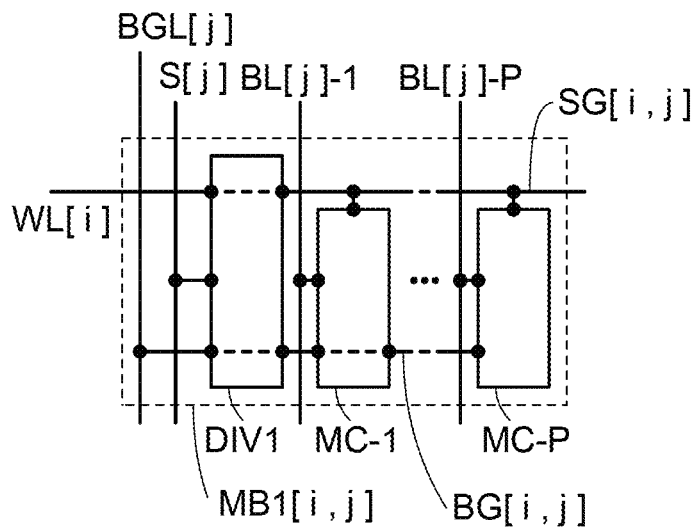

Next, the memory block MB1[i,j] is focused on, and a configuration thereof is described. A connection structure of the memory block MB1[i,j] is shown in FIG. 2B. The memory block MB1[i,j] includes a circuit DIV1 that is a word line divider and memory cells MC-1 to MC-P. The circuit DIV1 in the memory block MB1[i,j] is electrically connected to a wiring S[j]. The circuit DIV1 in the memory block MB1[i,j] is electrically connected to the memory cells MC-1 to MC-P in the memory block MB1[i,j] via wiring SG[i,j]. The memory cells MC-1 to MC-P in the memory block MB1[i,j] are electrically connected to wirings BL[j]-1 to BL[j]-P, respectively.

The circuit DIV1 in the memory block MB1[i,j] is electrically connected to a wiring BGL[j]. The wiring BGL[j] is electrically connected to a wiring BG[i,j] via the circuit DIV1 in the memory block MB1[i,j]. The wiring BG[i,j] is electrically connected to each of the memory cells MC-1 to MC-P A wiring WL[i] functions as a word line and is a wiring for writing/reading data to/from the memory cells in all the memory blocks MB1 in the i-th row.

The wiring BGL[j] is a wiring for controlling threshold voltages of transistors in the memory cells in all the memory blocks MB1 in the j-th column.

Note that FIG. 2A shows only the following components: the memory cell array 103A; a memory block MB1[1,1]; a memory block MB1[m,1]; a memory block MB1[1,n]; the memory block MB1[m,n]; the circuit DIV1; the memory cell MC-1; the memory cells MC-P; a wiring WL[1]; a wiring WL[m]; a wiring BGL[1]; a wiring BGL[n]; a wiring SG[1,1]; a wiring SG[m,1]; a wiring SG[1,n]; a wiring SG[m,n]; a wiring BG[1,1]; a wiring BG[m,1]; a wiring BG[1,n]; a wiring BG[m,n]; a wiring BL[1]-1; a wiring BL[1]-P; a wiring BL[n]-1; a wiring BL[n]-P; a wiring S[1]; and a wiring S[n]. Other reference numerals, symbols, wirings, circuits, and the like are not shown.

Figure 3A:
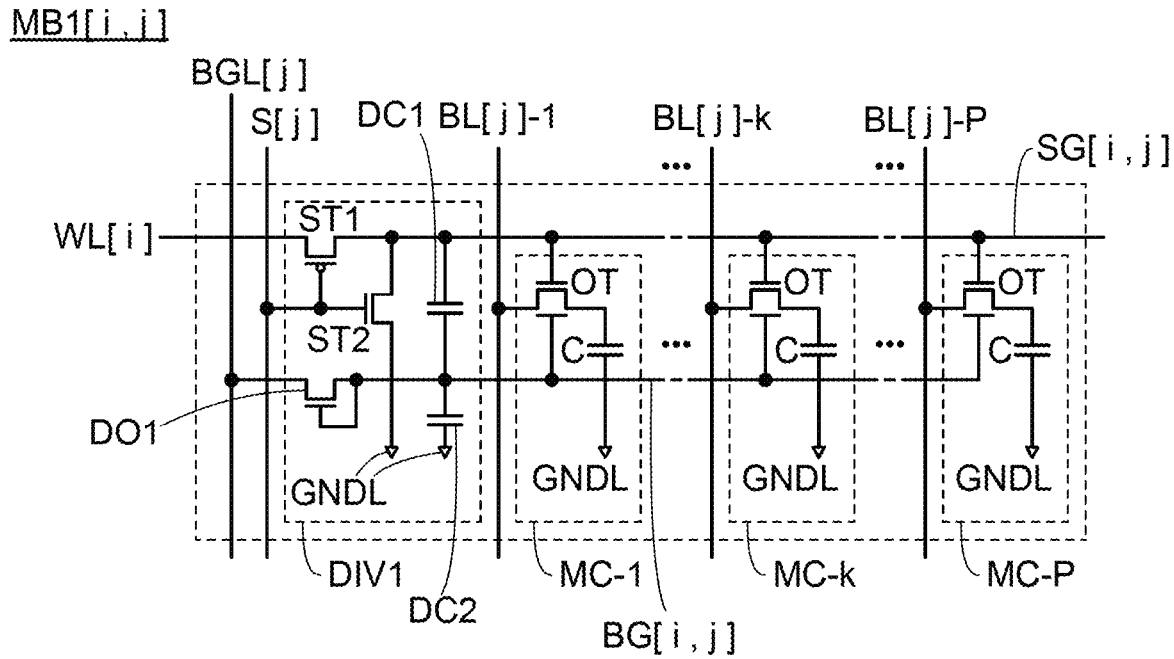
FIGS. 3A and 3B are circuit diagrams each showing a configuration example of FIG. 2B.

FIG. 3A shows a specific circuit example of the memory block MB1[i,j].

The circuit DIV1 includes a transistor ST1, a transistor ST2, a transistor DO1, a capacitor DC1, and a capacitor DC2. Each of the memory cells MC-1 to MC-P includes a transistor OT and a capacitor C.

The transistor ST1 is a p-channel transistor, and the transistor ST2 is an n-channel transistor. Note that, depending on the circumstances or conditions, the transistor ST1 can be an n-channel transistor and the transistor ST2 can be a p-channel transistor. In addition, the transistor OT and the transistor DO1 are n-channel transistors. The transistor OT has a dual-gate structure including a first gate and a second gate. A wiring GNDL shown in FIG. 3A is a wiring for supplying a low-level potential GND.

A first terminal of the transistor ST1 is electrically connected to the wiring WL[i], a second terminal of the transistor ST1 is electrically connected to the wiring SG[i,j], and a gate of the transistor ST1 is electrically connected to a wiring S[j]. A first terminal of the transistor ST2 is electrically connected to the wiring SG[i,j], a second terminal of the transistor ST2 is electrically connected to the wiring GNDL, and a gate of the transistor ST2 is electrically connected to the wiring S[j]. A first terminal of the transistor DO1 is electrically connected to the wiring BGL[j], a second terminal of the transistor DO1 is electrically connected to the wiring BG[i,j], and a gate of the transistor DO1 is electrically connected to the second terminal of the transistor DO1. A first terminal of the capacitor DC1 is electrically connected to the wiring SG[i,j], and a second terminal of the capacitor DC1 is electrically connected to the wiring BG[i,j]. A first terminal of the capacitor DC2 is electrically connected to the wiring BG[i,j], and a second terminal of the capacitor DC2 is electrically connected to the wiring GNDL.

Next, a memory cell MC-k (k is an integer greater than or equal to 1 and less than or equal to P) is focused on, and a configuration thereof is described. For the memory cell in the memory block MB1[i,j], DRAM is employed as a configuration example. A first terminal of the transistor OT in the memory cell MC-k is electrically connected to a wiring BL[j]-k, a second terminal of the transistor OT in the memory cell MC-k is electrically connected to a first terminal of the capacitor C in the memory cell MC-k, a first gate of the transistor OT in the memory cell MC-k is electrically connected to the wiring SG[i,j], and a second gate of the transistor OT in the memory cell MC-k is electrically connected to the wiring BG[i,j]. A second terminal of the capacitor C in the memory cell MC-k is electrically connected to the wiring GNDL.

Note that the memory cell in the memory block MB1[i,j] is not limited to DRAM. For example, the memory block MB1[i,j] may have a configuration where instead of DRAM, a gain-cell-type memory device including two transistors and one capacitor (hereinafter, referred to as "2T1C-type memory cell" in some cases) or a gain-cell-type memory device including three transistors and one capacitor (hereinafter, referred to as "3T1C-type memory cell" in some cases) is used. Such a configuration is described in Embodiment 2.

Note that FIG. 3A shows only the following components: the memory block MB1[i,j]; the circuit DIV1; the memory cell MC-1; the memory cell MC-k; the memory cell MC-P; the wiring WL[i]; the wiring BGL[j]; the wiring SG[i,j]; the wiring BL[j]-1; the wiring BL[j]-k; the wiring BL[j]-P; the wiring S[j]; the wiring BG[i,j]; the wiring GNDL; the transistor ST1; the transistor ST2; the transistor DO1; the transistor OT; the capacitor DC1; the capacitor DC2; and the capacitor C. Other reference numerals, symbols, wirings, circuits, and the like are not shown.

Operation Example 1

Next, an operation example of a semiconductor device is described. In the semiconductor device, the memory cell array 103A in FIGS. 2A and 2B and the memory block MB1[i,j] in FIG. 3A are employed.

<<Writing Operation>>

Figure 4:
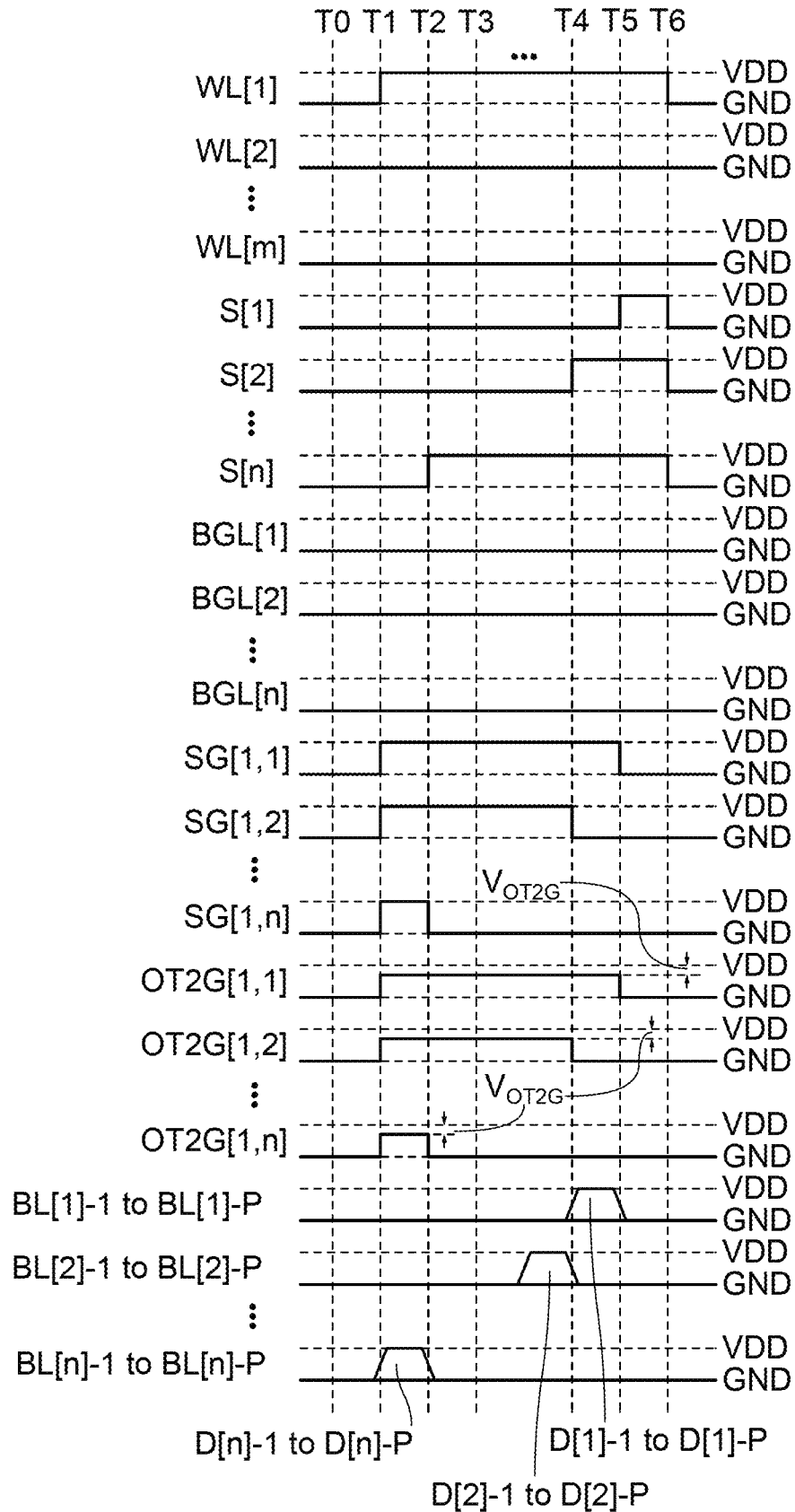
FIG. 4 is a timing chart showing an operation example of a semiconductor device.

FIG. 4 is a timing chart showing an example of a writing operation of a semiconductor device in which the memory cell array 103A in FIGS. 2A and 2B and the memory block MB1[i,j] in FIG. 3A are employed. The timing chart of FIG. 4 shows a change in potential over time of each of the wiring WL[1], a wiring WL[2], the wiring S[1], a wiring S[2], the wiring S[n], the wiring BGL[1], a wiring BGL[2], the wiring BGL[n], the wiring SG[1,1], a wiring SG[1,2], the wiring SG[1,n], an OT2G[1,1], an OT2G[1,2], an OT2G[1,n], the wirings BL[1]-1 to BL[1]-P, wirings BL[2]-1 to BL[2]-P, and the wirings BL[n]-1 to BL[n]-P. Note that the OT2G[1,1], the OT2G[1,2], and the OT2G[1,n] indicates the second gate of the transistor OT in the memory block MB1[1,1], that in a memory block MB1[1,2], and that in the memory block MB1[1,n], respectively. The wirings BL[1]-1 to BL[1]-P transmit or receive signals concurrently and thus are shown collectively in the timing chart. The wirings BL[2]-1 to BL[2]-P transmit or receive signals concurrently and thus are shown collectively. The wirings BL[n]-1 to BL[n]-P transmit or receive signals concurrently and thus are shown collectively.

In addition, the timing chart of FIG. 4 shows an operation of writing data to the memory blocks MB1[1,1] to MB1[1,n] in the first row of the memory cell array 103A.

During a period from Time T0 to Time T1, an operation in which the potential of the wiring BG[i,j] in the memory block MB1[i,j] is made to be the low-level potential GND is performed. By setting the potentials of the wirings BGL[1] to BGL[n] to the low-level potential GND, the potentials of the wirings BG[1,1] to BG[m,n] are made to be the low level potential GND. When the potential of the wiring BG[i,j] is lower than the low-level potential GND, it is necessary to take a time for discharging charges in the wiring BG[i,j] in some cases.

At Time T1, the low-level potential GND is supplied to the wirings S[1] to S[n]. Thus, in all the memory blocks MB1, the transistors ST1 are brought into an on state, and the transistors ST2 are brought into an off state. In addition, at Time T1, the high-level potential VDD is supplied to the wiring WL[1], and the low-level potential GND is supplied to the wirings WL[2] to WL[m]. Since the transistors ST1 in all the memory blocks MB1 are in an on state, the wiring WL[1] and the wirings SG[1,1] to SG[1,n] are electrically connected, and the potentials of the wirings SG[1,1] to SG[1,n] accordingly come to the high-level potential VDD. Except in the case where i=1, the wiring WL[i] and the wirings SG[i,1] to SG[i,n] are electrically connected, and the potentials of the wirings SG[i,1] to SG[i,n] accordingly come to the low-level potential GND. Note that the timing chart of FIG. 4 does not show a change in the potential of the wiring SG other than the wirings SG[1,1] to SG[1,n] in the memory cell array 103A.

At this time, the wiring SG[i,j] and the wiring BG[i,j] are connected through the capacitor DC1 in the memory block MB1[i,j], and a potential is generated at the second terminal of the capacitor DC1 accordingly. The transistor DO1 in the memory block MB1[i,j] is diode-connected. When the potential of the wiring BG[i,j] is lower than that of the wiring BGL[j], current does not flow in the transistor DO1, and the wiring BG[i,j] is in a floating state. Thus, the potential is generated at the second terminal of the capacitor DC1, and the potential is generated at the second gates of all the transistors OT in the memory block MB1[i,j]. At this time, the potential generated at the second gates of all the transistors OT in the memory block MB1[i,j] is determined depending on the capacitance of the capacitor DC1 and the capacitance of the capacitor DC2. The potentials of the second gates of the transistors OT in the memory blocks MB1[1,1] to MB1[1,n], which are generated from the wirings SG[1,1] to SG[1,n], are each referred to as $V_{OT2G}$. In this operation, $V_{OT2G}$ is higher than the low-level potential GND and lower than the high-level potential VDD. By this, in each of the transistors OT in the memory blocks MB1[1,1] to MB1[1,n], the threshold voltage is shifted in the negative side. When the potential lower than the high-level potential VDD is supplied to the first gate of the transistor OT, the transistor OT can be turned on.

Note that the potential of the second gate of the transistor OT is determined depending on the capacitances of the capacitor DC1 and the capacitor DC2. In other words, at the stage of circuit design of the memory block MB1 PA, it is preferable to determine the capacitances of the capacitor DC1 and the capacitor DC2, which correspond to the potential that is to be applied to the second gate of the transistor OT in each of the memory cells MC-1 to MC-P.

The parasitic capacitance generated between the wiring SG[i,j] and the wiring BG[i,j] can be used as a capacitor instead of using the capacitor DC1. In this case, the memory block MB1[i,j] can have a configuration without the capacitor DC1.

During a period from Time T1 to Time T2, data D[n]-1 to D[n]-P are supplied from the wirings BL[n]-1 to BL[n]-P, respectively, to the memory cell array 103A. The data D[n]-1 to D[n]-P are written to the memory cells MC-1 to MC-P, respectively. Specifically, the data D[n]-1 to D[n]-P are written to first terminals of capacitors C in the memory block MB1[1,n]. Note that the data D[n]-1 to D[n]-P are data inputted from the wirings DL-1 to DL-P in the semiconductor device 100 shown in FIG. 1.

At Time T2, the high-level potential VDD is supplied to the wiring S[n]. Thus, in the memory block MB1[1,n], the transistor ST1 is brought into an off state, and the transistor ST2 is brought into an on state. The low-level potential GND is supplied to the first gates of all the transistors OT in the memory block MB1[1,n]. Accordingly, the transistors OT are turned off. Thus, data written during a period from Time T1 to Time T2 are retained in the memory cells MC-1 to MC-P in the memory block MB1[1,n].

Note that the low-level potential GND is inputted to the wiring SG[1,n] through the transistor ST2 in the memory block MB1[1,n]. Thus, the potential of the capacitor DC1 in the memory block MB1[1,n] returns to the potential the same as that during a period from Time T0 to Time T1, i.e., low-level potential GND, whereby the second gates of the transistors OT in the memory block MB1[1,n] come to have the low-level potential GND.

During a period from Time T2 to Time T3, the wirings SG[1,1] to SG[1,n−1] have the high-level potential VDD. Thus, all transistors OT in the memory blocks MB1[1,1] to MB1[1,n−1] come to be in an on state.

During a period from Time T2 to Time T3, signals of data D[n−1]-1 to D[n−1]-P are transmitted from the wirings BL[n−1]-1 to BL[n−1]-P, respectively. The signals of data D[n−1]-1 to D[n−1]-P are written into the memory cells MC-1 to MC-P, respectively, in the memory block MB1[1, n-1]. The data D[n-1]-1 to D[n-1]-P are data inputted from the wirings DL-1 to DL-P in the semiconductor device 100 shown in FIG. 1. The writing operation of data D[n-1]-1 to D[n-1]-P in the memory block MB1[1,n-1] is not shown in the timing chart in FIG. 4.

During a period from Time T3 to Time T4, data is written to the memory blocks MB1[1,2] to MB1[1,n-2]. The data written into the memory blocks MB1[1,2] to MB1[1,n-2] are data inputted from the wirings DL-1 to DL-P in the semiconductor device 100 shown in FIG. 1.

In particular, immediately before Time T4, data D[2]-1 to D[2]-P are supplied from the wirings BL[2]-1 to BL[2]-P to the memory cell array 103A. The data D[2]-1 to D[2]-P are written into the first terminals of the capacitors C in the memory cells MC-1 to MC-P of the memory block MB1[1, 2].

At Time T4, the high-level potential VDD is supplied to the wiring S[2]. Thus, in the memory block MB1[1,2], the transistor ST1 is brought into an off state and the transistor ST2 is brought into an on state. The low-level potential GND is supplied to the first gates of all the transistors OT in the memory block MB1[1,2]. Accordingly, the transistors OT come to be in an off state. Thus, the data written immediately before Time T4 are retained in the memory cells MC-1 to MC-P in the memory block MB1[1,2].

The low-level potential GND is inputted into the wiring SG[1,2] through the transistor ST2 in the memory block MB1[1,2]. Thus, the potential of the capacitor DC1 in the memory block MB1[1,2] returns to the potential the same as that during a period from Time T0 to Time T1, i.e., the low-level potential GND, whereby the second gates of the transistors OT in the memory block MB1[1,2] come to have the low-level potential GND.

During a period from Time T4 to Time T5, the low-level potential GND is supplied to the wiring S[1]. Thus, in the memory block MB1[1,1], the transistor ST1 is brought into an on state, and the transistor ST2 is brought into an off state; accordingly, the wiring WL[1] and the wiring SG[1,1] are electrically connected. Accordingly, the potential of the wiring WL[1] comes to the high-level potential VDD, and the potential of the wiring SG[1,1] comes to the high-level potential VDD, whereby all the transistors OT in the memory block MB1[1,1] are brought into an on state.

At this time, data D[1]-1 to D[1]-P are supplied from the wirings BL[1]-1 to BL[1]-P to the memory cell array 103A. The data D[1]-1 to D[1]-P are written to the first terminals of the capacitors C in the memory cells MC-1 to MC-P in the memory block MB1[1,1]. The data D[1]-1 to D[1]-P are data inputted from the wirings DL-1 to DL-P in the semiconductor device 100 shown in FIG. 1.

At Time T5, the high-level potential VDD is supplied to the wiring S[1]. Thus, in the memory block MB1[1,1], the transistor ST1 is brought into an off state, and the transistor ST2 is brought into an on state. The low-level potential GND is supplied to the first gates of all the transistors OT in the memory block MB1[1,1]. Accordingly, the transistors OT are come to be in an off state. In the above manner, the data written during a period from Time T4 to Time T5 are retained in the memory cells MC-1 to MC-P in the memory block MB1[1,1].

The low-level potential GND is inputted into the wiring SG[1,1] through the transistor ST2 in the memory block MB1[1,1]. Thus, the potential of the capacitor DC1 in the memory block MB1[1,1] returns to the potential the same as that during a period from Time T0 to Time T1, i.e., the low-level potential GND, whereby the second gates of the transistors OT in the memory block MB1[1,1] come to have the low-level potential GND.

Before Time T6 starts, writing data into the memory blocks MB1[1,1] to MB1[1,n] in the first row of the memory cell array 103A is completed. At Time T6, the low-level potential GND is applied to the wiring WL[1], and the low-level potential GND is applied to the wirings S[1] to S[n]. Thus, all the transistors OT in the memory blocks MB1[1,1] to MB1[1,n] are brought into an off state, whereby the data written in the memory blocks MB1[1,1] to MB1[1,n] can be retained.

In the case where data is written into the memory blocks MB1[i,1] to MB1[1,n] in the i-th row of the memory cell array 103A, the data writing may be performed in a manner similar to that of data writing to the memory blocks MB1[1,1] to MB1[1,n] connected to the wiring WL[1].

<<Reading Operation>>

Figure 3B:
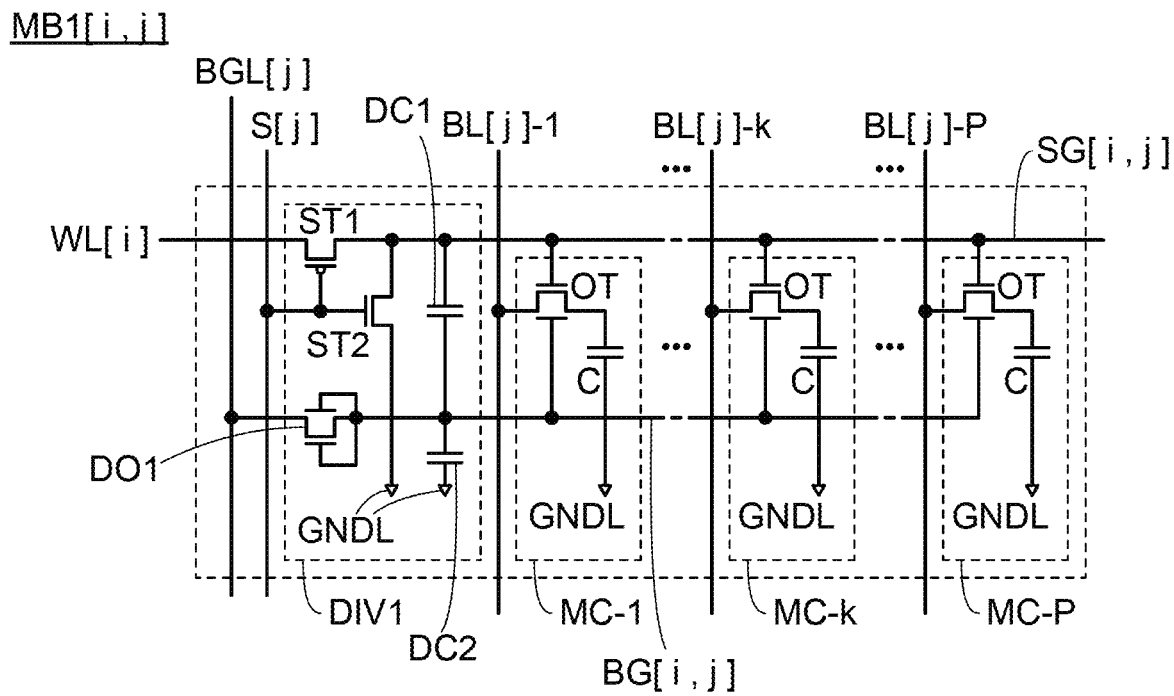
Figure 5:
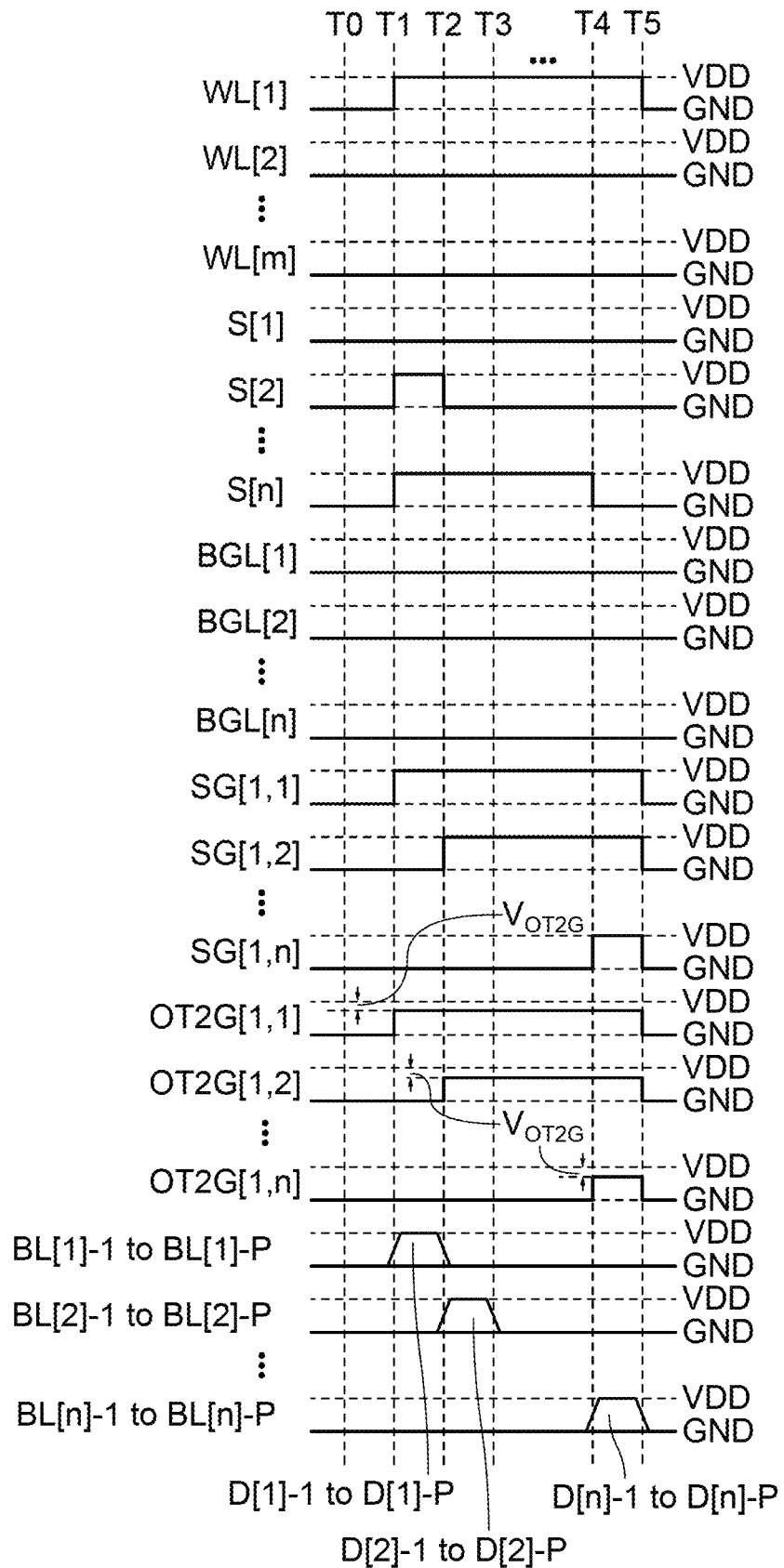
FIG. 5 is a timing chart showing an operation example of a semiconductor device.

FIG. 5 is a timing chart showing an example of reading operation in the semiconductor device in the case where the memory cell array 103A shown in FIGS. 2A and 2B and the memory block MB1[i,j] shown in FIGS. 3A and 3B are employed. Like the timing chart in FIG. 4, the timing chart in FIG. 5 shows a change in potential over time of each of the wiring WL[1], the wiring WL[2], the wiring S[1], the wiring S[2], the wiring S[n], the wiring BGL[1], the wiring BGL[2], the wiring BGL[n], the wiring SG[1,1], the wiring SG[1,2], the wiring SG[1,n], the OT2G[1,1], the OT2G[1,2], the OT2G[1,n], the wirings BL[1]-1 to BL[1]-P, the wirings BL[2]-1 to BL[2]-P, and the wirings BL[n]-1 to BL[n]-P.

In addition, the timing chart in FIG. 5 shows an operation of reading data from the memory blocks MB1[1,1] to MB1[1,n] in the first row of the memory cell array 103A.

During a period from Time T0 to Time T1, an operation in which the potential of the wiring BG[i,j] in the memory block MB1[i,j] is made to be the low-level potential GND is performed. By setting the potentials of the wirings BGL[1] to BGL[n] to the low-level potential GND, the potentials of the wirings BG[1,1] to BG[m,n] are made to be the low-level potential GND. In the case where the potential of the wiring BG[i,j] is lower than the low-level potential GND, it is necessary to take a time for discharging charges in the wiring BG[i,j] in some cases.

At Time T1, the high-level potential VDD is supplied to the wiring WL[1], and the low-level potential GND is supplied to the wirings WL[2] to WL[m]. Moreover, the low-level potential GND is supplied to the wiring S[1], and the high-level potential VDD is supplied to the wirings S[2] to S[n]. Thus, all the transistors ST1 in the memory block MB1 in the first row of the memory cell array 103A are brought into an on state, and all the transistors ST2 in the memory block MB1 in the first row of the memory cell array 103A are brought into an off state. Moreover, the transistors ST1 in the memory blocks MB1 in the second to n-th rows of the memory cell array 103A are brought into an off state, and the transistors ST2 in the memory blocks MB1 in the second to n-th rows of the memory cell array 103A are brought into an on state. By the above operation, the wiring SG[1,1] comes to have the high-level potential VDD, but the potentials of the wirings SG[1,2] to SG[1,n] are not the high-level potential VDD. Furthermore, all the transistors ST2 in the memory blocks MB1[1,2] to MB1[1,n] are in an on state; thus, the potentials of the wirings SG[1,2] to SG[1,n] come to the low-level potential GND. Except in the case where i=1, the wiring WL[i] and the wiring SG[i,1] are electrically connected, and thus the potential of the wiring SG[i,1] comes to the low-level potential GND. Moreover, under the conditions of any i except i=1, all the transistors ST2 in the memory blocks MB1[i,2] to MB1[i,n] are in an on state, and thus the potentials of the wirings SG[i,2] to SG[i,n] come to the low-level potential GND. Note that a change in potential of the wiring SG other than the wirings SG[1,1] to SG[1,n] in the memory cell array 103A is not shown in the timing chart in FIG. 5.

At this time, the wiring SG[i,j] and the wiring BG[i,j] are connected through the capacitor DC1 in the memory block MB1[i,j]; thus, the potential is generated at the second terminal of the capacitor DC1 as in the writing operation at Time T1. In addition, in the case where the potential of the wiring BG[i,j] is lower than the potential of the wiring BGL[j], as described in the writing operation at Time T1, the current does not flow in the transistor DO1, and the wiring BG[i,j] is in a floating state. Thus, when the potential is generated at the second terminal of the capacitor DC1, the second gates of all the transistors OT in the memory block MB1[i,j] are come to have the potential. The potentials of the second gates of the transistors OT in the memory blocks MB1[1,1] to MB1[1,n], which are generated from the wirings SG[1,1] to SG[1,n], are each referred to as $V_{OT2G}$ that is same as that in the writing operation at Time T1. In this operation, the threshold voltage of the transistor OT whose second gate has $V_{OT2G}$, is shifted in the negative direction, and the potential lower than the high-level potential VDD is supplied to the first gate of the transistor OT, whereby the transistor OT can be in an on state.

For the determination of the potential $V_{OT2G}$, the description is made with reference to the writing operation.

During a period from Time T1 to Time 72, the potential of the wiring SG[1,1] is the high-level potential VDD, and thus, the data D[1]-1 to D[1]-P retained in the wirings BL[1]-1 to BL[1]-P are outputted. The read out data D[1]-1 to D[1]-P through the wirings BL[1]-1 to BL[1]-P are outputted from the wirings DL-1 to DL-P via the selector circuit 101, the wirings DL-1 to DL-P, and the sense amplifier/precharge circuit 102.

At Time 72, the low-level potential GND is supplied to the wiring S[2]. In the memory block MB1[1,2], the transistor ST1 is brought into an on state, and the transistor ST2 is brought into an off state, whereby the wiring WL[1], the wiring SG[1,1], and the wiring SG[1,2] are electrically connected. Thus, the potential of the wiring SG[1,2] comes to the high-level potential VDD.

When the wiring SG[1,2] comes to have the high-level potential VDD, a change in potential of the wiring BG[1,2] that is connected to the wiring SG[1,2] through the capacitor DC1 in the memory block MB1[1,2] is caused. At this time, the potentials of the second gates of all the transistors OT in the memory block MB1[1,2] come to $V_{OT2G}$. With this potential, the threshold voltages of all the transistors OT in the memory block MB1[1,2] are shifted in the negative direction, and the potential lower than the high-level potential VDD is supplied to the first gates of the transistors OT, whereby the transistors OT can be in an on state.

Moreover, all the transistors OT in the memory block MB1[1,2] are brought into an on state. Thus, during a period from Time T2 to Time T3, the data D[2]-1 to D[2]-P retained in the memory cells MC-1 to MC-P in the memory block MB1[1,2] are outputted to the wirings BL[2]-1 to BL[2]-P. Note that the read out data D[2]-1 to D[2]-P through the wirings BL[2]-1 to BL[2]-P are outputted from the wirings DL-1 to DL-P via the selector circuit 101, the wirings DLD-1 to DLD-P, and the sense amplifier/precharge circuit 102.

During a period from Time T3 to Time T4, data is read out from the memory blocks MB1[1,3] to MB1[1,n-1].

At Time T4, the low-level potential GND is supplied to the wiring S[n]. In the memory block MB1[1,n], the transistor ST1 is brought into an on state, and the transistor ST2 is brought into an off state, so that the wiring WL[1] and the wirings SG[1,1] to SG[1,n] are electrically connected. Thus, the potential of the wiring SG[1,n] comes to the high-level potential VDD.

When the wiring SG[1,n] comes to have the high-level potential VDD, a change in potential of the wiring BG[1,n] that is connected to the wiring SG[1,n] through capacitor DC1 in the memory block MB1[1,n] is caused. At this time, the potentials of the second gates of all the transistors OT in the memory block MB1[1,n] come to be $V_{OT2G}$. With this potential, the threshold voltages of all the transistors OT in the memory block MB1[1,n] are shifted in the negative direction, and the potential lower than the high-level potential VDD is supplied to the first gates of the transistors OT, whereby the transistors OT can be in an on state.

Moreover, all the transistors OT in the memory block MB1[1,n] are brought into an on state. Thus, during a period from Time T4 to Time T5, the data D[n]-1 to D[n]-P retained in the memory cells MC-1 to MC-P in the memory block MB1[1,n] are outputted to the wirings BL[n]-1 to BL[n]-P. Note that the read out data D[n]-1 to D[n]-P through the wirings BL[n]-1 to BL[n]-P are outputted from the wirings DL-1 to DL-P via the selector circuit 101, the wirings DLD-1 to DLD-P, and the sense amplifier/precharge circuit 102.

Before Time T5 starts, reading data from the memory blocks MB1[1,1] to MB1[1,n] in the first row of the memory cell array 103A is completed. At Time T5, the low-level potential GND is applied to the wiring WL[1]. Thus, all the transistors OT in the memory blocks MB1[1,1] to MB1[1,n] are brought into an off state, and the data in the memory blocks MB1[1,1] to MB1[1,n] can be retained.

When data is read out from any one of the memory cells MC-1 to MC-P in the memory blocks MB1[1,1] to MB1[1,n], data retained in the memory cells MC-1 to MC-P is damaged by reading. The refresh operation is preferably performed after data is damaged by reading, and the preferred timing of refresh operation performed is when the transistor OT in the memory cell where data is damaged by reading is in an on state. In other words, the refresh operation is preferably performed immediately after the data is read out. Alternatively, the refresh operation is preferably performed before Time T5 in the timing chart of FIG. 5.

In the case where data is read out from the memory blocks MB1[i,1] to MB1[1,n] in the i-th row of the memory cell array 103A, the data reading can be performed in a manner similar to that of data reading from the memory blocks MB1[1,1] to MB1[1,n] connected to the wiring WL[1].

Note that each of the transistor ST1 and the transistor ST2 is preferably a transistor including silicon in an active layer. Each of the transistor DO1 and the transistor OT is preferably an OS transistor described in Embodiment 7. In particular, the OS transistor has favorable switching characteristics and extremely low off-state current, and accordingly, a leakage current in an off state of the OS transistor can be extremely low. Thus, in the transistor OT, charge can be kept for a long time between the second terminal of the transistor OT and the first terminal of the capacitor C, which leads to a reduction in frequencies of refresh operations. Furthermore, in the transistor D01, charges in the wiring BG[i,j] can be kept for a long time; thus, the threshold voltage of the transistor OT can be controlled with low power consumption.

Configuration Example 2 of Memory Block

Figure 6A:
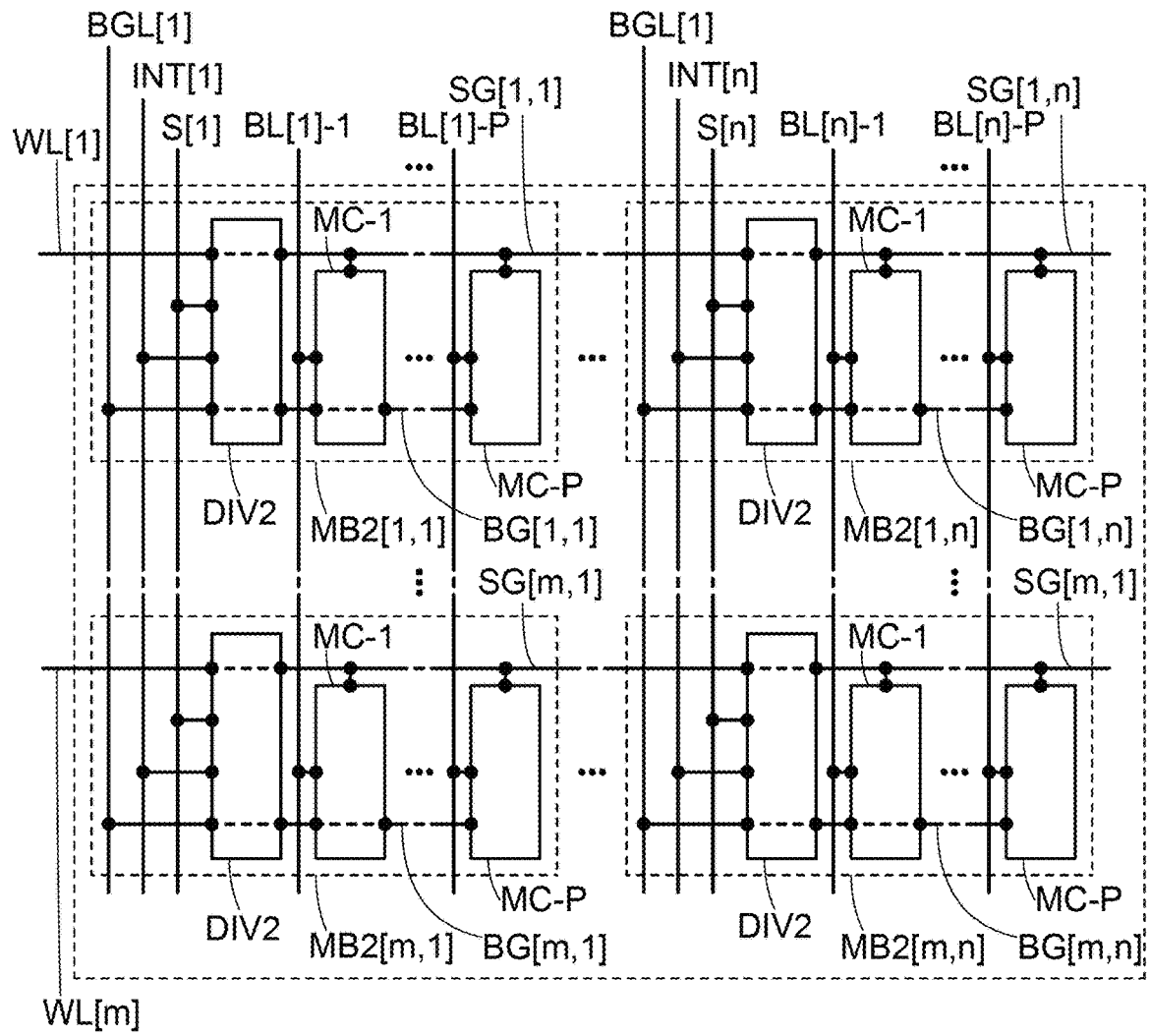
FIGS. 6A and 6B are block diagrams each showing an example of a semiconductor device.

Here, is described a semiconductor device which includes a memory block having a different configuration from that of the memory block MB1 described in Configuration example 1 of memory block. FIG. 6A shows a memory cell array 103B as an example of a memory cell array in FIG. 1. The memory cell array 103B has a configuration in which the memory cell array 103A shown in FIG. 2A is provided with wirings INT[1] to INT[n] and the memory block MB1 is replaced with a memory block MB2. In this specification, memory blocks MB2[1,1] to MB2[m,n] are collectively referred to as "memory block MB2" in some cases.

Figure 6B:
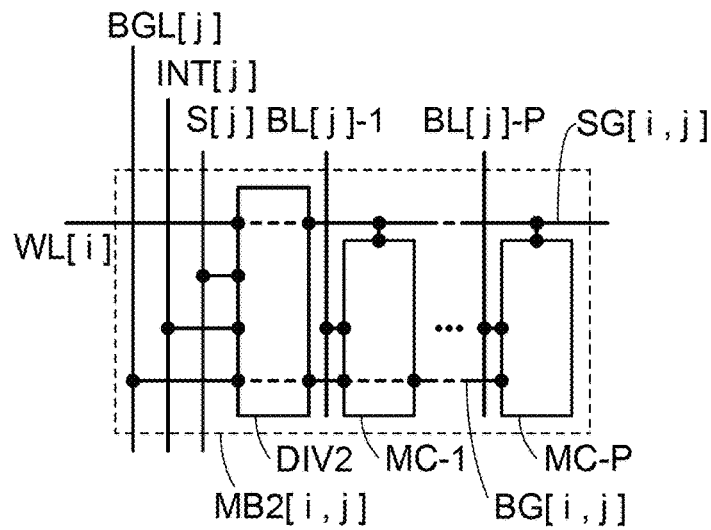

Next, a memory block MB2[i,j] is focused on and a configuration thereof is described. A connection structure of the memory block MB2[i,j] is shown in FIG. 6B. The memory block MB2[i,j] includes a circuit DIV2 that is a word line divider and memory cells MC-1 to MC-P. The circuit DIV2 in the memory block MB2[i,j] is electrically connected to a wiring S[j]. The circuit DIV2 in the memory block MB2[i,j] is electrically connected to the memory cells MC-1 to MC-P in the memory block MB2[i,j] via the wiring SG[i,j]. The memory cells MC-1 to MC-P in the memory block MB2[i,j] are electrically connected to wirings BL[j]-1 to BL[j]-P, respectively.

Furthermore, the circuit DIV2 in the memory block MB2[i,j] is electrically connected to the wiring BGL[j]. The wiring BGL[j] is electrically connected to the wiring BG[i,j] via the circuit DIV2 in the memory block MB2[i,j]. The wiring BG[i,j] is electrically connected to each of the memory cells MC-1 to MC-P. A wiring INT[j] is electrically connected to the circuit DIV2.

The wiring WL[i] functions as a word line and is a wiring for writing/reading data to/from the memory cells in all the memory blocks MB2 in the i-th row.

The wiring BGL[j] is a wiring for controlling threshold voltages of transistors in memory cells in all the memory blocks MB2 in the j-th row.

The wiring INT[j] is a wiring for setting the wirings BG[1,j] to BG[m,j] in all the memory blocks MB2 in the j-th row to have the low-level potential GND. Note that a specific connection structure example will be described later.

FIG. 6A shows only the following components: the memory cell array 103B; the memory block MB2[1,1]; the memory block MB2[m,1]; the memory block MB2[1,n]; the memory block MB2[m,n]; the circuit DIV2; the memory cell MC-1; the memory cell MC-P; the wiring WL[1]; the wiring WL[m]; the wiring BGL[1]; the wiring BGL[n]; the wiring SG[1,1]; a wiring SG[m,1]; the wiring SG[1,n]; the wiring SG[m,n]; the wiring BG[1,1]; the wiring BG[m,1]; the wiring BG[1,n]; the wiring BG[m,n]; the wiring BL[1]-1; the wiring BL[1]-P; the wiring BL[n]-1; the wiring BL[n]-P; the wiring S[1]; the wiring S[n]; the wiring INT[1]; and the wiring INT[n]. Other reference numerals, symbols, wirings, circuits, and the like are not shown.

Figure 7A:
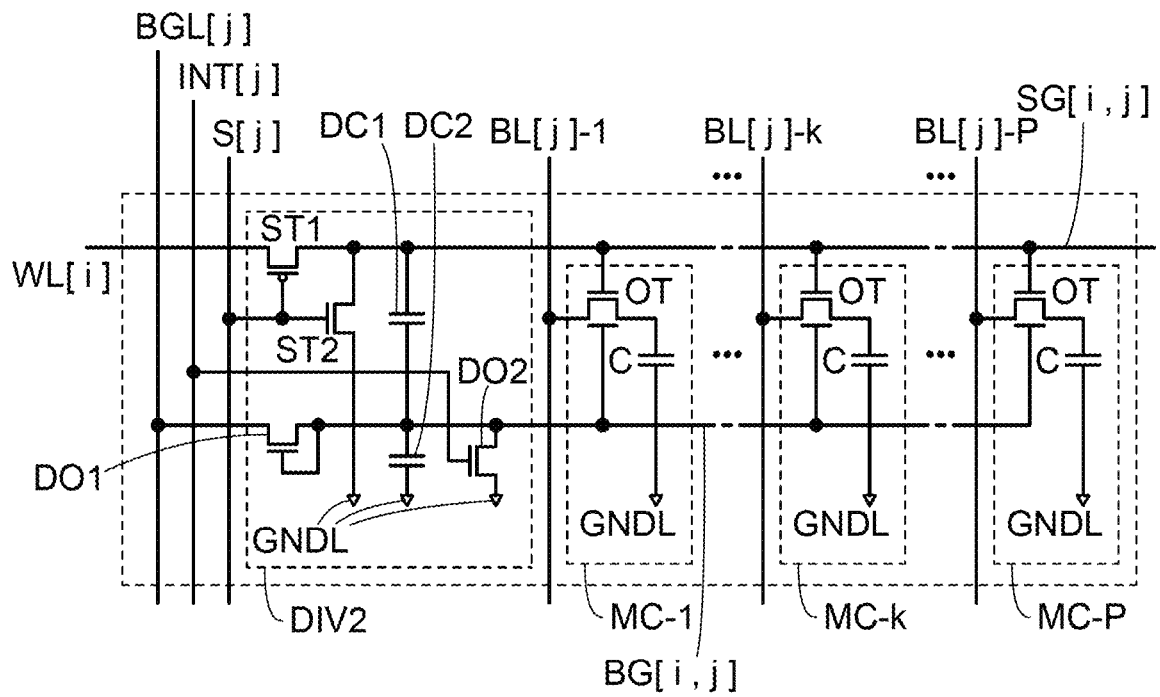
FIGS. 7A and 7B are circuit diagrams each showing a configuration example of FIG. 6B.

Next, a specific circuit configuration of the memory block MB2[i,j] is shown in FIG. 7A.

The circuit DIV2 includes the transistor ST1, the transistor ST2, the transistor DO1, a transistor DO2, the capacitor DC1, and the capacitor DC2. Each of the memory cells MC-1 to MC-P includes the transistor OT and the capacitor C as in the memory block MB1[i,j] in FIG. 3A.

The transistor ST1 is a p-channel transistor, and the transistor ST2 is an n-channel transistor. The transistor OT, the transistor DO1, and the transistor DO2 are n-channel transistors. The transistor OT has a dual-gate structure including a first gate and a second gate. The wiring GNDL in FIG. 7A is a wiring for supplying the low-level potential GND.

A first terminal of the transistor ST1 is electrically connected to the wiring WL[i], a second terminal of the transistor ST1 is electrically connected to the wiring SG[i,j], and a gate of the transistor ST1 is electrically connected to the wiring S[j]. A first terminal of the transistor ST2 is electrically connected to the wiring SG[i,j], a second terminal of the transistor ST2 is electrically connected to the wiring GNDL, and a gate of the transistor ST2 is electrically connected to the wiring S[j]. A first terminal of the transistor DO1 is electrically connected to the wiring BGL[j], a second terminal of the transistor DO1 is electrically connected to the wiring BG[i,j], and a gate of the transistor DO1 is electrically connected to the second terminal of the transistor DO1. A first terminal of the capacitor DC1 is electrically connected to the wiring SG[i,j], and a second terminal of the capacitor DC1 is electrically connected to the wiring BG[i, j]. A first terminal of the capacitor DC2 is electrically connected to the wiring BG[i,j], and a second terminal of the capacitor DC2 is electrically connected to the wiring GNDL.

A first terminal of the transistor DO2 is electrically connected to the wiring BG[i,j], a second terminal of the transistor DO2 is electrically connected to the wiring GNDL, and a gate of the transistor DO2 is electrically connected to the wiring INT[j].

For a connection structure of each of the memory cells MC-1 to MC-P in the memory block MB2[i,j], the descriptions of the memory cell array 103A and the memory block MB1 are referred to.

FIG. 7A shows only the following components: the memory block MB2[i,j]; the circuit DIV2; the memory cell MC-1; the memory cell MC-k; the memory cell MC-P; the wiring WL[i]; the wiring BGL[j]; the wiring SG[i,j]; the wiring BL[j]-1; the wiring BL[j]-k; the wiring BL[j]-P; the wiring S[j]; the wiring BG[i,j]; the wiring INT[j]; the wiring GNDL; the transistor ST1; the transistor ST2; the transistor DO1; the transistor DO2; the transistor OT; the capacitor DC1; the capacitor DC2; and the capacitor C. Other reference numerals, symbols, wirings, circuits, elements, and the like are not shown.

Operation Example 2

Figure 7B:
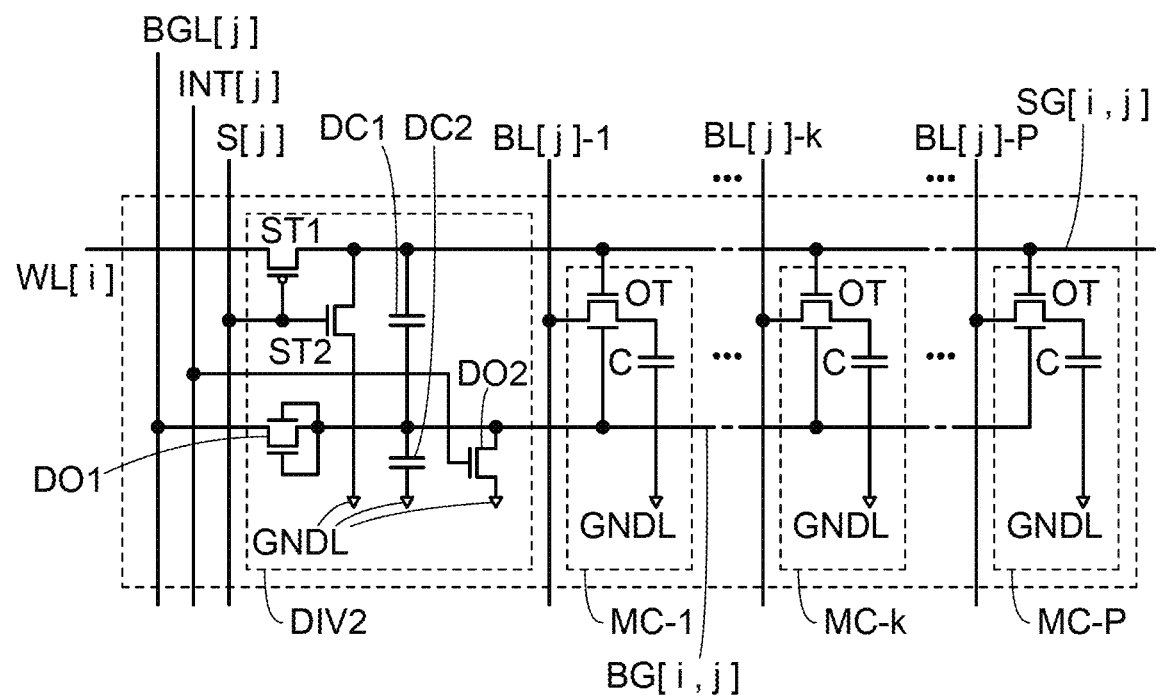

Next, an operation example of a semiconductor device in which the memory cell array 103B in FIGS. 6A and 6B and the memory block MB2[i,j] in FIGS. 7A and 7B are employed is described.

The memory cell array 103B in FIGS. 6A and 6B has a configuration in which the wirings INT[1] to INT[n] are provided for the memory cell array 103A shown in FIGS. 2A and 2B, and the memory block MB2[i,j] in FIGS. 7A and 7B has a configuration in which the transistor DO2 is provided for the memory block MB1[0] in FIGS. 3A and 3B. Thus, the main operation of the semiconductor device described here is substantially the same as that of the semiconductor device in which the memory cell array 103A and the memory block MB1[i,j] in FIGS. 3A and 3B, which is described in Operation example 1. Consequently, in Operation example 2, the description of the same operation as Operation example 1 is omitted, and a different operation is described.

In the configuration of the memory block MB2 in FIGS. 7A and 7B, the high-level potential VDD is applied to the wiring INT[j], whereby the transistor DO2 can be brought into an on state. When the wiring INT[j] is set to have the high-level potential VDD, charges in the wiring BG[i,j] can be released. By this operation, the threshold voltages of the transistors OT in the memory cells MC-1 to MC-P can be an initial state.

Note that each of the transistor ST1 and the transistor ST2 is preferably a transistor including silicon in an active layer. Each of the transistor DO1, the transistor DO2, and the transistor OT is preferably an OS transistor described in Embodiment 7. In particular, the OS transistor has favorable switching characteristics and extremely low off-state current, and accordingly, a leakage current in an off state of the OS transistor can be extremely low. Thus, in the transistor OT, charge can be kept for a long time between the second terminal of the transistor OT and the first terminal of the capacitor C, which leads to a reduction in frequencies of refresh operations. Furthermore, in the transistor DO1 and the transistor DO2, charges in the wiring BG[i,j] can be kept for a long time; thus, the threshold voltage of the transistor OT can be controlled with low power consumption.

Configuration Example 3 of Memory Block

Figure 8A:
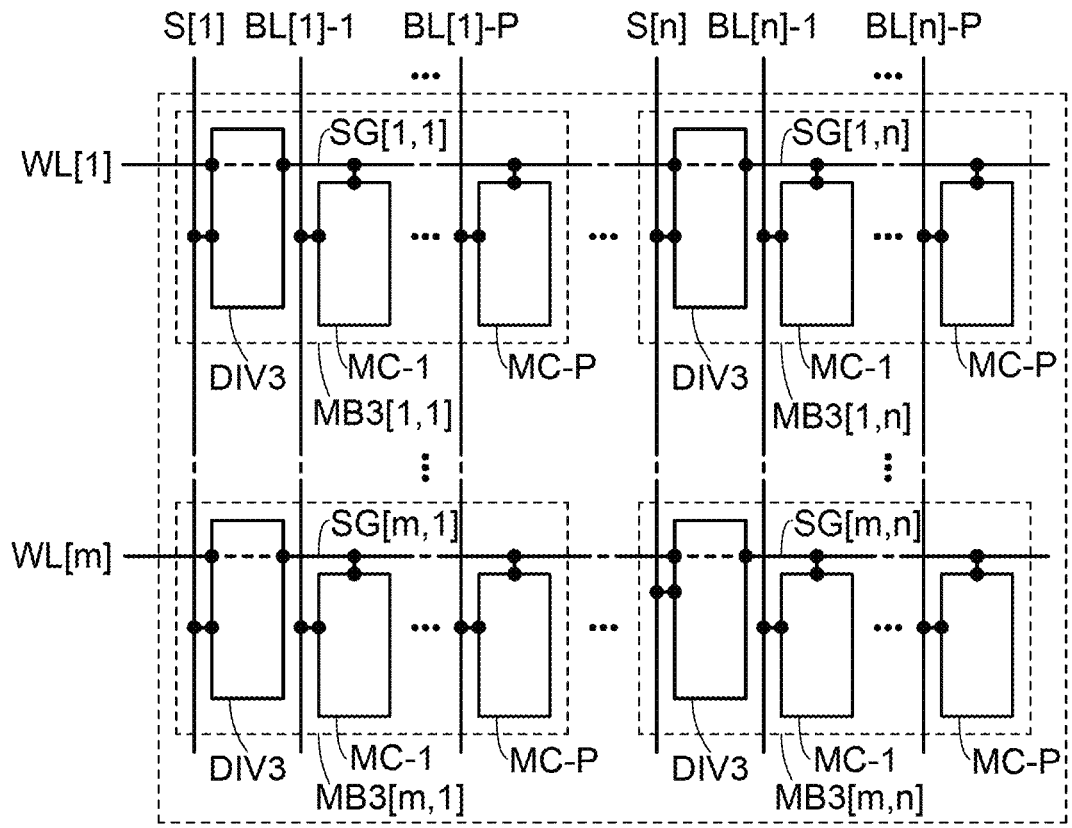
FIGS. 8A and 8B are block diagrams each showing an example of a semiconductor device.

Here, described is a semiconductor device including a memory block with a different configuration from that of the memory block MB1 in Configuration example 1 of memory block and that of the memory block MB2 in Configuration example 2 of memory block. FIG. 8A shows a memory cell array 103C as an example of the memory cell array in FIG. 1. The memory cell array 103C has a configuration in which the wirings BGL[1] to BGL[n] are removed from the memory cell array 103A shown in FIG. 2A and the memory block MB1 is replaced with the memory block MB3. In this specification, the memory blocks MB3[1,1] to MB3[n,n] are collectively referred to as memory block MB3 in some cases.

Figure 8B:
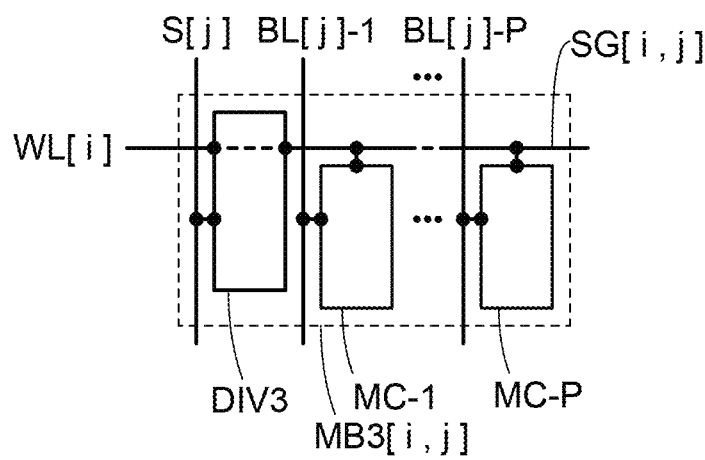

Next, a memory block MB3[i,j] is focused on and a configuration thereof is described. A connection structure of the memory block MB3[i,j] is shown in FIG. 8B. The memory block MB3[i,j] includes a circuit DIV3 that is a word line divider and the memory cells MC-1 to MC-P. The circuit DIV3 in the memory block MB3[i,j] is electrically connected to the wiring S[j]. The circuit DIV3 in the memory block MB3[i,j] is electrically connected to the memory cells MC-1 to MC-P in the memory block MB3[i,j] via the wiring SG[i,j]. The memory cells MC-1 to MC-P in the memory block MB3[i,j] is electrically connected to the wirings BL[j]-1 to BL[j]-P.

The wiring WL[i] functions as a word line and is a wiring for writing/reading data to/from the memory cells in all the memory blocks MB3 in the i-th row.

FIG. 8A shows only the following components: the memory cell array 103C; the memory block MB3[1,1]; the memory block MB3[m,1]; the memory block MB3[1,n]; the memory block MB3[m,n]; the circuit DIV3; the memory cell MC-1; the memory cell MC-P; the wiring WL[1]; the wiring WL[m]; the wiring SG[1,1]; the wiring SG[m,1]; the wiring SG[1,n]; the wiring SG[m,n]; the wiring BL[1]-1; the wiring BL[1]-P; the wiring BL[n]-1; the wiring BL[n]-P; the wiring S[1]; and the wiring S[n]. Other reference numerals, symbols, wirings, circuits, and the like are not shown.

Figure 9:
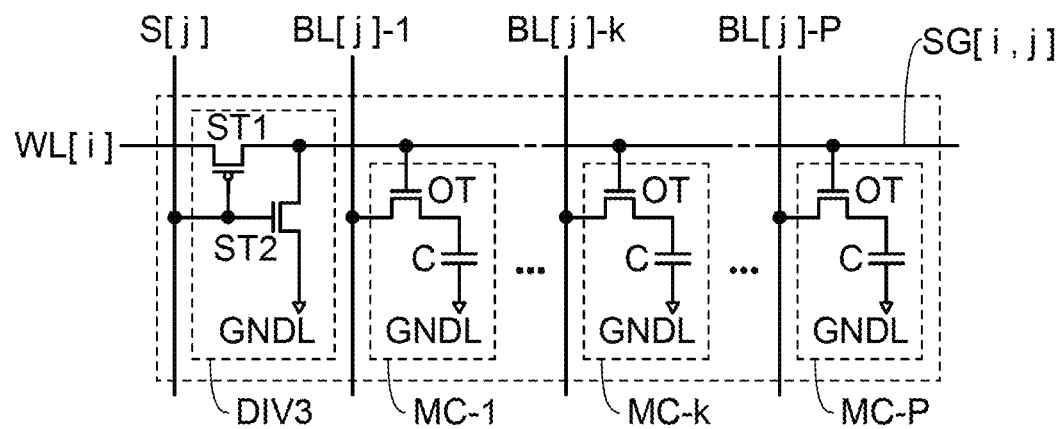
FIG. 9 is a circuit diagram showing a configuration example of FIG. 8B.

FIG. 9 shows a specific circuit example of the memory block MB3[i,j].

The circuit DIV3 includes the transistor ST1 and the transistor ST2. Each of the memory cells MC-1 to MC-P includes the transistor OT and the capacitor C.

The transistor ST1 is a p-channel transistor, and the transistor ST2 is an n-channel transistor. Note that, depending on circumstances or conditions, the transistor ST1 can be an n-channel transistor, and the transistor ST2 can be a p-channel transistor. Furthermore, the transistor OT is an n-channel transistor. The wiring GNDL shown in FIG. 9 is a wiring for supplying the low-level potential GND.

A first terminal of the transistor ST1 is electrically connected to the wiring WL[i], a second terminal of the transistor ST1 is electrically connected to the wiring SG[i,j], and a gate of the transistor ST1 is electrically connected to the wiring S[I]. A first terminal of the transistor ST2 is electrically connected to the wiring SG[i,j], a second terminal of the transistor ST2 is electrically connected to the wiring GNDL, and a gate of the transistor ST2 is electrically connected to the wiring S[j].

The memory cell MC-k (k is an integer greater than or equal to 1 and less than or equal to P) is focused on and a configuration thereof is described. A first terminal of the transistor OT in the memory cell MC-k is electrically connected to the wiring BL[j]-k, a second terminal of the transistor OT in the memory cell MC-k is electrically connected to a first terminal of the capacitor C in the memory cell MC-k, and a gate of the transistor OT in the memory cell MC-k is electrically connected to the wiring SG[i,j].

Note that the memory cell in the memory block MB3[i,j] is not limited to DRAM. For example, the memory block MB3[i,j] may have a configuration in which a 2T1C-type memory cell or a 3T1C-type memory cell is used instead of DRAM. Such a configuration is described in Embodiment 2.

FIG. 9 shows only the following components: the memory block MB3[i,j]; the circuit DIV3; the memory cell MC-1; the memory cell MC-k; the memory cell MC-P; the wiring WL[i]; the wiring SG[i,j]; the wiring BL[j]-1; the wiring BL[j]-k; the wiring BL[j]-P; the wiring S[j]; the transistor ST1; the transistor ST2; the transistor OT; and the capacitor C. Other reference numerals, symbols, wirings, circuits, and the like are not shown.

Operation Example 3

Next, an operation example of a semiconductor device in which the memory cell array 103C in FIGS. 8A and 8B and the memory block MB3[i,j] in FIG. 9 are used is described.
<<Writing Operation>>

Figure 10:
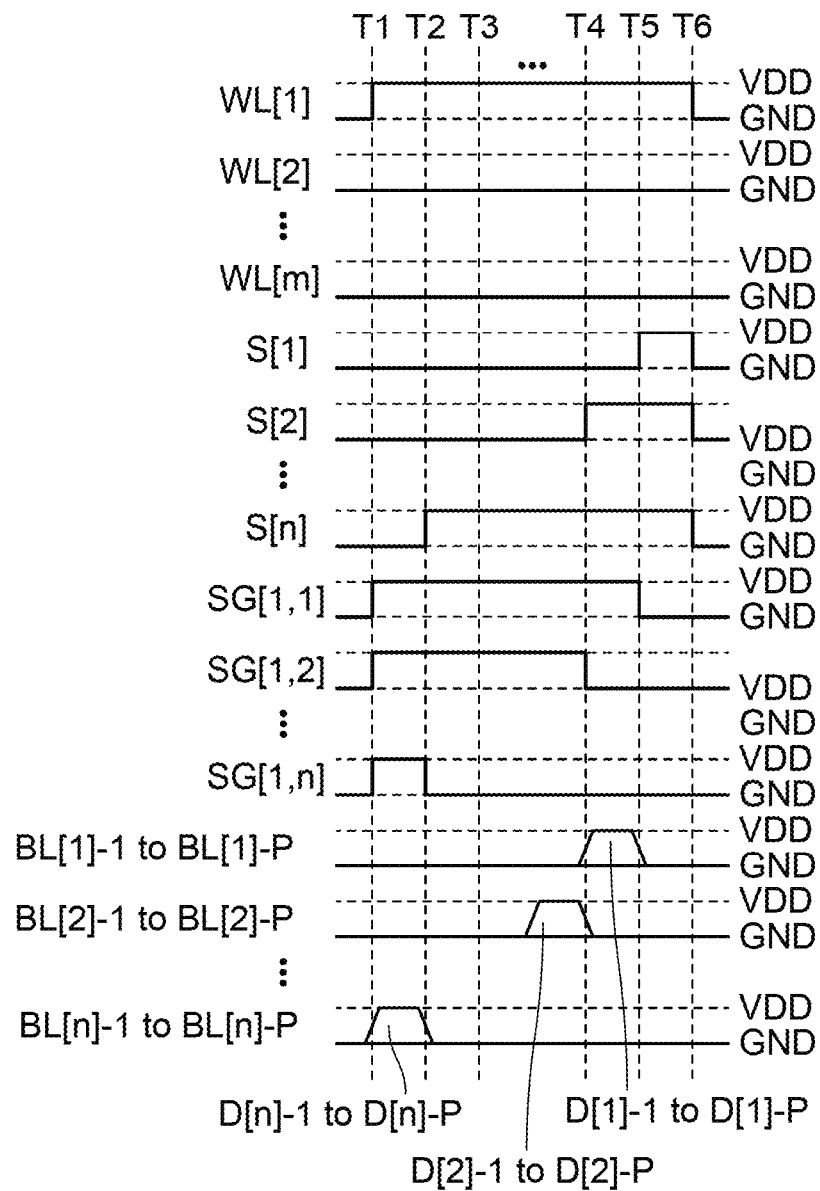
FIG. 10 is a timing chart showing an operation example of a semiconductor device.

FIG. 10 is a timing chart showing an example of writing operation of a semiconductor device in which the memory cell array 103C in FIGS. 8A and 8B and the memory block MB3[i,j] in FIG. 9 are used. The timing chart in FIG. 10 shows a change in potential over time of each of the wiring WL[1], the wiring WL[2], the wiring WL[m], the wiring S[1], the wiring S[2], the wiring S[n], the wiring SG[1,1], the wiring SG[1,2], the wiring SG[1,n], the wirings BL[1]-1 to BL[1]-P, the wirings BL[2]-1 to BL[2]-P, and the wirings BL[n]-1 to BL[n]-P. Note that the wirings BL[1]-1 to BL[1]-P are collectively shown because they transmit or receive signals concurrently. The wirings BL[2]-1 to BL[2]-P are also collectively shown because they transmit or receive signals concurrently. The wirings BL[n]-1 to BL[n]-P are also collectively shown because they transmit or receive signals concurrently.

Moreover, the timing chart in FIG. 10 shows an operation of writing data to the memory blocks MB3[1,1] to MB3[1,n] in the first row of the memory cell array 103C.

At Time T1, the high-level potential VDD is supplied to the wiring WL[1], and the low-level potential GND is supplied to the wirings WL[2] to WL[m]. In addition, the low-level potential GND is supplied to the wirings S[1] to S[n]. By supplying the low-level potential GND to the wirings S[1] to S[n], all the transistors ST1 in the memory blocks MB3[1,1] to MB3[1,n] are brought into an on state, and all the transistors ST2 in the memory blocks MB3[1,1] to MB3[1,n] are brought into an off state. Accordingly, the wiring WL[1] and the wirings SG[1,1] to SG[1,n] are electrically connected, so that the potentials of the wirings SG[1,1] to SG[1,n] come to the high-level potential VDD. Thus, all the transistors OT in the memory blocks MB3[1,1] to MB3[1,n] are brought into an on state.

During a period from Time T1 to Time T2, signals of data D[n]-1 to D[n]-P are transmitted from the wirings BL[n]-1 to BL[n]-P, respectively. The signals of the data D[n]-1 to D[n]-P are written into the memory cells MC-1 to MC-P, respectively, in the memory block MB3[1,n]. Note that the data D[1]-1 to D[1]-P are data inputted from the wirings DL-1 to DL-P in the semiconductor device 100.

At Time T2, the high-level potential VDD is inputted to the wiring S[n]. The transistor ST1 in the memory block MB3[1,n] is brought into an off state, and the transistor ST2 in the memory block MB3[1,n] is brought into an on state. Thus, the potential of the wiring SG[1,n] comes to the low-level potential GND, and all the transistors OT in the memory block MB3[1,n] are brought into an off state. Therefore, during a period from Time T1 to Time T2, the data D[n]-1 to D[n]-P written into the memory block MB3 [1,n] can be retained.

During a period from Time T2 to Time T3, the wirings SG[1,1] to SG[1,n-1] have the high-level potential VDD. Thus, all the transistors OT in the memory blocks MB3[1,1] to MB3[1,n-1] are brought into an on state.

During a period from Time T2 to Time T3, signals of the data D[n-1]-1 to D[n-1]-P are transmitted from the wirings BL[n-1]-1 to BL[n-1]-P, respectively. The signals of the data D[n-1]-1 to D[n-1]-P are written into the memory cells MC-1 to MC-P in the memory block MB3[1,n-1]. Note that the data D[n-1]-1 to D[n-1]-P are data inputted from the wirings DL-1 to DL-P in the semiconductor device 100 in FIG. 1. The writing operation of data D[n-1]-1 to D[n-1]-P to the memory block MB3[1,n-1] is not shown in FIG. 10.

During a period from Time T3 to Time T4, an operation of writing data into the memory blocks MB3[1,2] to MB3 [1,n-2] is performed. Note that the data written into the memory blocks MB3[1,2] to MB3[1,n-2] are data inputted from the wirings DL-1 to DL-P in the semiconductor device 100 shown in FIG. 1.

In particular, immediately before Time T4, the signals of the data D[2]-1 to D[2]-P are transmitted from the wirings BL[2]-1 to BL[2]-P, respectively. The signals of the data D[2]-1 to D[2]-P are written into the memory cells MC-1 to MC-P, respectively, in the memory blocks MB3[1,2].

At Time T4, the high-level potential VDD is inputted to the wiring S[2]. The transistor ST1 in the memory block MB3[1,2] is brought into an off state, and the transistor ST2 in the memory block MB3[1,2] is brought into an on state. Thus, the potential of the wiring SG[1,2] comes to the low-level potential GND, and all the transistors OT in the memory block MB3[1,2] are brought into an off state. Therefore, immediately before Time T4, the data D[2]-1 to D[2]-P written into the memory block MB3[1,2] can be retained.

During a period from Time T4 to Time T5, the wiring SG[1,1] has the high-level potential VDD. Thus, all the transistors OT1 in the memory block MB3[1,1] are brought into an on state.

During a period from Time T4 to Time T5, signals of the data D[1]-1 to D[1]-P are transmitted from the wirings BL[1]-1 to BL[1]-P, respectively. The signals of the data D[1]-1 to D[1]-P are written into the memory cells MC-1 to MC-P in the memory block MB3[1,1]. Note that the data D[1]-1 to D[1]-P are data inputted from the wirings DL-1 to DL-P in the semiconductor device 100 shown in FIG. 1.

At Time T5, the high-level potential VDD is inputted into the wiring S[1]. The transistor ST1 in the memory block MB3[1,1] is brought into an off state, and the transistor ST2 in the memory block MB3[1,1] is brought into an on state. Thus, the potential of the wiring SG[1,1] comes to the low-level potential GND, and all the transistors OT in the memory block MB3[1,1] are brought into an off state. Therefore, during a period from Time T4 to Time T5, the data D[1]-1 to D[1]-P written into the memory block MB3 [1,1] can be retained.

Before Time T6 starts, writing data into the memory blocks MB3[1,1] to MB3[1,n] in the first row of the memory cell array 103C is completed. At Time T6, the low-level potential GND is applied to the wiring WL[1], and the low-level potential GND is applied to the wirings S[1] to S[n]. Thus, all the transistors OT in the memory blocks MB3[1,1] to MB3[1,n] are brought into an off state, and data written into the memory blocks MB3[1,1] to MB3[1,n] can be retained.

In the case where data is written into the memory blocks MB3[i,1] to MB3[i,n] in the i-th row of the memory cell array 103C, the data writing may be performed in a manner similar to that of data writing to the memory blocks MB3 [1,1] to MB3[1,n] connected to the wiring WL[1].

<<Reading Operation>>

Figure 11:
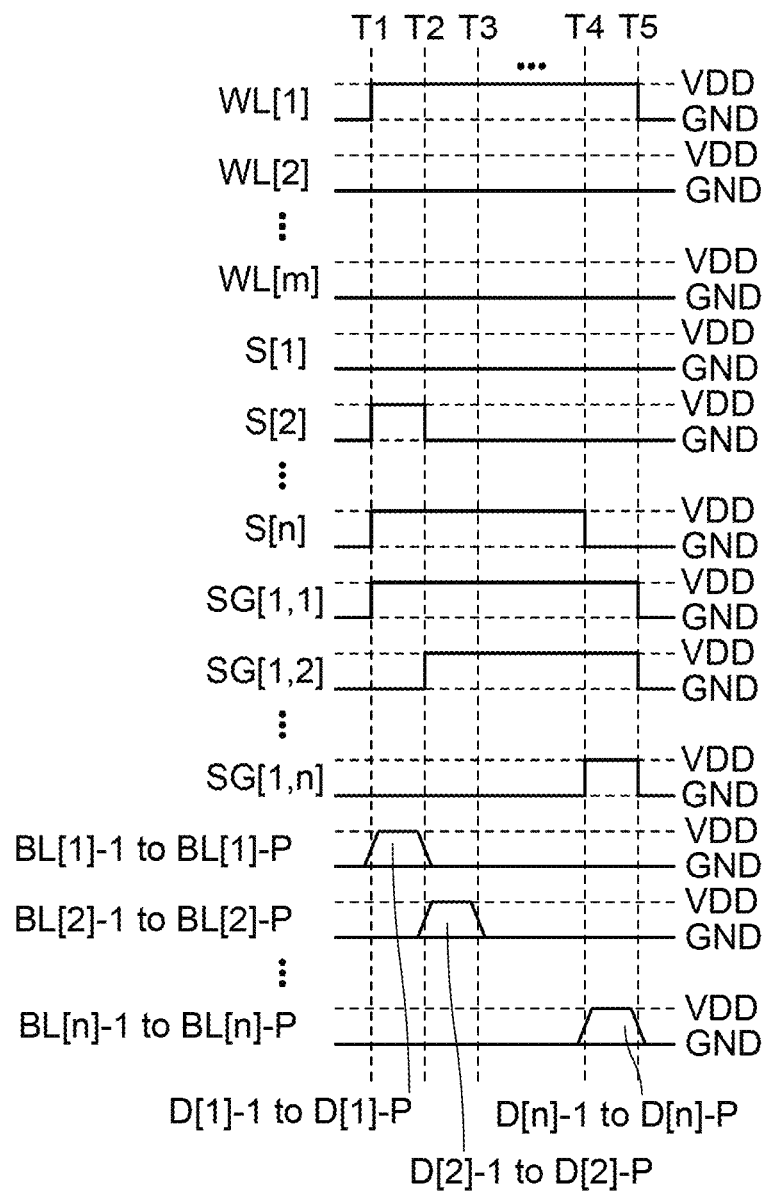
FIG. 11 is a timing chart showing an operation example of a semiconductor device.

FIG. 11 is a timing chart showing an example of a reading operation of a semiconductor device in which the memory cell array 103C in FIGS. 8A and 8B and the memory block MB3[i,j] in FIG. 9 are employed. Like the timing chart in FIG. 10, the timing chart in FIG. 11 shows a change in potential over time of each of the wiring WL[1], the wiring WL[2], the wiring WL[m], the wiring S[1], the wiring S[2], the wiring S[n], the wiring SG[1,1], the wiring SG[1,2], the wiring SG[1,n], the wirings BL[1]-1 to BL[1]-P, the wirings BL[2]-1 to BL[2]-P, and the wirings BL[n]-1 to BL[n]-P.

Furthermore, the timing chart in FIG. 11 shows an operation of reading data from the memory blocks MB3[1,1] to MB3[1,n] in the first row of the memory cell array 103C.

At Time T1, the high-level potential VDD is supplied to the wiring WL[1], and the low-level potential GND is supplied to the wirings WL[2] to WL[m]. In addition, the low-level potential GND is supplied to the wiring S[1], and the high-level potential VDD is supplied to the wirings S[2] to S[n]. By supplying the low-level potential GND to the wiring S[1], the transistor ST1 in the memory block MB3 [1,1] is brought into an on state, and the transistor ST2 in the memory block MB3[1,1] is brought into an off state. Furthermore, by supplying the high-level potential VDD to the wirings S[2] to S[n], all the transistors ST1 in the memory blocks MB3[1,2] to MB3[1,n] are brought into an off state, and all the transistors ST2 in the memory blocks MB3[1,2] to MB3[1,n] are brought into an on state. The wiring WL[1] and the wiring SG[1,1] are electrically connected, and the potential of the wiring SG[1,1] comes to the high-level potential VDD. Thus, all the transistors OT in the memory block MB3[1,1] are brought into an on state.

From a period from Time T1 to Time T2, signals of data D[1]-1 to D[n]-P are outputted from the memory cells MC-1 to MC-P in the memory block MB3[1,1]. The signals of the data D[1]-1 to D[1]-P are outputted from the wirings DL-1 to DL-P via the wirings BL[1]-1 to BL[1]-P, the selector circuit 101, the wiring DLD-1, and the wiring DLD-P.

At Time T2, the low-level potential GND is supplied to the wiring S[2]. By supplying the low-level potential GND to the wiring S[2], the transistor ST1 in the memory block MB3[1,2] is brought into an on state, and the transistor ST2 in the memory block MB3[1,2] is brought into an off state. Thus, the wiring WL[1], the wiring SG[1,1], and the wiring SG[1,2] are electrically connected, and the potential of the wiring SG[1,2] comes to the high-level potential VDD. Consequently, all the transistors OT in the memory block MB3[1,2] are brought into an on state.

During a period from Time T2 to Time T3, signals of data D[2]-1 to D[2]-P are outputted from the memory cells MC-1 to MC-P, respectively, in the memory block MB3[1,2]. The signals of the data D[2]-1 to D[2]-P are outputted from the wirings DL-1 to DL-P through the wirings BL[2]-1 to BL[2]-P, the selector circuit 101, the wiring DLD-1, and the wiring DLD-P.

During a period from Time T3 to Time T4, data is read out from the memory blocks MB3[1,3] to MB3[1,n−1].

At Time T4, the low-level potential GND is supplied to the wiring S[n]. By supplying the low-level potential GND to the wiring S[n], the transistor ST1 in the memory block MB3[1,n] is brought into an on state, and the transistor ST2 in the memory block MB3[1,n] is brought into an off state. The wiring WL[1] and the wirings SG[1,1] to SG[1,n] are electrically connected, and the potential of the wiring SG[1,n] comes to the high-level potential VDD. Thus, all the transistors OT in the memory block MB3[1,n] are brought into an on state.

During a period from Time T4 to Time T5, signals of data D[n]-1 to D[n]-P are outputted from the memory cells MC-1 to MC-P, respectively in the memory block MB3[1,n]. The signals of the data D[n]-1 to D[n]-P are outputted from the wirings DL-1 to DL-P through the wirings BL[n]-1 to BL[n]-P, the selector circuit 101, the wiring DLD-1, and the wiring DLD-P.

Before Time T5 starts, reading data from the memory blocks MB3[1,1] to MB3[1,n] in the first row of the memory cell array 103C is completed. At Time T5, the low-level potential GND is supplied to the wiring WL[1]. Thus, all the transistors OT in the memory blocks MB3[1,1] to MB3[1,n] are brought into an off state, whereby the data in the memory blocks MB3[1,1] to MB3[1,n] can be retained.

When data is read out from any of the memory cells MC-1 to MC-P in the memory blocks MB3[1,1] to MB3[1,n], data retained in the memory cells MC-1 to MC-P is damaged by the reading. The refresh operation is preferably performed after data is damaged by reading. The preferred timing of refresh operation performed is when the transistor OT in the memory cell where data is damaged by reading is in an on state. In other words, the refresh operation is preferably performed immediately after the data is read. Alternatively, the refresh operation is preferably performed before Time T5 in the timing chart in FIG. 11.

In the case where data is read from the memory blocks MB3[i,1] to MB3[i,n] in the first row of the memory cell array 103C, the data reading can be performed in a manner similar to that of data writing to the memory blocks MB3[1,1] to MB3[1,n] connected to the wiring WL[1].

Note that each of the transistor ST1 and the transistor ST2 is preferably a transistor including silicon in an active layer. The transistor OT is preferably an OS transistor described in Embodiment 7. In particular, the OS transistor has favorable switching characteristics and extremely low off-state current, and accordingly, a leakage current in an off state of the OS transistor can be extremely low. Thus, in the transistor OT, charge can be kept for a long time between the second terminal of the transistor OT and the first terminal of the capacitor C, which leads to a reduction in frequencies of refresh operations.

<Other Circuit Configuration Examples>

One embodiment of the present invention is not limited to the memory cell array 103A including the memory block MB1, the memory cell array 103B including the memory block MB2, the memory cell array 103C including the memory block MB3, or a semiconductor device including any of the above memory cell arrays. Depending on circumstances, conditions, or necessity, provision or connection of wirings, provision or connection of circuits, provision or connection of elements, or the like can be changed.

For example, in the case where an amount of current is made larger in the transistor DO1 described in the semiconductor device which includes the memory cell array 103A including the memory block MB1 or the memory cell array 103B including the memory block MB2, the transistor DO1 is formed to have a dual-gate structure in which a first gate and a second gate are electrically connected.

FIG. 3B shows a case where the transistor DO1 in the memory block MB1 has a dual-gate structure. The transistor DO1 in the memory block MB1[i,j] shown in FIG. 3B includes a first gate and a second gate, and the first gate of the transistor DO1 and the second gate of the transistor DO1 are electrically connected to each other. With such a configuration, the amount of current flowing between the wiring BGL[j] and the wiring BG[i,j] can be made larger than that in the memory block MB1[i,j] in FIG. 3A.

FIG. 7B shows a case where the transistor DO1 in the memory block MB2 has a dual-gate structure. The transistor DO1 in the memory block MB2[i,j] shown in FIG. 7B includes a first gate and a second gate, and the first gate of the transistor DO1 and the second gate of the transistor DO1 are electrically connected to each other. With such a configuration, the amount of current flowing between the wiring BGL[j] and the wiring BG[i,j] can be made larger than that in the memory block MB2[i,j] in FIG. 7A.

In this embodiment, one embodiment of the present invention has been described. Other embodiments of the present invention will be described in the other embodiments. Note that one embodiment of the present invention is not limited to the above examples. In other words, various embodiments of the invention are described in this embodiment and the other embodiments, and one embodiment of the present invention is not limited to a particular embodiment. Although an example in which a channel formation region or the like of a transistor includes an oxide semiconductor is described as one embodiment of the present invention, one embodiment of the present invention is not limited thereto. Depending on the circumstances or conditions, a variety of semiconductors may be used for transistors in one embodiment of the present invention, the channel formation regions of the transistors, the source and drain regions of the transistors, and the like. Depending on the circumstances or conditions, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances or case, transistors in one embodiment of the present invention, the channel formation regions of the transistors, the source and drain regions of the transistors, and the like do not necessarily include an oxide semiconductor.

Note that this embodiment can be combined with any of the other embodiments in this specification as appropriate.

Embodiment 2

In Embodiment 1, the configuration in which the memory cell array including DRAMs is divided by word lines is described; however, one embodiment of the present invention is not limited to the above configuration. For example, a configuration in which a memory cell array including 2T1C-type memory cells or a memory cell array including 3T1C-type memory cells is divided by word lines may be employed. In this embodiment, a case where a memory cell different from DRAM is used in the semiconductor device described in Embodiment 1 will be described.

<2T1C-Type Memory Cell>

Figure 12:
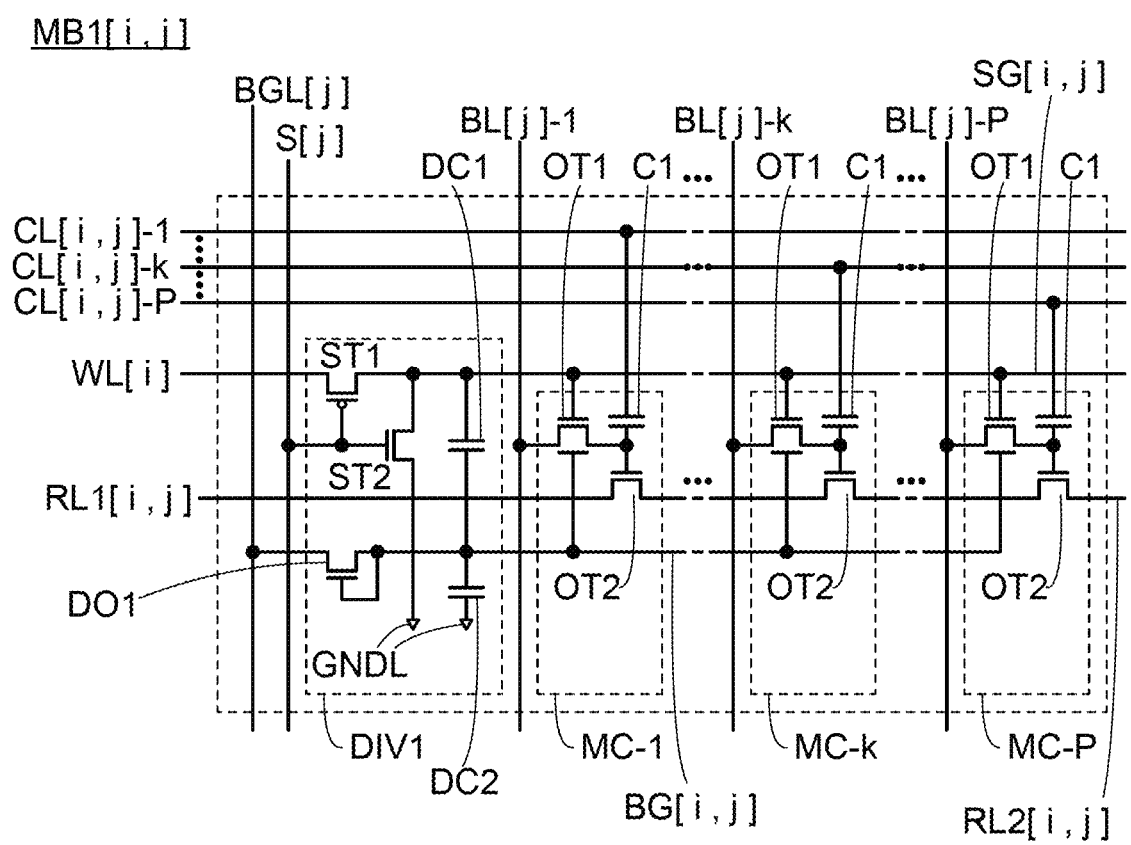
FIG. 12 is a circuit diagram showing a configuration example of FIG. 2B.

FIG. 12 shows a configuration of the memory block MB1PA in which a 2T1C-type memory cell is used.

The memory block MB1[i,j] shown in FIG. 12 has a configuration in which the memory cells MC-1 to MC-P in the memory block MB1[i,j] shown in FIGS. 2A and 2B are replaced with 2T1C-type memory cells.

Each of the memory cells MC-1 to MC-P includes the transistor OT1, a transistor OT2, and the capacitor C1. The transistor OT1 has a dual-gate structure including a first gate and a second gate.

The memory cell MC-k (k is an integer greater than or equal to 1 and less than or equal to P) is focused on, and a configuration thereof is described. A first terminal of the transistor OT1 in the memory cell MC-k is electrically connected to the wiring BL[j]-k, a second terminal of the transistor OT1 in the memory cell MC-k is electrically connected to a gate of the transistor OT2 and a first terminal of the capacitor C1, a first gate of the transistor OT1 in the memory cell MC-k is electrically connected to the wiring WL[i], and a second gate of the transistor OT1 in the memory cell MC-k is electrically connected to the wiring BG[i,j]. A second terminal of the capacitor C1 is electrically connected to a wiring CL[i,j]-k.

A first terminal of the transistor OT2 in a memory cell MC-h (h is an integer greater than or equal to 2 and less than or equal to n, and the memory cell MC-h is not shown in FIG. 12) is electrically connected to a second terminal of the transistor OT2 in a memory cell MC-(h−1). A first terminal of the transistor OT2 in the memory cell MC-1 is electrically connected to a wiring RL1[i,j], and a second terminal of the transistor OT2 in the memory cell MC-P is electrically connected to a wiring RL2[i,j].

The wiring RL1[i,j] and the wiring RL2[i,j] are wirings for inputting/outputting signals of data from the memory cells MC-1 to MC-P in the memory block MB1[i,j] for reading the data. Specifically, in a state where a predetermined potential is applied to wirings CL[i,j]-1 to C[i,j]-P except for the wiring CL that is connected to one memory cell where data is read, the predetermined potential is applied to either the wiring RL1[i,j] or the wiring RL2[i,j], and a potential outputted from the other of the wiring RL1[i,j] and the wiring RL2[i,j] is read out, so that data retained in the one memory cell is read out.

The wiring CL[i,j]-k is a wiring for supplying a predetermined potential to the second terminal of the capacitor C1 in the memory cell MC-k in the memory block MB1[i,j] during the writing operation or the reading operation.

Figure 13:
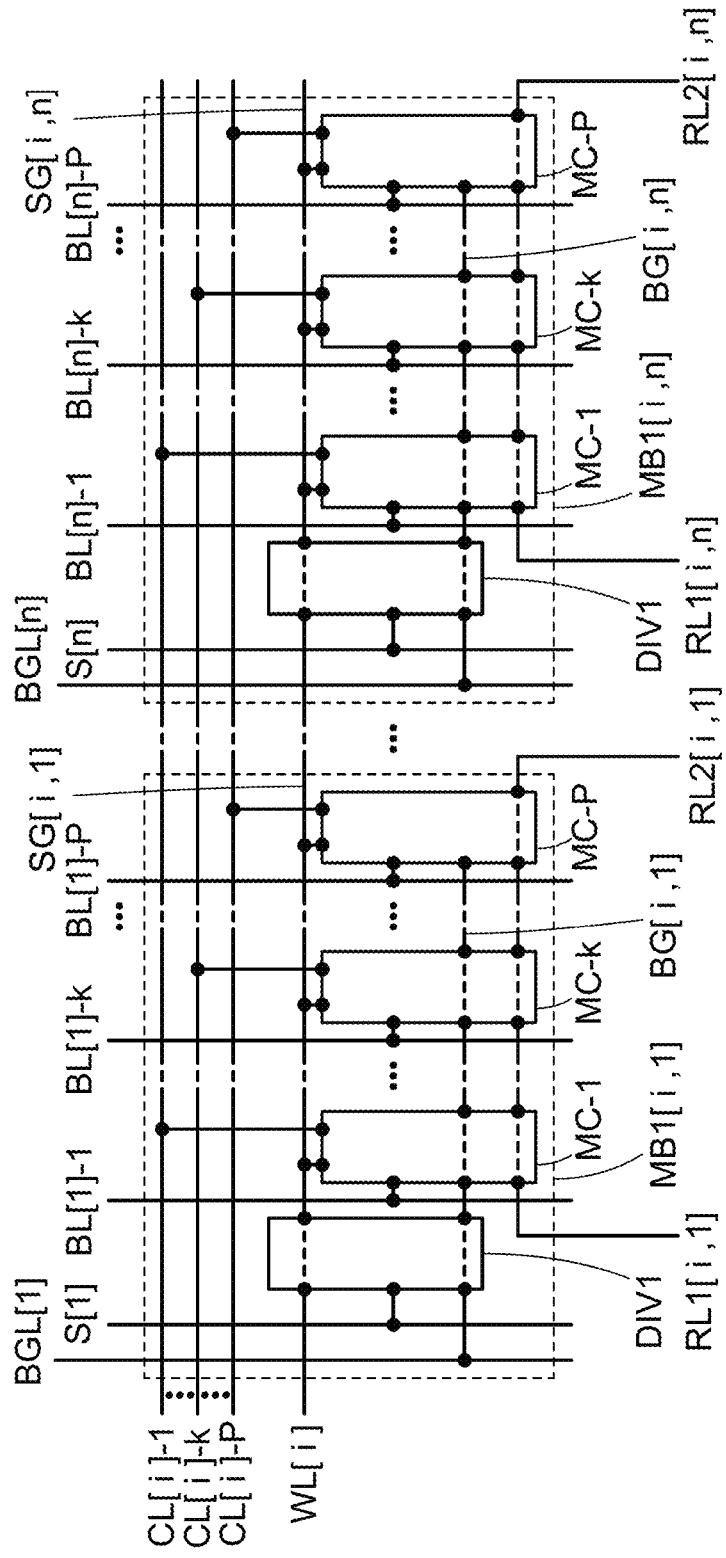
FIG. 13 is a block diagram showing an example of a semiconductor device.

Note that instead of a configuration in which one wiring CL is provided for one memory cell, a configuration as shown in FIG. 13 may be employed. In such a configuration, the wiring CL[j]-k is electrically connected to all second terminals of the capacitors C1 in n memory cells MC-k provided in the memory blocks MB1 in one row, and the second terminals of the capacitors C1 are collectively supplied with the predetermined potential. However, FIG. 13 shows an electrical connection between the wiring CL[i]-1 and the memory cell MC-1, an electrical connection between the wiring CL[i]-k and the memory cell MC-k, and an electrical connection between the wiring CL[i]-P and the memory cell MC-P. The following electrical connections are not shown: an electrical connection between the wiring CL[i]-1 and the capacitor C1 in the memory cell MC-1; an electrical connection between the wiring CL[i]-k and the capacitor C1 in the memory cell MC-k; and an electrical connection between the wiring CL[i]-P and the capacitor C1 in the memory cell MC-P.

FIG. 13 shows only the following components: the memory block MB1[1,1]; the memory block MB1[i,n]; the circuit DIV1; the memory cell MC-1; the memory cell MC-k; the memory cell MC-P; the wiring WL[i]; the wiring BGL[1]; the wiring BGL[n]; the wiring S[1]; the wiring S[n]; the wiring BL[1]-1; the wiring BL[1]-k; the wiring BL[1]-P; the wiring BL[n]-1; the wiring BL[n]-k; the wiring BL[n]-P; the wiring SG[i,1]; the wiring SG[i,n]; the wiring BG[i,1]; the wiring BG[i,n]; the wiring CL[i]-1; the wiring CL[i]-k; the wiring CL[i]-P; the wiring RL1[i,1]; the wiring RL2[i,1]; the wiring RL1[i,n]; and wiring RL2[i,n]. Other reference numerals, symbols, wirings, circuits, and the like are not shown.

In the case where a 2T1C-type memory cell is used in the memory block MB1[i,j], the memory block MB1[i,j] is formed to have the configuration shown in FIG. 12, so that data writing or reading can be performed per memory block MB1. Furthermore, with the potential of the wiring BG[i,j], the threshold voltages of the transistors OT1 in the memory cells MC-1 to MC-P can be controlled.

Figure 14:
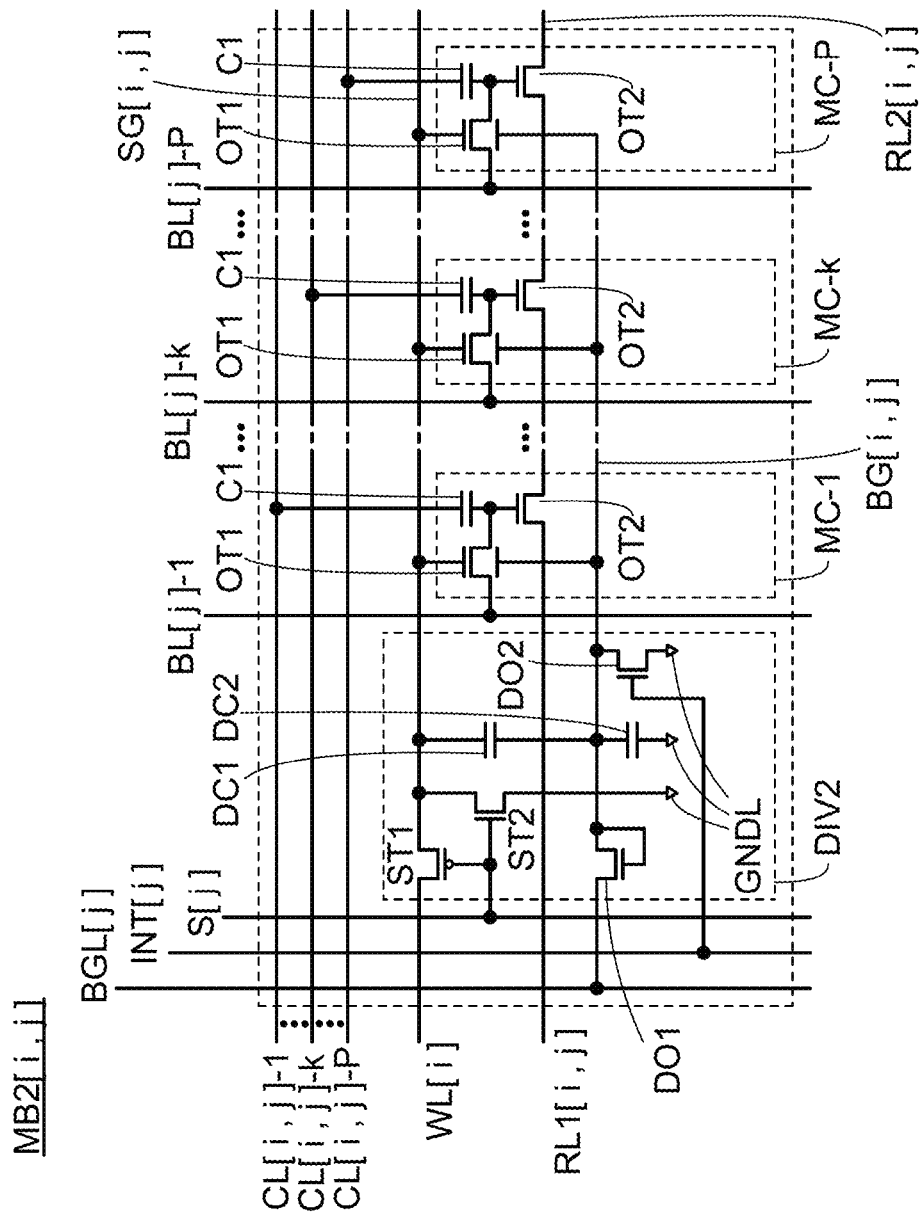
FIG. 14 is a circuit diagram showing a configuration example of FIG. 6B.

FIG. 14 shows a configuration of the memory block MB2[i,j] in which a 2T1C-type memory cell is employed. With this configuration, charge in the wiring BG[i,j] can be easily released.

Figure 15:
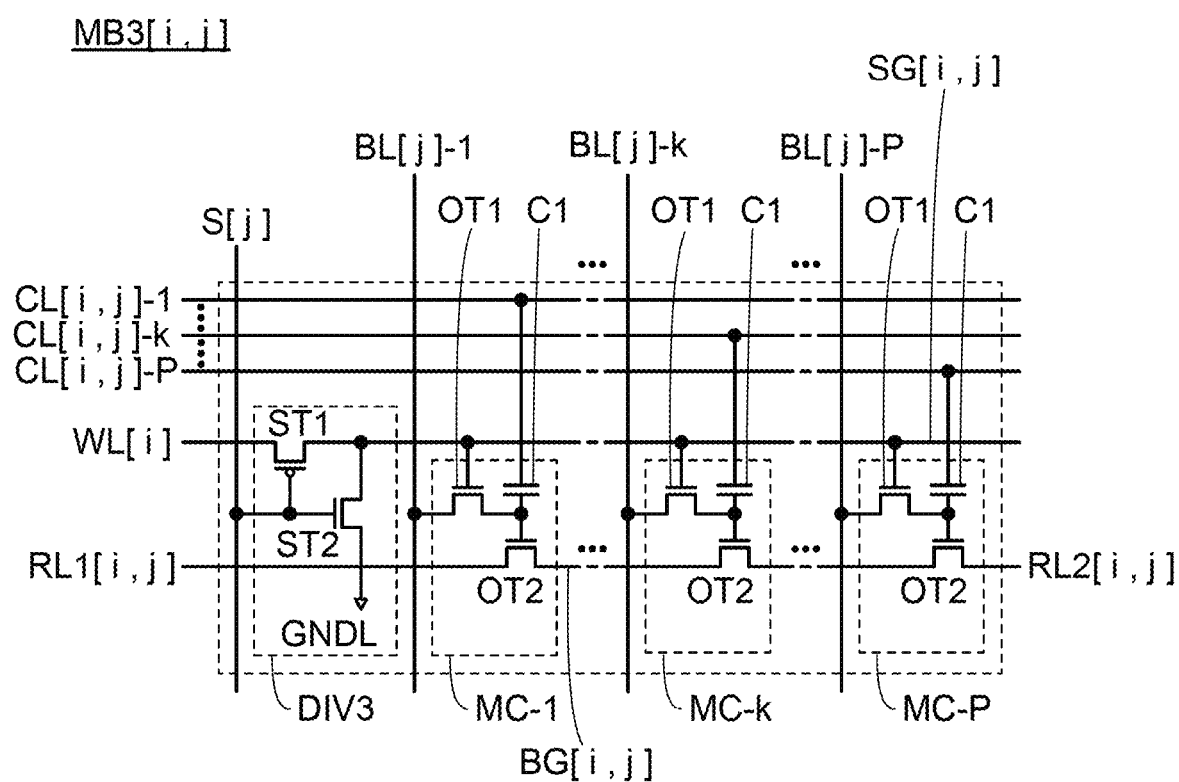
FIG. 15 is a circuit diagram showing a configuration example of FIG. 8B.

FIG. 15 shows a configuration of the memory block MB3[i,j] in which a 2T1C-type memory cell is employed. In this case, the transistor OT1 does not necessarily have a dual-gate structure, and thus, a second gate is not provided. With this configuration, an area occupied by a word line divider can be made small, and accordingly the storage capacitance per unit area of the memory cell array can be increased.

Each of the memory cells used in the memory blocks of FIG. 12, FIG. 14, and FIG. 15 has a 2T1C-type cell structure; thus, data is read from the memory block when the transistor OT1 is in an off state. In other words, by employing the memory block shown in FIG. 12, FIG. 14, or FIG. 15, data can be read out without making the transistor OT1 in an on state, and thus, the retained data can be prevented from being damaged by reading.

<3T1C-Type Memory Cell>

Figure 16:
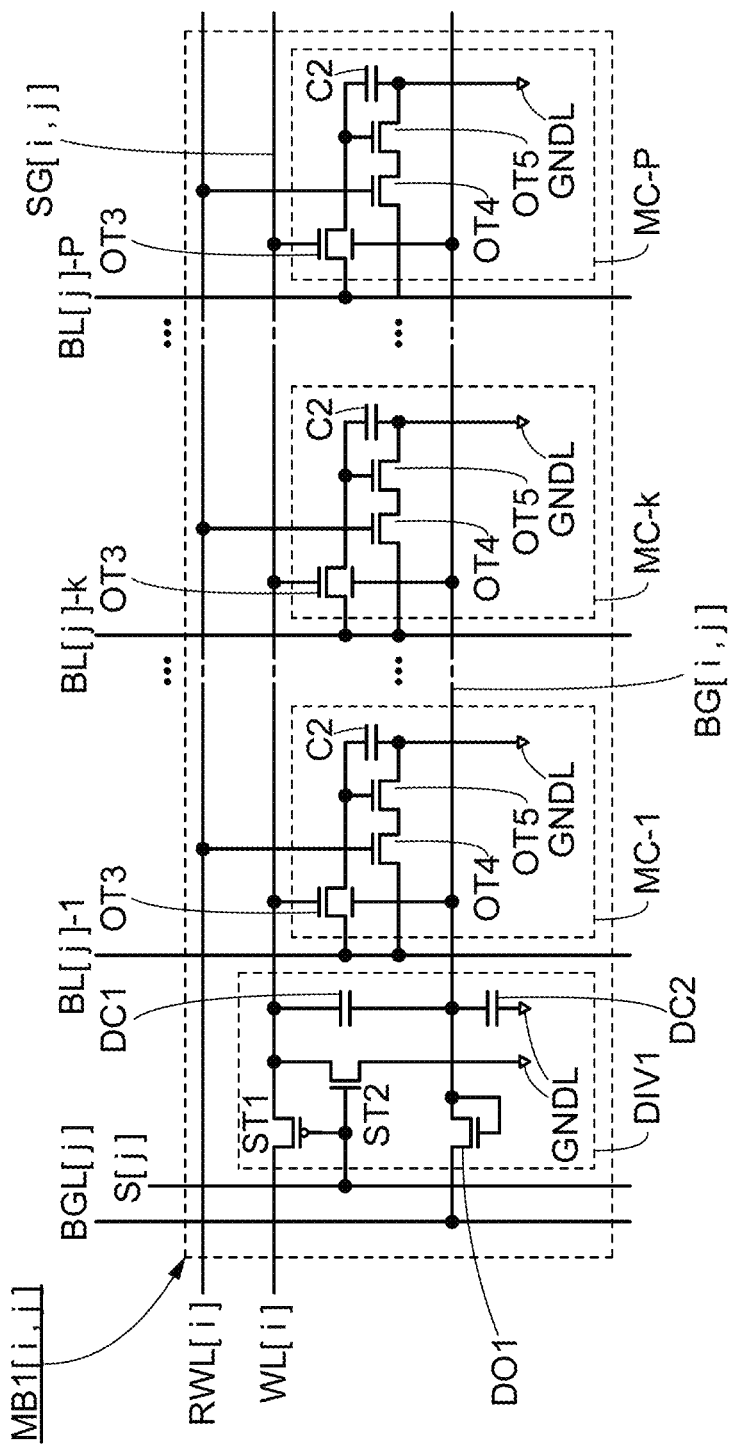
FIG. 16 is a circuit diagram showing a configuration example of FIG. 2B.

FIG. 16 shows a configuration of the memory block MB1[i,j] in which a 3T1C-type memory cell is employed.

In the memory block MB1[i,j] shown in FIG. 16, a 3T1C-type memory cell is used as each of the memory cells MC-1 to MC-P in the memory block MB1[i,j] shown in FIGS. 2A and 2B.

Each of the memory cells MC-1 to MC-P includes a transistor OT3, a transistor OT4, a transistor OT5, and a capacitor C2. Note that the transistor OT3 has a dual-gate structure including a first gate and a second gate.

The memory cell MC-k (k is an integer greater than or equal to 1 and less than or equal to P) is focused on and a configuration thereof is described. A first terminal of the transistor OT3 in the memory cell MC-k is electrically connected to the wiring BL[j]-k, a second terminal of the transistor OT3 in the memory cell MC-k is electrically connected to a gate of the transistor OT5 and a first terminal of the capacitor C2, a first gate of the transistor OT3 in the memory cell MC-k is electrically connected to the wiring WL[i], and a second gate of the transistor OT3 in the memory cell MC-k is electrically connected to the wiring BG[i,j]. A first terminal of the transistor OT4 is electrically connected to the wiring BL[j]-k, a second terminal of the transistor OT4 is electrically connected to a first terminal of the transistor OT5, and a gate of the transistor OT4 is electrically connected to a wiring RWL. A second terminal of the Capacitor C2 is electrically connected to a second terminal of the transistor OT5 and the wiring GNDL.

The wiring RWL[i] functions as a reading word line. Specifically, when all of the data retained in the memory cells MC-1 to MC-P in the memory blocks MB1 in the i-th row is read, a predetermined potential is supplied to the wiring RWL[i], whereby data in the memory cells can be read out.

With the configuration as shown in FIG. 16, data writing or reading can be performed per block even when a 3T1C-type memory cell is used in the memory block MB1[i,j]. By the potential of the wiring BG[i,j], the threshold voltages of the transistors OT3 in the memory cells MC-1 to MC-P can be controlled.

Figure 17:
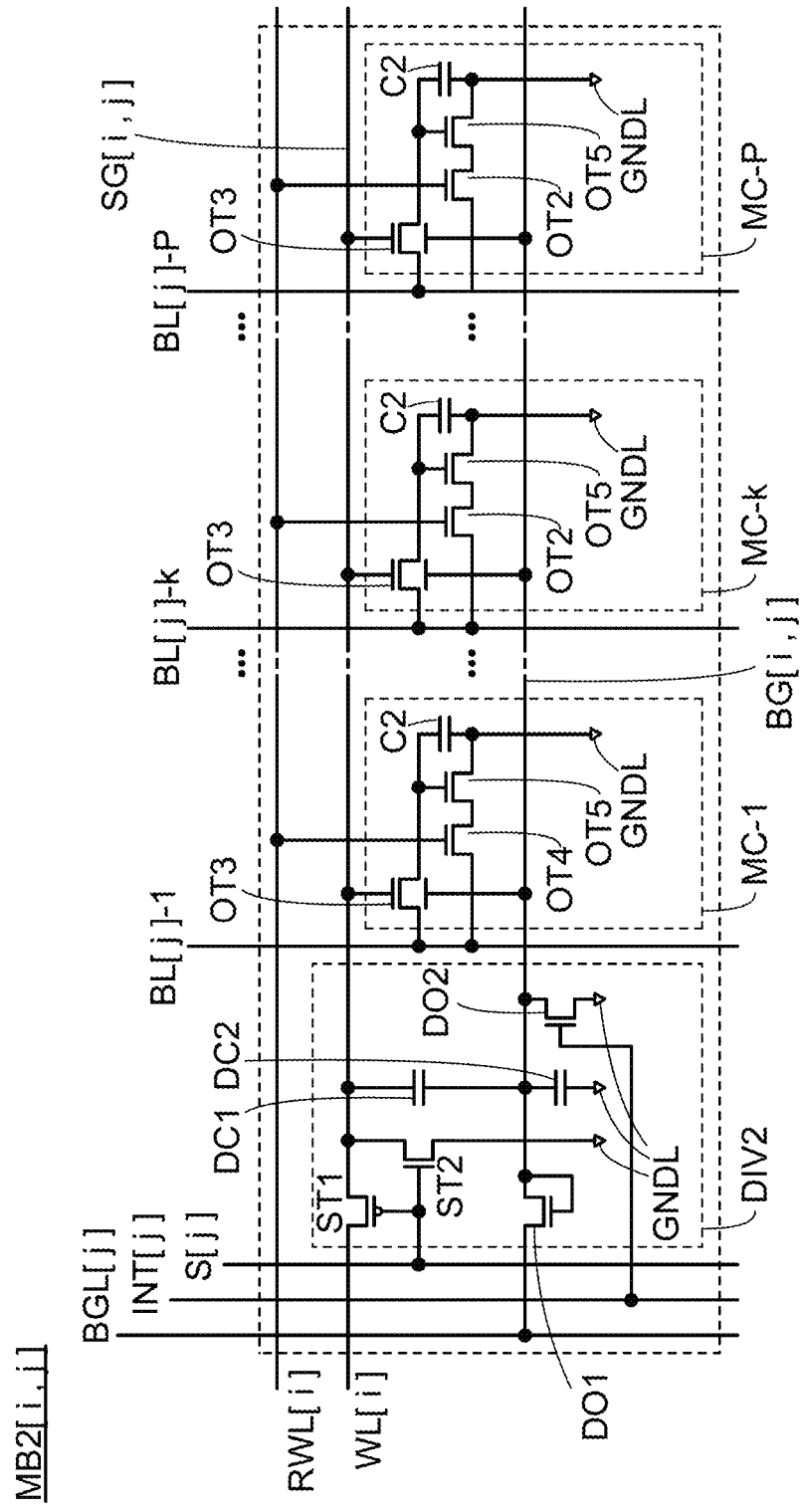
FIG. 17 is a circuit diagram showing a configuration example of FIG. 6B.

FIG. 17 shows a configuration of the memory block MB2[i,j] in which a 3T1C-type memory cell is employed. With this configuration, charges in the wiring BG[i,j] can be released easily.

Figure 18:
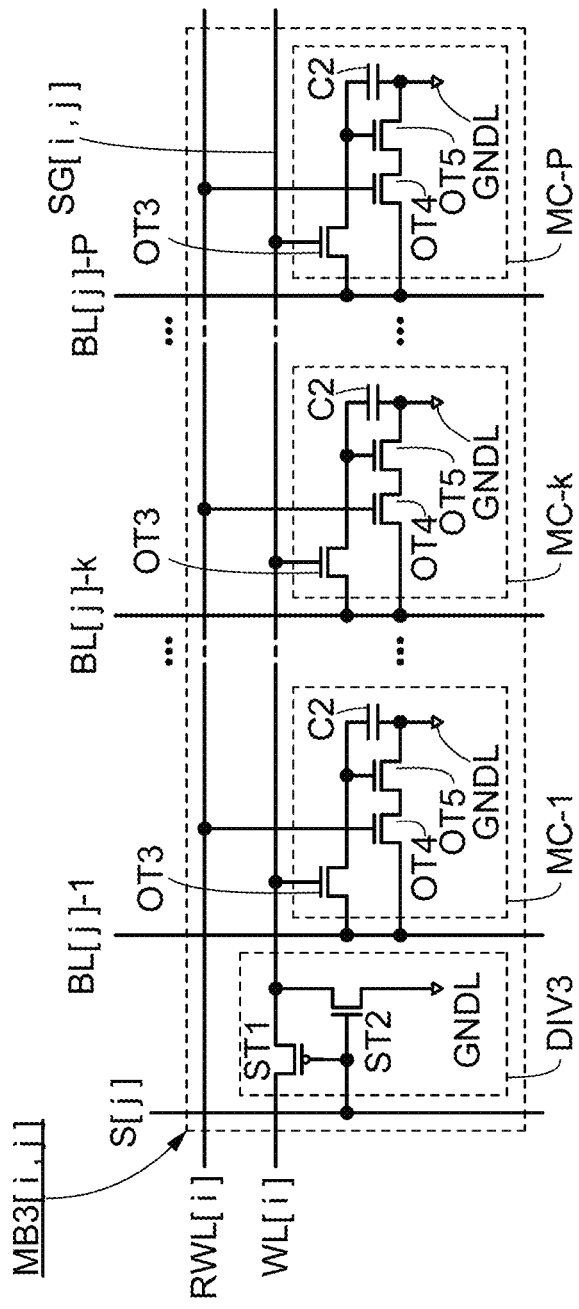
FIG. 18 is a circuit diagram showing a configuration example of FIG. 8B.

FIG. 18 shows a configuration of the memory block MB3[i,j] in which a 3T1C-type memory cell is employed. In this case, the transistor OT3 does not necessarily have a dual-gate structure, and a second gate is not provided. With this configuration, an area occupied by a word line divider can be made small, and accordingly the storage capacitance per unit area of the memory cell array can be increased.

Each of the memory cells used in the memory blocks of FIG. 16, FIG. 17, and FIG. 18 has a 3T1C-type cell structure; thus, data is read from the memory block when the transistor OT3 is in an off state. In other words, by employing the memory block shown in FIG. 16, FIG. 17, or FIG. 18, data can be read out without making the transistor OT3 in an on state, and thus, the retained data can be prevented from being damaged by reading.

Note that one embodiment of the present invention is not limited to any of the DRAM, the 2T1C-type memory cell, or the 3T1C-type memory cell in the memory blocks MB1 to MB3. Depending on circumstances or conditions, provision or connection of wirings, provision or connection of circuits, provision or connection of elements, or the like can be changed. For example, an SRAM or a memory cell including three transistors (referred to as 3T-type memory cell in some cases) may be used in any of the memory blocks MB1 to MB3. Moreover, one embodiment of the present invention is not limited to a memory device, and an imaging element of an imaging device can be provided per block, or a display element of a display device can be provided per block, in some cases.

Note that this embodiment can be combined with any of the other embodiments in this specification as appropriate.

Embodiment 3

A configuration example of a memory device of one embodiment of the present invention will be described with reference to FIG. 19.

Figure 19:
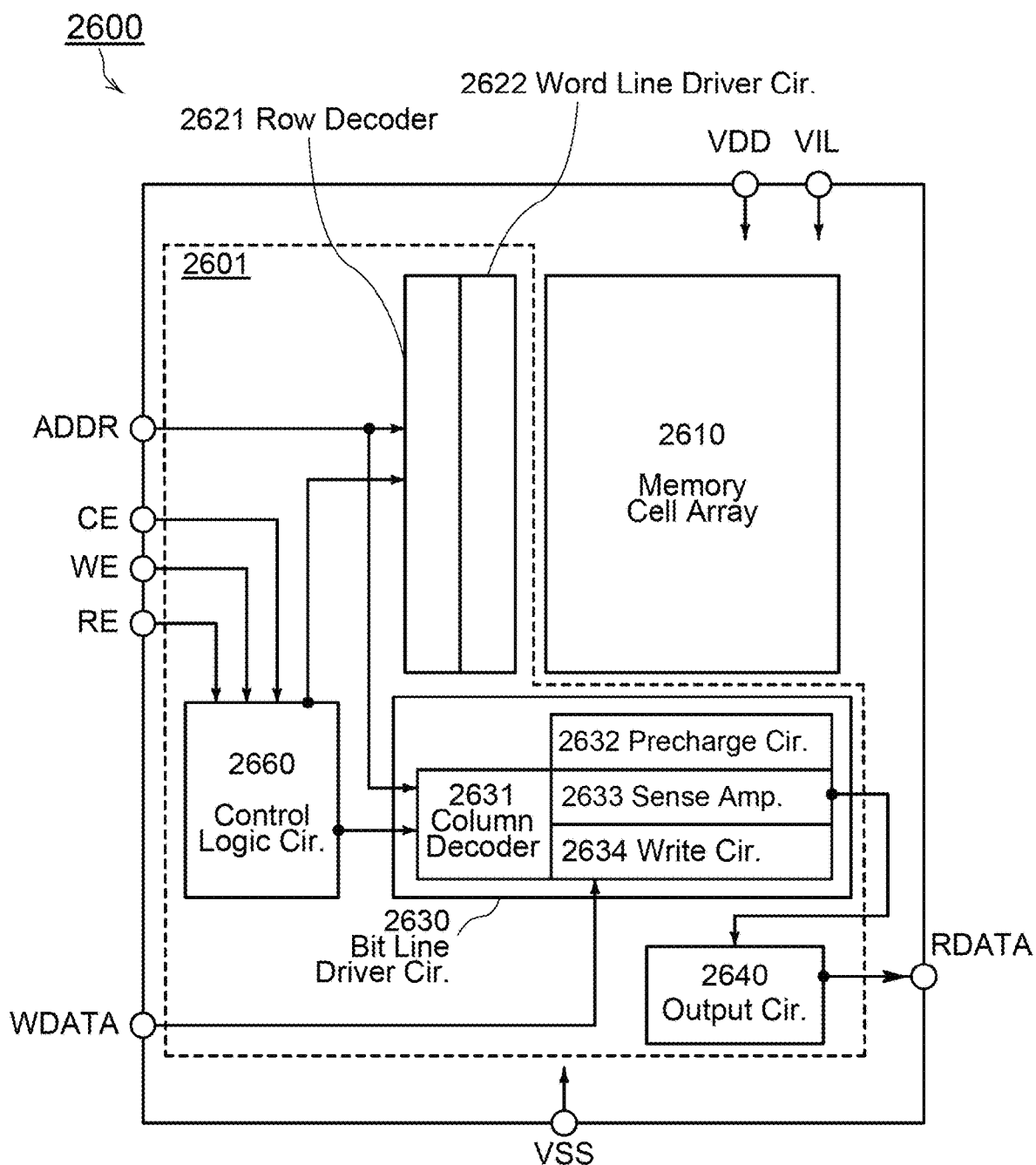
FIG. 19 is a block diagram showing an example of a memory device.

FIG. 19 shows one example of a structure of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The column decoder 2631 and the write circuit 2634 correspond to the selector circuit in FIG. 1. The precharge circuit 2632 has a function of precharing the wirings BL[1]-1 to BL[n]-P described in Embodiment 1, and either wiring RL1[i,j] or the wiring RL2[i,j] in Embodiment 2, which are not shown in FIG. 19. The sense amplifier 2633 has a function of amplifying a data signal read from the wirings BL[1]-1 to BL[n]-P. The precharge circuit 2632 and the sense amplifier 2633 correspond to the sense amplifier/precharge circuit 102 in FIG. 1. The amplified data signal is outputted as a digital data signal RDATA to the outside of the memory device 2600 through the output circuit 2640.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA are inputted to the memory device 2600 from the outside. The address signal ADDR is inputted to the row decoder 2621 and the column decoder 2631, and the data signal WDATA is inputted to the write circuit 2634.

The control logic circuit 2660 processes the signals (CE, WE, RE) inputted from the outside, and generates control signals for the row decoder 2621 and the column decoder 2631. The signal CE is a chip enable signal, the signal WE is a write enable signal, and the signal RE is a read enable signal. Signals processed by the control logic circuit 2660 are not limited to those listed above, and other control signals may be input as necessary.

Note that whether each circuit or each signal described above is provided or not can be determined as appropriate as needed.

When an n-channel Si transistor, a p-channel Si transistor, and a transistor including a channel formation region using an oxide semiconductor (preferably an oxide containing In, Ga, and Zn) described in Embodiment below are used in the memory device 2600, the memory device 2600 can be reduced in size. In addition, the memory device 2600 can be reduced in power consumption. Furthermore, the memory device 2600 can be increased in operation speed.

Note that the configuration of this embodiment is not limited to that shown in FIG. 19. The configuration may be changed as appropriate: for example, part of the peripheral circuit 2601, e.g., the precharge circuit 2632 and/or the sense amplifier 2633 may be provided below the memory cell array 2610 in the case where the configuration described in this embodiment is applied to Embodiment 1 or 2.

Note that this embodiment can be combined with any of the other embodiments in this specification as appropriate.

Embodiment 4

In this embodiment, examples in which the semiconductor device described in any of the above embodiments is used as a memory device in an electronic component and in an electronic device including the electronic component are described with reference to FIGS. 20A to 20E and FIGS. 21A to 21H.

Electronic Component

FIG. 20A shows an example in which the semiconductor device described in any of the above embodiments is used as a memory device in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including the transistors described in Embodiments 1 and 2 is completed through an assembly process (post-process) of integrating detachable components on a printed board.

The post-process can be finished through the steps in FIG. 20A. Specifically, after an element substrate obtained in the proceeding process is completed (Step STP1), a rear surface of the substrate is ground (Step STP2). The substrate is thinned in this step to reduce warpage or the like of the substrate in the proceeding process and to reduce the size of the component itself.

The rear surface of the substrate is ground so that the substrate is divided into a plurality of chips in a dicing process. Then, the divided chips are separately picked up to be mounted on and bonded to a lead frame in a die bonding process (Step STP3). In this die bonding process, the chip is bonded to the lead frame by an appropriate method depending on a product, for example, bonding with a resin or a tape. Note that in the die bonding process, the chip may be mounted on an interposer to be bonded.

Note that in this embodiment, when an element is formed on a surface of a substrate, the other surface is referred to as a rear surface (a surface on which the element is not formed).

Next, wiring bonding for electrically connecting a lead of the lead frame and an electrode on a chip through a metal wire is performed (Step STP4). A silver line or a gold line can be used as the metal fine line. Ball bonding or wedge bonding can be used as the wire bonding.

A wire-bonded chip is subjected to a molding step of sealing the chip with an epoxy resin or the like (Step STP5). With the molding step, the inside of the electronic component is filled with a resin, thereby reducing damage to the circuit portion and the wire embedded in the component caused by external mechanical force as well as reducing deterioration of characteristics due to moisture or dust.

Next, plate processing is performed on the lead of the lead frame. Then, the lead is cut and processed into a predetermined shape (Step STP6). This plate processing prevents rust of the lead and facilitates soldering at the time of mounting the chip on a printed wiring board in a later step.

Next, printing (marking) is performed on a surface of the package (Step STP7). After a final testing step (Step STP8), the electronic component is completed (Step STP9).

The above electronic component can include the semiconductor device described in the above embodiment. Thus, a highly reliable electronic component can be obtained.

FIG. 20B is a schematic perspective view of the completed electronic component. FIG. 20B shows a schematic perspective diagram of a quad flat package (QFP) as an example of the electronic component. An electronic component 4700 in FIG. 20B includes a lead 4701 and a circuit portion 4703. The electronic component 4700 in FIG. 20B is mounted on a printed board 4702, for example. A plurality of electronic components 4700 which are combined and electrically connected to each other over the printed board 4702 can be mounted on an electronic device. A completed circuit board 4704 is provided in an electronic device or the like.

One embodiment of the present invention is not limited to the shape of the electronic component 4700, and the element substrate fabricated in Step STP1 is included. In addition, the element substrate of one embodiment of the present invention includes an element substrate that has been subjected to Step STP2 where the rear surface of the substrate is ground. For example, a semiconductor wafer 4800 or the like shown in FIG. 20C corresponds to the element substrate. In the semiconductor wafer 4800, a plurality of circuit portions 4802 are formed on a top surface of a wafer 4801. A part without the circuit portions 4802 on the top surface of the wafer 4801 is a spacing 4803 that is a region for dicing.

The dicing is carried out along scribe lines SCL1 and scribe lines SCL2 (referred to as dicing line or cutting line in some cases) indicated by dashed-dotted lines. For performing the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 are intersected perpendicularly with each other.

With the dicing step, a chip 4800a as shown in FIG. 20D can be cut out from the semiconductor wafer 4800. The chip 4800a includes a wafer 4801a, the circuit portion 4802, and a spacing 4803a. Note that it is preferable to provide the spacing 4803a to be made as small as possible. In this case, it is preferable that the width of the spacing 4803 between adjacent circuit portions 4802 be substantially the same as a length of margin for cutting of the scribe line SCL1 or the scribe line SCL2.

The shape of the element substrate of one embodiment of the present invention is not limited to the shape of the semiconductor wafer 4800 shown in FIG. 20C. For example, a rectangular semiconductor wafer 4810 shown in FIG. 20E can be employed. The shape of the element substrate can be changed as appropriate, depending on a process for fabricating an element and an apparatus for fabricating an element.

<Electronic Device>

Next, electronic devices including the aforementioned electronic component will be described.

A semiconductor device of one embodiment of the present invention can be used for a display device, a personal computer, or an image reproducing devices provided with recording media (typically, devices that reproduce the content of recording media such as digital versatile discs (DVDs) and have displays for displaying the reproduced images). Other than the above, as electronic devices which can be equipped with the semiconductor device of one embodiment of the present invention, mobile phones, portable game machines, portable information terminals, e-book readers, video cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), vending machines, medical devices, and the like can be given. FIGS. 21A to 21H illustrate specific examples of these electronic devices.

Figure 21A:
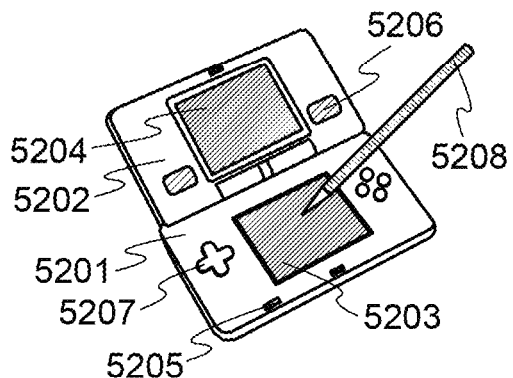
FIGS. 21A to 21H are each a perspective view of an electronic device.

FIG. 21A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 21A has the two display portions 5203 and 5204, the number of display portions included in a portable game machine is not limited to this.

Figure 21B:
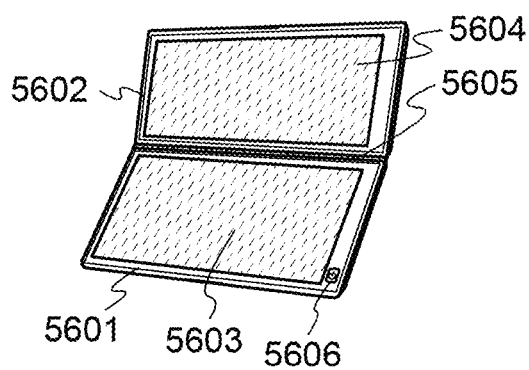

FIG. 21B illustrates a personal digital assistant, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 21C:
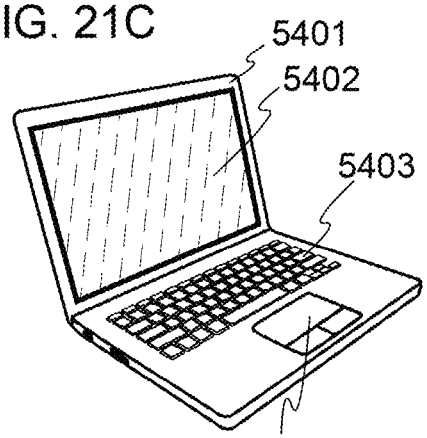

FIG. 21C illustrates a notebook personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 21D:
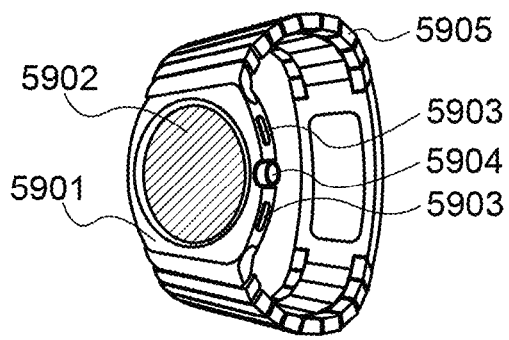

FIG. 21D illustrates a smart watch which is one of wearable terminals. The smart watch includes a housing 5901, a display portion 5902, operation buttons 5903, an operator 5904, and a band 5905. The semiconductor device of one embodiment of the present invention can be used for a variety of integrated circuits included in the smart watch. A display device with a position input function may be used as a display portion 5902. Note that the position input function can be added by provision of a touch panel in a display device. Alternatively, the position input function can be added by providing a photoelectric conversion element called a photosensor in a pixel area of a display device. As the operation buttons 5903, any one of a power switch for starting the smart watch, a button for operating an application of the smart watch, a volume control button, a switch for turning on or off the display portion 5902, and the like can be used. Although the smart watch in FIG. 21D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for a time adjustment. Although the smart watch illustrated in FIG. 21D includes the operator 5904, one embodiment of the present invention is not limited thereto and the operator 5904 is not necessarily provided.

Figure 21E:
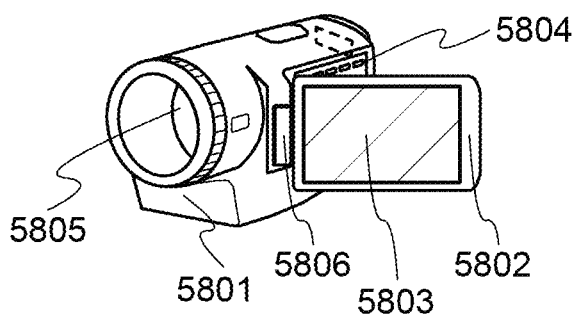

FIG. 21E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 21F:
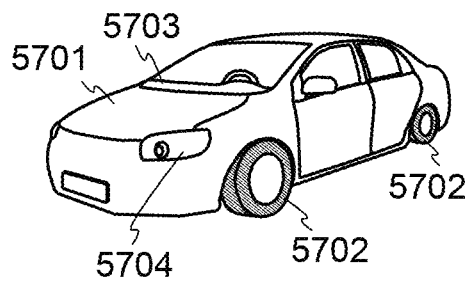

FIG. 21F illustrates a passenger car including a car body 5701, wheels 5702, a dashboard 5703, lights 5704, and the like. The semiconductor device of one embodiment of the present invention can be used for a variety of integrated circuits included in cars.

Figure 21G:
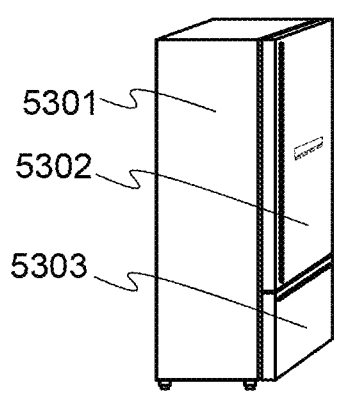

FIG. 21G illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 21H:
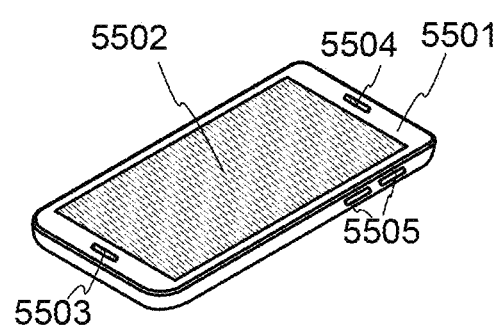
Figure 23A:
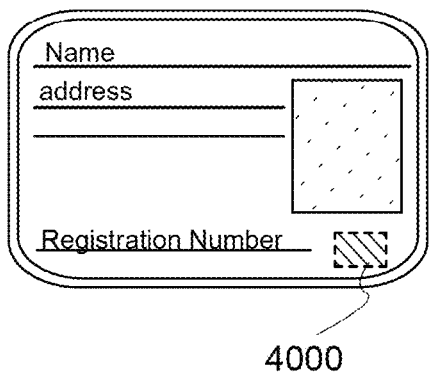
FIGS. 23A to 23F are perspective views showing application examples of an RF tag.
Figure 23B:
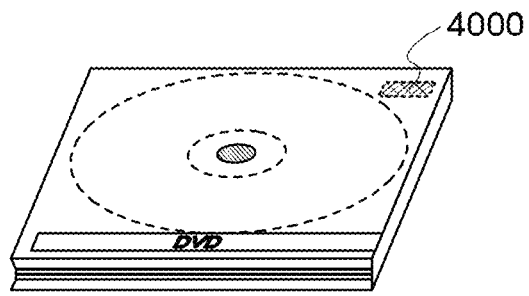
Figure 23C:
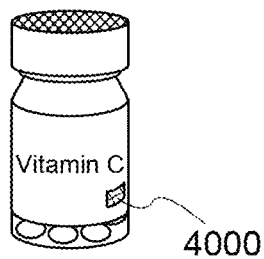
Figure 23D:
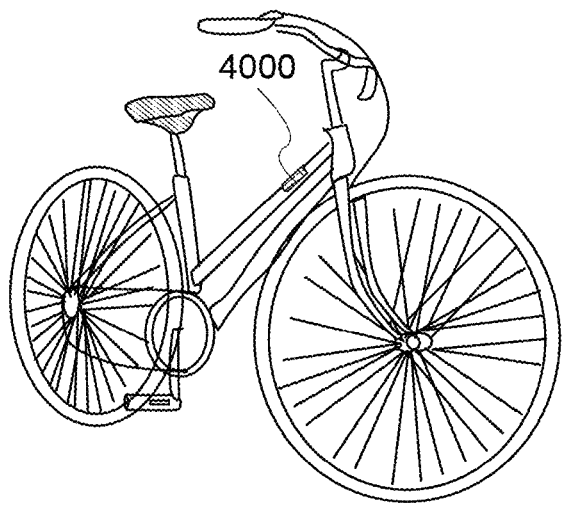
Figure 23E:
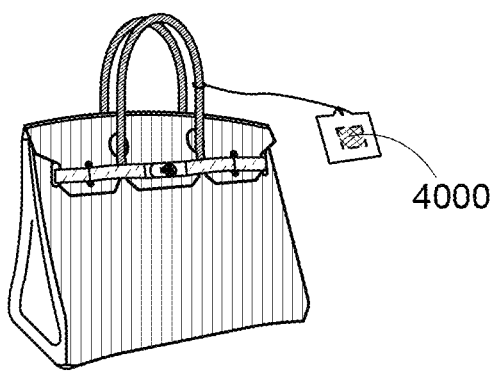
Figure 23F:
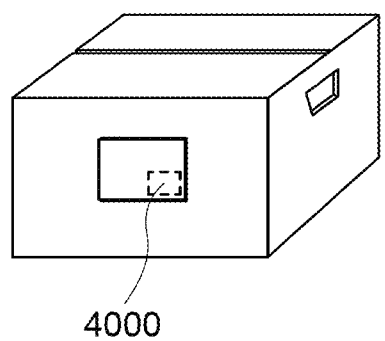

FIG. 21H is a mobile phone having a function of an information terminal. The mobile phone includes a housing 5501, a display portion 5502, a microphone 5503, a speaker 5504, and operation buttons 5505. A display device with a position input function may be used as the display portion 5502. Note that the position input function can be added by provision of a touch panel in a display device. Alternatively, the position input function can be added by providing a photoelectric conversion element called a photosensor in a pixel area of a display device. As operation buttons 5505, any one of a power switch for starting the mobile phone, a button for operating an application of the mobile phone, a volume control button, a switch for turning on or off the display portion 5502, and the like can be used. Although the mobile phone in FIG. 21H includes two operation buttons 5505, the number of the operation buttons included in the mobile phone is not limited to two. Although not illustrated, the mobile phone illustrated in FIG. 21H may be provided with a camera. Although not illustrated, the mobile phone illustrated in FIG. 21H may include a light-emitting device used for a flashlight or a lighting purpose. Although not illustrated, the mobile phone in FIG. 21H may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing 5501. In particular, the direction of the mobile phone (the direction of the mobile phone with respect to the vertical direction) shown in FIG. 21H is determined by providing a sensing device which includes a sensor for sensing inclinations, such as a gyroscope or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. For example, the display element, the display device, the light-emitting element, or the light-emitting device includes at least one of an electroluminescence (EL) element (e.g., an EL element including organic and inorganic materials, an organic EL element, or an inorganic EL element), a light-emitting diode (LED) chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulation (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by electric or magnetic action may be included in the display element, the display device, the light-emitting element, or the light-emitting device. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum or silver. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including micro electro mechanical systems (MEMS), a drying agent may be provided in a space where the display element is sealed (e.g., between an element substrate over which the display element is placed and a counter substrate opposed to the element substrate). Providing a dry agent can prevent MEMS and the like from becoming difficult to move or deteriorating easily because of moisture or the like.

Note that this embodiment can be combined with any of the other embodiments in this specification as appropriate.

Embodiment 5

The memory device of one embodiment of the present invention can be used for removable memory devices such as memory cards (e.g., SD cards), universal serial bus (USB) memories, and solid state drives (SSD). In this embodiment, some structure examples of the removable memory device are described with reference to FIGS. 22A to 22E.

FIG. 22A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, the substrate 5104 is provided with a memory chip 5105 and a controller chip 5106. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5105. Specifically, a processor, a work memory, an ECC circuit, and the like are incorporated in the controller chip 5106. Note that the circuit configurations of the memory chip 5105 and the controller chip 5106 are not limited to those described above, and can be changed depending on circumstances or conditions. For example, the word line driver circuit 2622, the row decoder 2621, the sense amplifier 2633, the precharge circuit 2632, and the column decoder 2631 may be incorporated into not the memory chip 5105 but the controller chip 5106. The USB connector 5103 functions as an interface for connection to an external device.

FIG. 22B is a schematic external diagram of an SD card, and FIG. 22C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with a memory chip 5114 and a controller chip 5115. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5114. A processor, a work memory, an ECC circuit, and the like are incorporated in the controller chip 5115. Note that the circuit configurations of the memory chip 5114 and the controller chip 5115 are not limited to those described above, and can be changed depending on circumstances or conditions. For example, the word line driver circuit 2622, the row decoder 2621, the sense amplifier 2633, the precharge circuit 2632, and the column decoder 2631 may be incorporated into not the memory chip 5114 but the controller chip 5115.

When the memory chip 5114 is also provided on a back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

FIG. 22D is a schematic external diagram of an SSD, and FIG. 22E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with a memory chip 5154, a memory chip 5155, and a controller chip 5156. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5154. When the memory chip 5154 is also provided on a back side of the substrate 5153, the capacity of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chip 5154, the memory chip 5155, and the controller chip 5115 are not limited to those described above, and can be changed depending on circumstances or conditions. For example, a memory functioning as a work memory may also be provided in the controller chip 5156.

Note that this embodiment can be combined with any of the other embodiments in this specification as appropriate.

Embodiment 6

In this embodiment, application examples of an RF tag that can include the memory device of one embodiment of the present invention will be described with reference to FIGS. 23A to 23F. The RF tag is widely used and can be provided for, for example, products such as bills, coins, securities, bearer bonds, documents (e.g., driver's licenses or resident's cards, see FIG. 23A), recording media (e.g., DVD or video tapes, see FIG. 23B), packaging containers (e.g., wrapping paper or bottles, see FIG. 23C), vehicles (e.g., bicycles, see FIG. 23D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 23E and 23F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have a higher level of security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.

Embodiment 7

Described in this embodiment are transistors of one embodiment of the disclosed invention.

Transistors in one embodiment of the present invention each preferably include an nc-OS or a CAAC-OS, which is described in Embodiment 8.

Structure Example 1 of Transistor

Figure 24A:
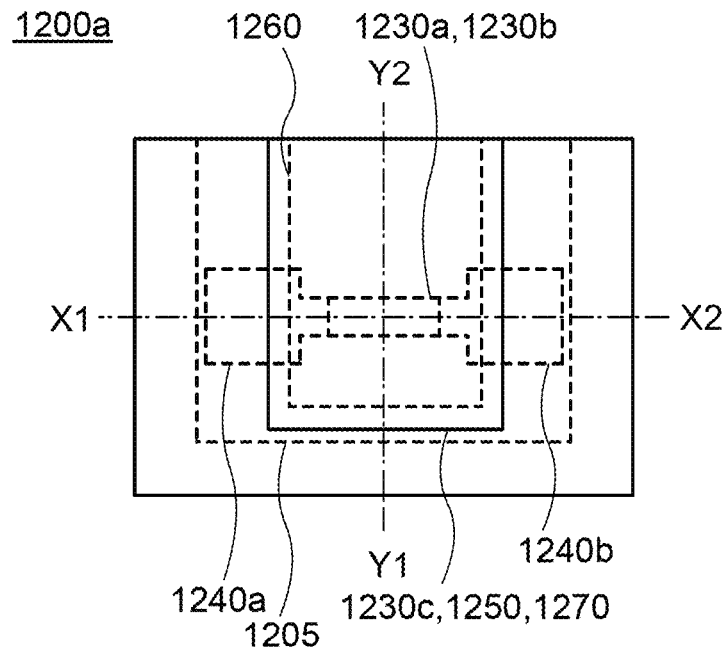
FIGS. 24A to 24C are a top view and cross-sectional views illustrating a structure example of a transistor.
Figure 24B:
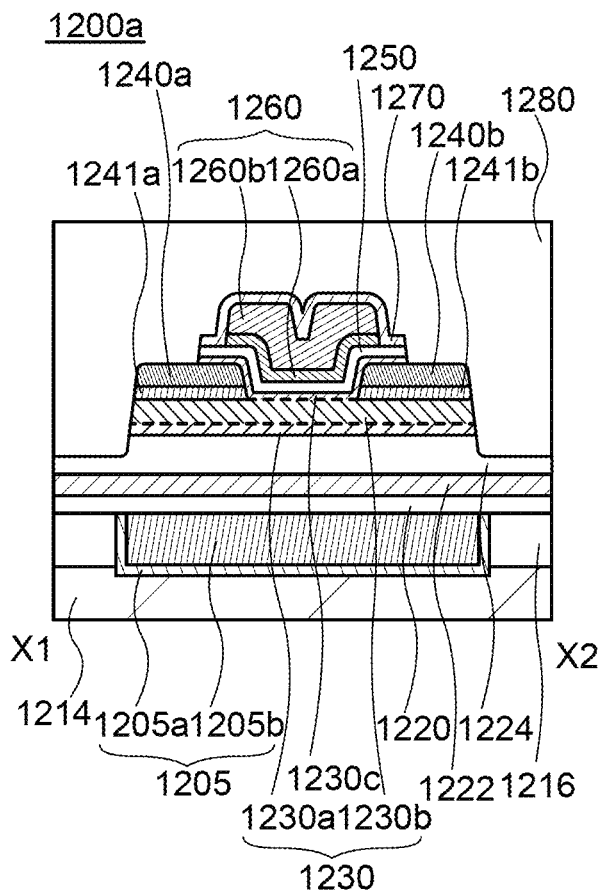
Figure 24C:
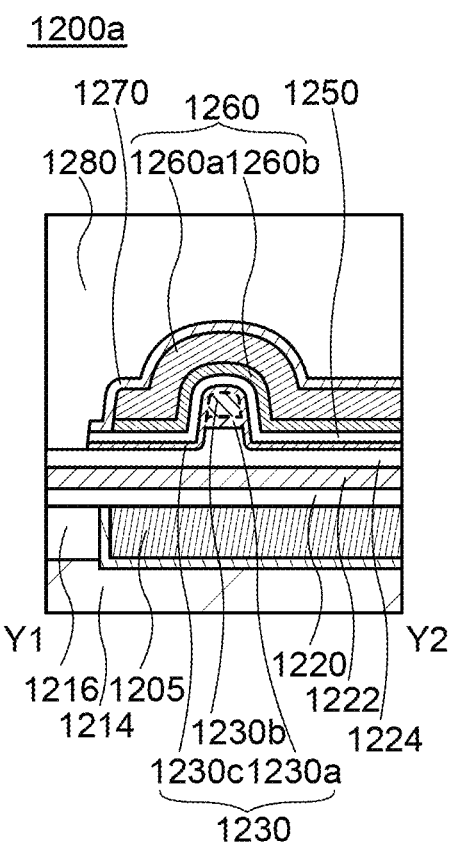

An example of a transistor of one embodiment of the present invention is described below. FIGS. 24A to 24C are a top view and cross-sectional views of a transistor of one embodiment of the present invention. FIG. 24A is a top view. FIG. 24B is a cross-sectional view taken along dashed-dotted line X1-X2 in FIG. 24A. FIG. 24C is a cross-sectional view taken along dashed-dotted line Y1-Y2 in FIG. 24A. Note that for simplification of the drawing, some components in the top view in FIG. 24A are not illustrated.

A transistor 1200a includes a conductor 1205 and a conductor 1260 that function as gate electrodes; an insulator 1220, an insulator 1222, an insulator 1224, and an insulator 1250 that function as gate insulating layers; a metal oxide 1230 that includes a region where a channel is formed; a conductor 1240a and a conductor 1241a that function as one of a source and a drain; a conductor 1240b and a conductor 1241b that function as the other of the source and the drain; an insulator 1214; an insulator 1216; an insulator 1270; and the insulator 1280 that includes excess oxygen.

The metal oxide 1230 includes a metal oxide 1230a, a metal oxide 1230b over the metal oxide 1230a, and a metal oxide 1230c over the metal oxide 1230b. When the transistor 1200a is turned on, current flows (a channel is formed) mainly in the metal oxide 1230b. Although current sometimes flow through a region in the vicinity of the interface (a mixed region in some cases) between the metal oxide 1230b and the metal oxides 1230a and 1230c, the metal oxides 1230a and 1230c function as insulators at the other region.

<<Interlayer Insulating Film and Protective Insulating Film>>

The insulator 1214 is preferably formed using a material that has a barrier property with respect to hydrogen or oxygen. As an example of the film having a barrier property with respect to hydrogen, silicon nitride formed by a CVD method can be used for the insulator 1214. As the insulator 1214, metal oxide such as aluminum oxide, hafnium oxide, or tantalum oxide is preferably used, for example. In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 1200a in and after a manufacturing process of the transistor. In addition, release of oxygen from the metal oxide in the transistor 1200a can be prevented. Therefore, aluminum oxide is suitably used as a protective film for the transistor 1200a.

The insulator 1216 is provided over the insulator 1214. The insulator 1216 is formed using a material such as silicon oxide, silicon oxynitride, silicon nitride oxide, silicon nitride, aluminum oxide, aluminum oxynitride, aluminum nitride oxide, or aluminum nitride.

Each of the insulators 1220 and 1224 is preferably an insulator containing oxygen, such as a silicon oxide film or a silicon oxynitride film. In particular, the insulator 1224 is preferably an insulator containing excess oxygen (containing oxygen in excess of that in the stoichiometric composition). In the case where such an insulator containing excess oxygen is provided in contact with a metal oxide in the transistor 1200a, oxygen vacancies in the metal oxide can be compensated. Note that the insulators 1222 and 1224 are not necessarily formed of the same material.

The insulator 1222 preferably has a single-layer structure or a layered structure formed using an insulator containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

Note that the insulator 1222 may have a layered structure of two or more layers. In this case, the stacked layers are not necessarily formed of the same material but may be formed of different materials.

In the case where the insulator 1222 including a high-k material is provided between the insulator 1220 and the insulator 1224, electrons can be trapped in the insulator 1222 under specific conditions, and the threshold voltage can be increased. As a result, the insulator 1222 is negatively charged in some cases.

For example, in the case where the insulator 1220 and the insulator 1224 are formed using silicon oxide and the insulator 1222 is formed using a material having a lot of electron trap states such as hafnium oxide, aluminum oxide, or tantalum oxide, the state where the potential of the conductor 1205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide metal in the transistor 1200a to the conductor 1205. At this time, some of the moving electrons are trapped by the electron trap states of the insulator 1222.

In the transistor in which a necessary amount of electrons is trapped by the electron trap states of the insulator 1222, the threshold voltage is shifted in the positive direction. By controlling the voltage of the conductor 1205, the amount of electrons to be trapped can be controlled, and thus the threshold voltage can be controlled. The transistor 1200a having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging. In either case, it is preferable that the transistor be not exposed to temperatures of 125° C. or higher for one hour or more after the process for trapping electrons.

When the insulators 1220 and 1224 are formed using silicon oxide and the insulator 1222 is formed using hafnium oxide, the insulators 1220 and 1224 may be formed by a chemical vapor deposition method (including a CVD method and an atomic layer deposition (ALD) method) and the insulator 1222 may be formed by a sputtering method. Note that using a sputtering method for the formation of the insulator 1222 might easily crystallize the insulator 1222 at low temperature to generate a large amount of fixed charges.

The threshold voltages can be controlled by appropriate adjustment of the thicknesses of the insulator 1220, the insulator 1222, and the insulator 1224. A transistor having a low leakage current in an off state can be provided. A transistor with stable electrical characteristics can be provided. A transistor having high on-state current can be provided. A transistor having a small subthreshold swing value can be provided. A highly reliable transistor can be provided. The materials of the insulator 1220, the insulator 1222, and the insulator 1224 are preferably a 10-nm-thick silicon oxynitride film, a 20-nm-thick aluminum oxide film, and a 30-nm-thick silicon oxynitride film, respectively. It is further preferable to use a 5-nm-thick silicon oxynitride film, a 5-nm-thick aluminum oxide film, and a 5-nm-thick silicon oxynitride film.

The insulator 1222 is preferably formed using a material having a barrier property with respect to oxygen and hydrogen. When such a material is used, release of oxygen from the metal oxide in the transistor 1200a or entry of an impurity such as hydrogen from the outside can be prevented.

The insulator 1250 can have a single-layer structure or a stacked-layer structure using, for example, one or more of an insulator containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 1250, like the insulator 1224, an oxide insulator that contains oxygen in excess of that in the stoichiometric composition is preferably used. When such an insulator containing excess oxygen is provided in contact with the metal oxide 1230, oxygen vacancies in the metal oxide 1230 can be reduced.

As the insulator 1250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator 1250 formed of such a material serves as a layer which prevents release of oxygen from the metal oxide 1230 and entry of an impurity such as hydrogen from the outside.

Note that the insulator 1250 may have a stacked-layer structure similar to that of the insulator 1220, the insulator 1222, and the insulator 1224. When the insulator 1250 includes an insulator in which a necessary amount of electrons is trapped by electron trap states, the threshold voltage of the transistor 1200a can be shifted in the positive direction. The transistor 1200a having the structure is a normally-off transistor which is in a non-conduction state (also referred to as an off state) even when the gate voltage is 0 V.

In addition to the insulator 1250, a barrier film may be provided between the metal oxide 1230 and the conductor 1260 in the transistor illustrated in FIGS. 24A to 24C. Alternatively, the metal oxide 1230c may have a barrier property.

For example, an insulating film containing excess oxygen is provided in contact with the metal oxide 1230 and covered by a barrier film, whereby the composition of the metal oxide can be almost the same as the stoichiometric composition or can be in a supersaturated state containing more oxygen than that in the stoichiometric composition. It is also possible to prevent entry of an impurity such as hydrogen into the metal oxide 1230.

The insulator 1270 may be provided to cover the conductor 1260. In the case where the insulator 1280 is formed using an oxide material from which oxygen is released, the insulator 1270 is formed using a substance having a barrier property with respect to oxygen to prevent the conductor 1260 from being oxidized by the released oxygen.

For example, the insulator 1270 can be formed using metal oxide such as aluminum oxide. The insulator 1270 is formed to a thickness with which the oxidation of the conductor 1260 is prevented. For example, the thickness of the insulator 1270 is set greater than or equal to 1 nm and less than or equal to 10 nm, preferably greater than or equal to 3 nm and less than or equal to 7 nm.

Thus, the oxidation of the conductor 1260 can be prevented, and oxygen released from the insulator 1280 can be supplied to the metal oxide 1230 efficiently.

<<Metal Oxide>>

The metal oxide 1230a, the oxide 1230b, and the oxide 1230c are formed using metal oxide such as In-M-Zn oxide (M is Al, Ga, Y, or Sn). Alternatively, an In—Ga oxide or an In—Zn oxide may be used for the metal oxide 1230.

The metal oxide 1230 according to the present invention is described below.

A metal oxide used as the metal oxide 1230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where a metal oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in the metal oxide according to the present invention are described with reference to FIGS. 27A to 27C. Note that the proportion of oxygen atoms is not illustrated in FIGS. 27A to 27C. The terms of the atomic ratio of indium, the element M, and zinc contained in the oxide are denoted by [In], [M], and [Zn], respectively.

Figure 27A:
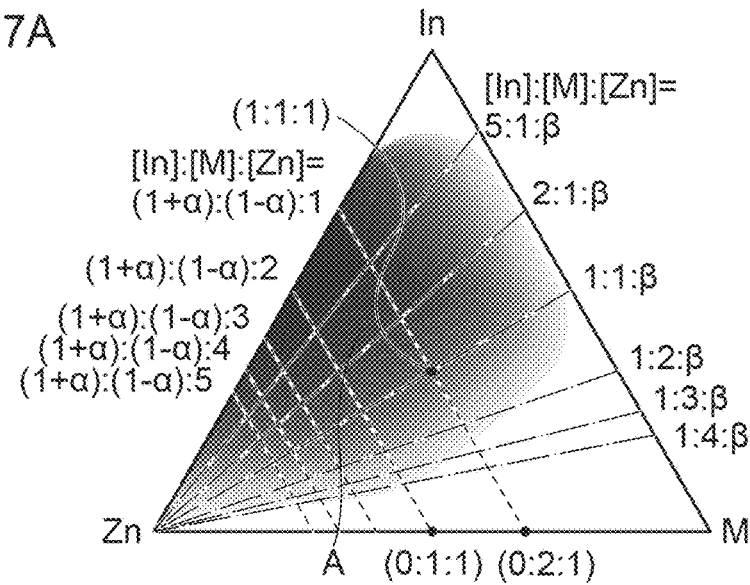
FIGS. 27A to 27C each illustrate an atomic ratio range of an oxide.
Figure 27B:
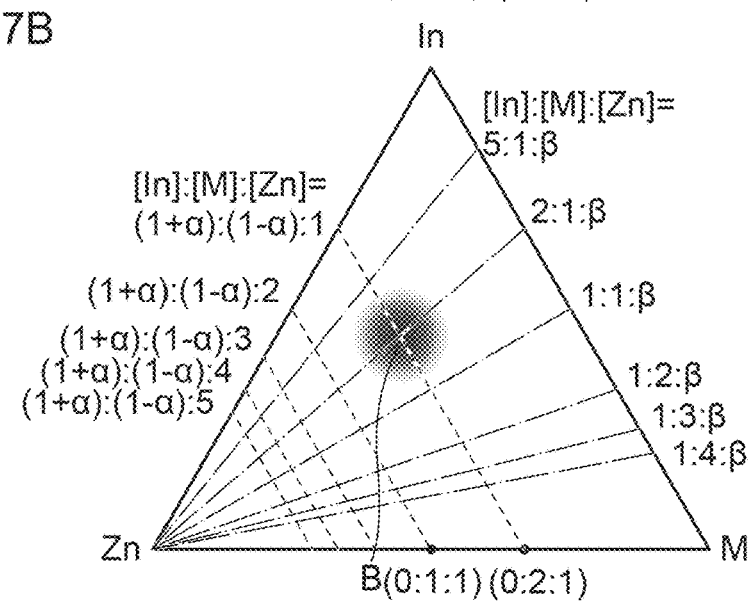
Figure 27C:
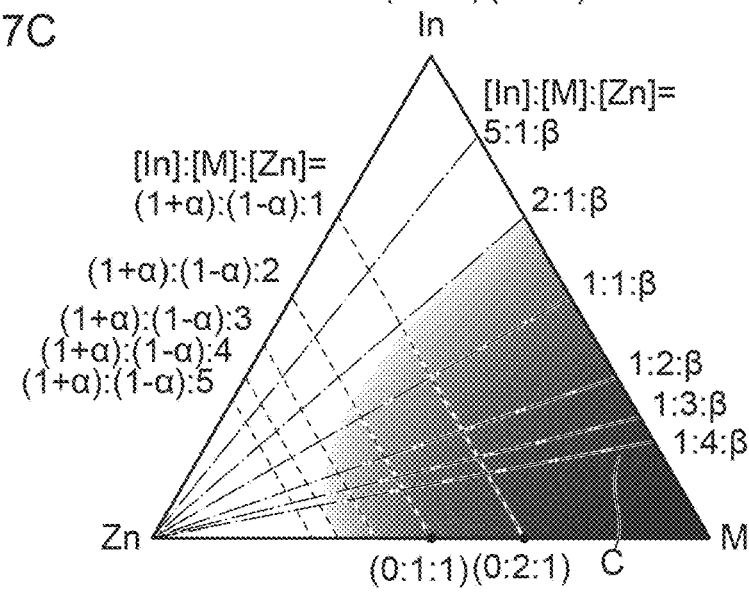

In FIGS. 27A to 27C, broken lines indicate a line where the atomic ratio [In]:[M]:[Zn] is $(1+\alpha):(1-\alpha):1$ where $\alpha$ is a real number greater than or equal to $-1$ and less than or equal to 1, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines correspond to a line representing the atomic ratio of [In]:[M]:[Zn]=$1:1:\beta$ where $\beta$ is a real number greater than or equal to 0, a line representing the atomic ratio of [In]:[M]:[Zn]=$1:2:\beta$, a line representing the atomic ratio of [In]:[M]:[Zn]=$1:3:\beta$, a line representing the atomic ratio of [In]:[M]:[Zn]=$1:4:\beta$, a line representing the atomic ratio of [In]:[M]:[Zn]=$2:1:\beta$, and a line representing the atomic ratio of [In]:[M]:[Zn]=$5:1:\beta$.

A metal oxide having the atomic ratio of [In]:[M]:[Zn]=0:2:1 or a neighborhood thereof in FIGS. 27A to 27C tends to have a spinel crystal structure.

FIGS. 27A and 27B illustrate examples of the preferred ranges of the atomic ratio of indium, the element M, and zinc contained in the metal oxide in one embodiment of the present invention.

Figure 28:
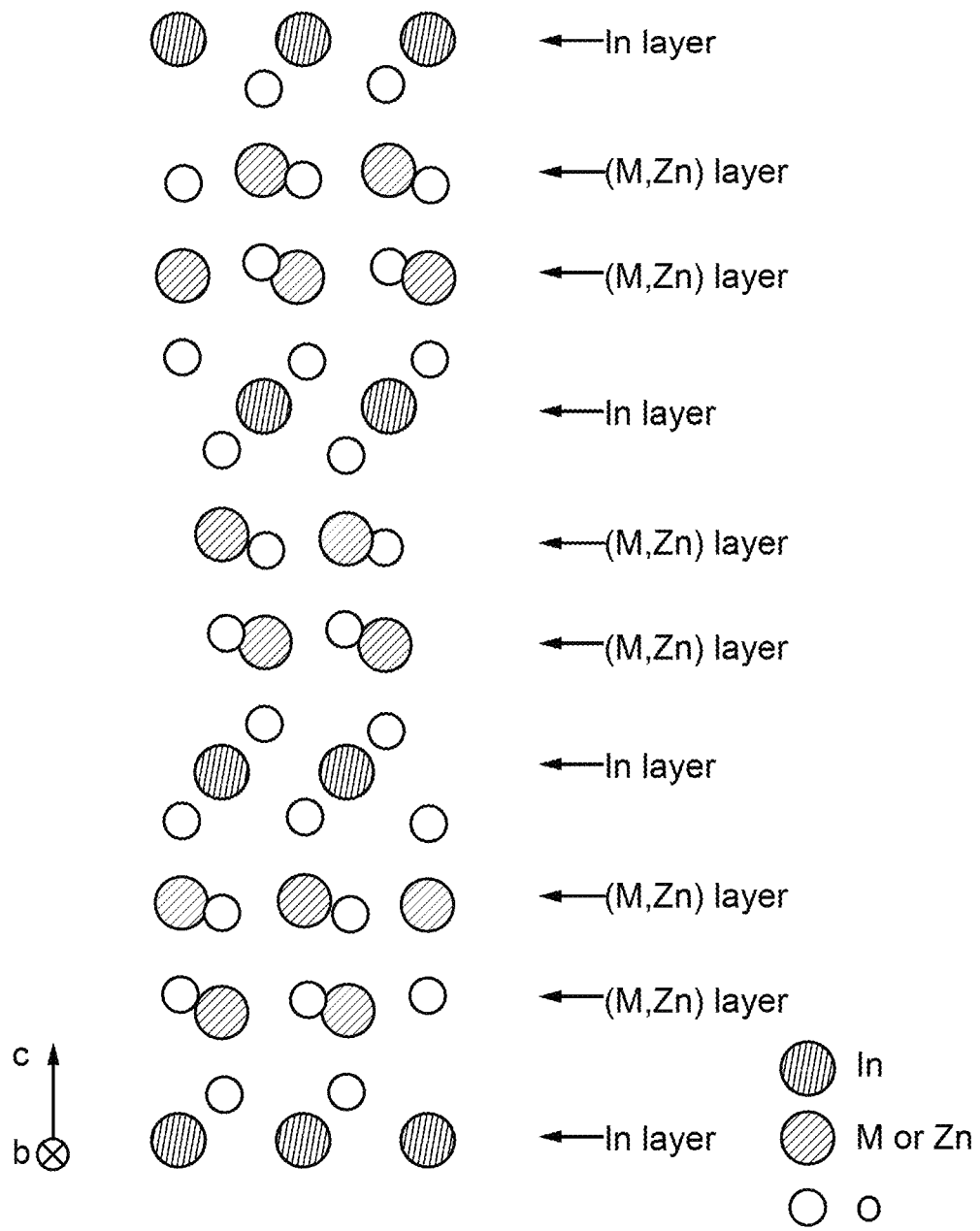
FIG. 28 illustrates a crystal of $InMZnO_4$.

FIG. 28 illustrates an example of the crystal structure of $InMZnO_4$ whose atomic ratio [In]:[M]:[Zn] is 1:1:1. The crystal structure illustrated in FIG. 28 is $InMZnO_4$ observed from a direction parallel to a b-axis. Note that a metal element in a layer that contains M, Zn, and oxygen (hereinafter, this layer is referred to as an "(M,Zn) layer") in FIG. 28 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 28.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

A metal oxide whose atomic ratio [In]:[M]:[Zn] is 1:1:2 has a layered structure that contains three (M,Zn) layers for every In layer. In other words, if [Zn] is larger than [In] and [M], the proportion of (M,Zn) layers to In layers becomes higher when the metal oxide is crystallized.

Note that in the case where the number of (M,Zn) layers with respect to In layer is not an integer in the metal oxide, the metal oxide might have plural kinds of layered structures where the number of (M,Zn) layers with respect to In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the metal oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

In addition, the metal oxide containing indium in a higher proportion can have a higher carrier mobility (electron mobility). This is because in a metal oxide containing indium, the element M, and zinc, the s orbital of heavy metal mainly contributes to carrier transfer, and when the indium content in the metal oxide is increased, overlaps of the s orbitals of indium atoms are increased; therefore, a metal oxide having a high content of indium has a higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the neighborhood thereof (e.g., a region C in FIG. 27C), insulation performance becomes better.

Accordingly, a metal oxide in one embodiment of the present invention preferably has an atomic ratio represented by a region A in FIG. 27A. With the atomic ratio, a layered structure with high carrier mobility and a few grain boundaries is easily obtained.

A region B in FIG. 27B represents an atomic ratio of [In]:[M]:[Zn]=4:2:3 to 4:2:4.1 and the neighborhood thereof. The neighborhood includes an atomic ratio of [In]:[M]:[Zn]=5:3:4. A metal oxide with an atomic ratio represented by the region B is an excellent metal oxide that has particularly high crystallinity and high carrier mobility.

Note that the condition where a metal oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which a metal oxide has a layered structure, and boundaries of the regions A to C are not clear.

Next, the case where the metal oxide is used for a transistor is described.

Note that when the metal oxide is used for a transistor, carrier scattering or the like at a grain boundary can be reduced; thus, the transistor can have high field-effect mobility. In addition, the transistor can have high reliability.

A metal oxide with low carrier density is preferably used for the transistor. For example, the metal oxide has a carrier density lower than $8 \times 10^{11}/cm^3$, preferably lower than $1 \times 10^{11}/cm^3$, further preferably lower than $1 \times 10^{10}/cm^3$ and higher than or equal to $1 \times 10^{-9}/cm^3$.

A highly purified intrinsic or substantially highly purified intrinsic metal oxide has few carrier generation sources, and thus can have a low carrier density. A highly purified intrinsic or substantially highly purified intrinsic metal oxide has a low density of defect states and accordingly has low density of trap states in some cases.

Charge trapped by the trap states in the metal oxide takes a long time to be released and may behave like fixed charge. Thus, a transistor whose channel region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the metal oxide will be described.

When silicon or carbon that is one of Group 14 elements is contained in the metal oxide, defect states are formed in the metal oxide. Thus, the metal oxide is formed to have a region where the concentration of silicon or carbon (measured by secondary ion mass spectrometry (SIMS)) is controlled to be lower than or equal to $2 \times 10^{18}$ atoms/cm$^3$, preferably lower than or equal to $2 \times 10^{17}$ atoms/cm$^3$ in the metal oxide or around an interface with the oxide.

When the metal oxide contains alkali metal or alkaline earth metal, defect states are formed and carriers are generated, in some cases. Thus, a transistor including a metal oxide which contains alkali metal or alkaline earth metal is likely to be normally-on. Therefore, it is preferable to reduce the concentration of alkali metal or alkaline earth metal in the metal oxide. Specifically, the concentration of alkali metal or alkaline earth metal in the metal oxide, which is measured by SIMS, is lower than or equal to $1 \times 10^{18}$ atoms/cm$^3$, preferably lower than or equal to $2 \times 10^{16}$ atoms/cm$^3$.

When containing nitrogen, the metal oxide easily becomes n-type by generation of electrons serving as carriers and an increase of carrier density. Thus, when a metal oxide contains nitrogen, a transistor in which the metal oxide is used for a semiconductor is likely to be normally on. For this reason, nitrogen in the metal oxide is preferably reduced as much as possible; the nitrogen concentration of the metal oxide, which is measured by SIMS, is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including a metal oxide that contains hydrogen is likely to be normally-on. Accordingly, hydrogen in the metal oxide is preferably reduced as much as possible. Specifically, the hydrogen concentration of the metal oxide, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide with sufficiently reduced impurity concentration is used for a channel region in a transistor, the transistor can have stable electrical characteristics.

Next, the case where the metal oxide has a two-layer structure or a three-layer structure is described. A band diagram of a stacked-layer structure of a metal oxide S1, a metal oxide S2, and a metal oxide S3 and insulators that are in contact with the stacked-layer structure, and a metal oxide S3, and a band diagram of a stacked-layer structure of the metal oxide S2 and the metal oxide S3 and insulators that are in contact with the stacked-layer structure are described with reference to FIGS. 29A and 29B.

Figure 29A:
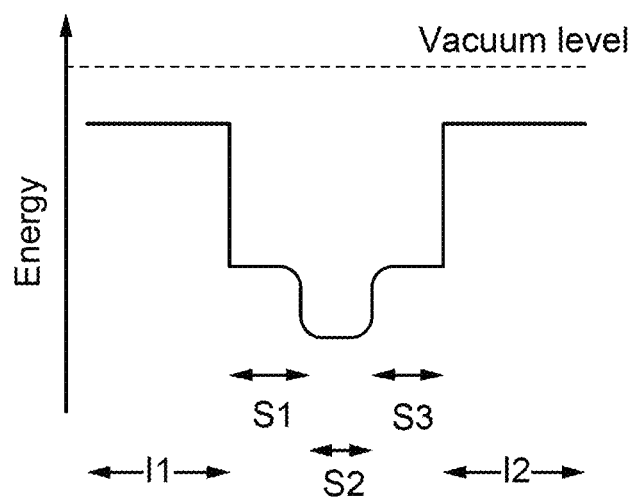
FIGS. 29A and 29B are each a band diagram of a layered structure of oxides.
Figure 29B:
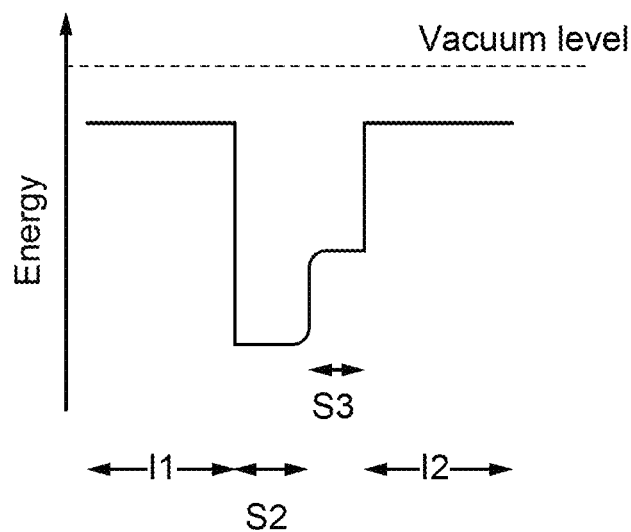

FIG. 29A is an example of a band diagram of a layered structure including an insulator I1, the metal oxide S1, the metal oxide S2, the metal oxide S3, and an insulator I2 in a thickness direction. FIG. 29B is an example of a band diagram of a layered structure including the insulator I1, the metal oxide S2, the metal oxide S3, and the insulator I2 in a thickness direction. Note that for easy understanding, the band diagrams show the conduction band minimum (Ec) of each of the insulator I1, the metal oxide S1, the metal oxide S2, the metal oxide S3, and the insulator I2.

The energy level of the conduction band minimum of each of the metal oxides S1 and S3 is closer to the vacuum level than that of the metal oxide S2 is. Typically, the energy level of the conduction band minimum of the metal oxide S2 is preferably lower than that of each of the metal oxides S1 and S3. Specifically, a difference in the energy level between the conduction band minimum of the metal oxide S2 and the conduction band minimum of each of the metal oxides S1 and S3 is preferably greater than or equal to 0.15 eV and less than or equal to 2 eV, further preferably greater than or equal to 0.5 eV and less than or equal to 1 eV. That is, it is preferable that the electron affinity of the metal oxide S2 be higher than the electron affinity of each of the metal oxides S1 and S3, and the difference between the electron affinity of each of the metal oxides S1 and S3 and the electron affinity of the metal oxide S2 be greater than or equal to 0.15 eV and less than or equal to 2 eV, further preferably greater than or equal to 0.5 eV and less than or equal to 1 eV.

As illustrated in FIGS. 29A and 29B, the conduction band minimum of each of the metal oxides S1 to S3 is gradually varied. In other words, the energy level of the conduction band minimum is continuously changed or continuously connected. In order to obtain such a band diagram, the density of defect states in a mixed layer formed at an interface between the metal oxides S1 and S2 or an interface between the metal oxides S2 and S3 is preferably made low.

Specifically, when the metal oxides S1 and S2 or the metal oxides S2 and S3 contain the same element (as a main component) in addition to oxygen, a mixed layer with a low density of defect states can be formed. For example, in the case where the metal oxide S2 is an In—Ga—Zn oxide, it is preferable to use an In—Ga—Zn oxide, a Ga—Zn oxide, gallium oxide, or the like as each of the metal oxides S1 and S3.

At this time, the metal oxide S2 serves as a main carrier path. Since the density of defect states at the interface between the metal oxides S1 and S2 and the interface between the metal oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The metal oxides S1 and S3 can make the trap state apart from the metal oxide S2. This structure can prevent the positive shift of the threshold voltage of the transistor.

A material whose conductivity is sufficiently lower than that of the metal oxide S2 is used for the metal oxides S1 and S3. In that case, the metal oxide S2, the interface between the metal oxides S1 and S2, and the interface between the metal oxides S2 and S3 mainly function as a channel region. For example, a metal oxide with high insulation performance and the atomic ratio represented by the region C in FIG. 27C can be used as the metal oxides S1 and S3. Note that the region C in FIG. 27C represents the atomic ratio of [In]:[M]:[Zn]=0:1:0 or the neighborhood thereof.

In the case where a metal oxide with the atomic ratio represented by the region A is used as the metal oxide S2, it is particularly preferable to use a metal oxide with an atomic ratio where [M]/[In] is greater than or equal to 1, preferably greater than or equal to 2 as each of the metal oxides S1 and S3. In addition, it is suitable to use a metal oxide with sufficiently high insulation performance and an atomic ratio where [M]/([Zn]+[In]) is greater than or equal to 1 as the metal oxide S3.

<<Source Electrode and Drain Electrode>

One of a pair of the conductor 1240a and the conductor 1241a and a pair of the conductor 1240b the conductor 1241b functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1240a, 1241a, 1240b, and 1241b. Although a two-layer structure is shown in FIGS. 24A to 24C, a single-layer structure or a layered structure of three or more layers may be used.

For example, a titanium film is used as each of the conductor 1240a and the conductor 1240b, and an aluminum film is used as each of the conductor 1241a and the conductor 1241b. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

<<Gate Electrode>>

Conductors 1205a and 1205b that function as a gate electrode are described. A two-layer structure of the conductor 1205a and the conductor 1205b is shown in FIGS.

24A to 24C, but the structure of the conductor 1205 is not limited thereto, and a single-layer structure or a layered structure of three or more layers may be used. For example, a conductor having a barrier property with respect to hydrogen, e.g., tantalum nitride, may be used as the conductor 1205*a*, and tungsten, which has high conductivity, may be stacked thereover as the conductor 1205*b*. The use of the combination of the materials can prevent diffusion of hydrogen into the metal oxide 1230 while conductivity of a wiring is ensured.

Conductors 1260*a* and 1260*b* functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Further, one or more metal elements selected from manganese or zirconium may be used. Alternatively, a semiconductor typified by polycrystalline silicon doped with an impurity element such as phosphorus, or a silicide such as nickel silicide may be used.

For example, a two-layer structure where aluminum is used as the conductor 1260*a* and a titanium film is used as the conductor 1260*b* is used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 1260 can also be formed using a light-transmitting conductive material such as indium tin oxide, indium metal oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 1260 can have a stacked structure using the above light-transmitting conductive material and the above metal.

<<S-Channel Structure>>

As illustrated in FIG. 24C, the transistor 1200*a* has a structure in which a side surface of the metal oxide 1230*b* is surrounded by the conductor 1260. In this specification, a structure in which a region where a channel is formed is electrically surrounded by an electric field of a gate electrode is referred to as a surrounded channel (s-channel) structure. With such a structure, the metal oxide 1230 can be electrically surrounded by the electric field of the conductor 1260, so that a channel is formed in the entire metal oxide 1230*b* (bulk). Thus, a large amount of current can flow between the source and the drain of the transistor, so that a high on-state current can be achieved. Furthermore, a voltage is applied from all directions to a region where a channel is formed, and thus, a transistor in which leakage current is suppressed can be provided.

The s-channel structure, because of its high on-state current, is suitable for a semiconductor device such as large-scale integration (LSI) which requires a miniaturized transistor. A semiconductor device including the miniaturized transistor can have a high integration degree and high density.

Structure Example 2 of Transistor

Figure 25A:
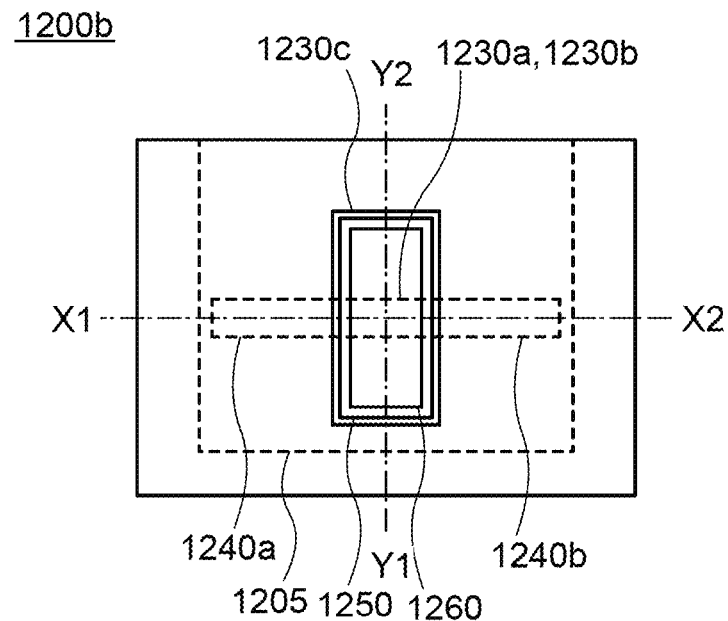
FIGS. 25A to 25C are a top view and cross-sectional views illustrating a structure example of a transistor.
Figure 25B:
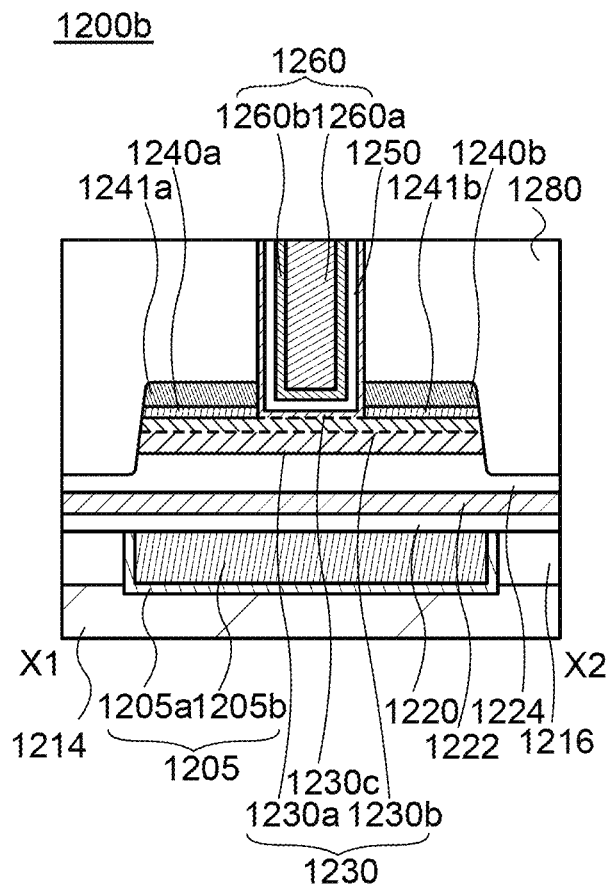
Figure 25C:
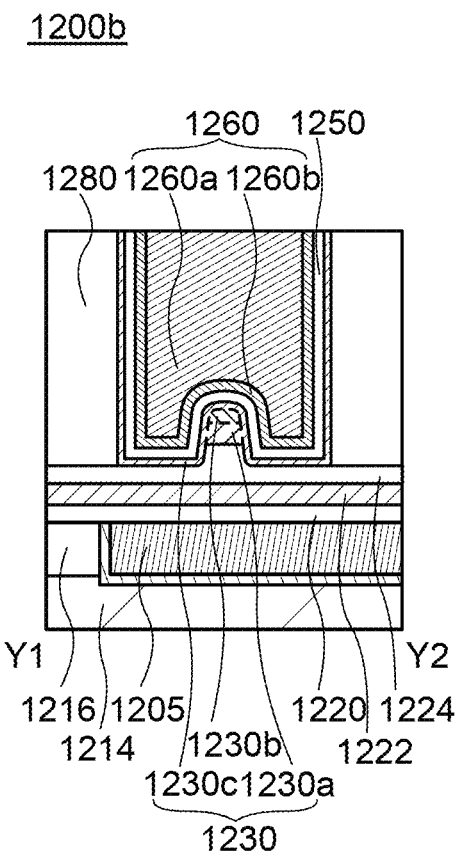

FIGS. 25A to 25C illustrates an example of a structure of a transistor different from the transistor 1200*a*. FIG. 25A illustrates a top surface of a transistor 1200*b*. FIG. 25B is a cross-sectional view taken along the dashed-dotted line X1-X2 in FIG. 25A, and FIG. 25C is a cross-sectional view taken along the dashed-dotted line Y1-Y2 in FIG. 25A.

Note that in the transistor 1200*b* in FIGS. 25A to 25C, components having the same function as the components in the transistor 1200*a* in FIGS. 24A to 24C are denoted by the same reference numerals.

In the structure illustrated in FIGS. 25A to 25C, the metal oxide 1230*c*, the insulator 1250, and the conductor 1260 are formed in an opening formed in the insulator 1280. One end portion of each of the conductors 1240*a* and 1241*a* and one end portion of each of the conductors 1240*b* and 1241*b* are aligned with an end portion of the opening formed in the insulator 1280. An end portion of each of the conductors 1240*a*, 1240*b*, 1241*a*, and 1241*b* is aligned with part of an end portion of the metal oxide 1230. Therefore, the conductors 1240*a*, 1240*b*, 1241*a*, and 1241*b* can be formed concurrently with the metal oxide 1230 or the opening in the insulator 1280. This leads to a reduction in the number of masks and steps and improvement in yield and productivity.

Since the transistor 1200*b* illustrated in FIGS. 25A to 25C has a structure in which the conductors 1240*a*, 1240*b*, 1241*a*, and 1241*b* hardly overlap with the conductor 1260, the parasitic capacitance added to the conductor 1260 can be reduced. Thus, the transistor 1200*b* with a high operation frequency can be provided.

Structure Example 3 of Transistor

Figure 26A:
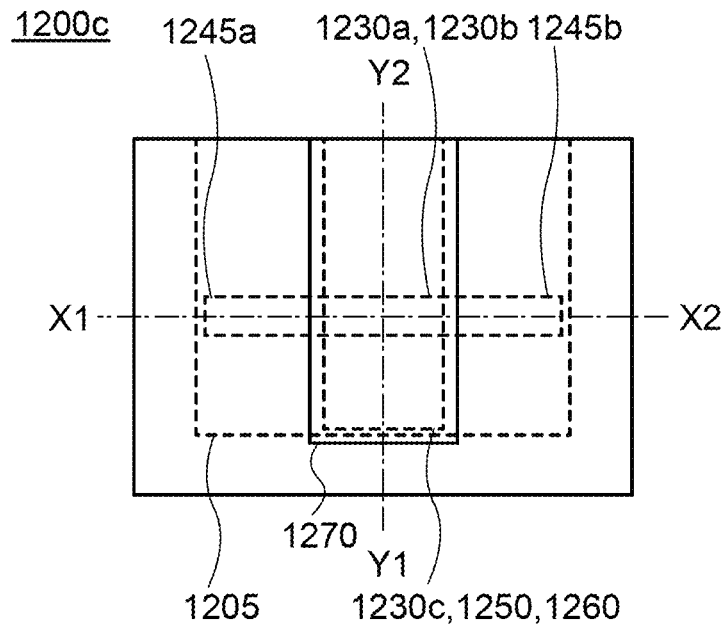
FIGS. 26A to 26C are a top view and cross-sectional views illustrating a structure example of a transistor.
Figure 26B:
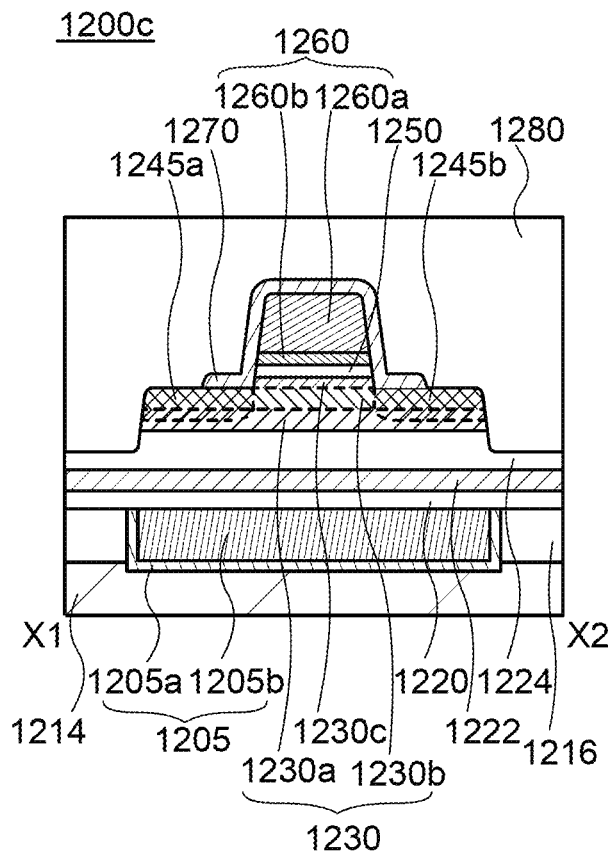
Figure 26C:
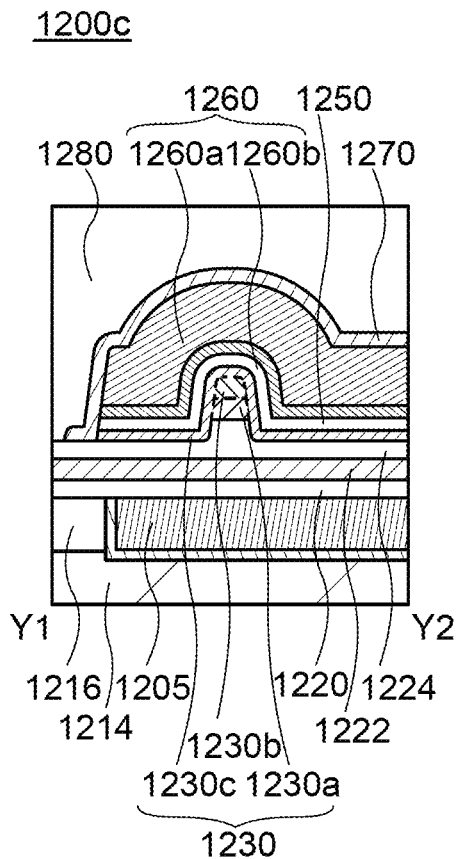

FIGS. 26A to 26C illustrate an example of a structure of a transistor different from the transistor 1200*a* and the transistor 1200*b*. FIG. 26A illustrates a top surface of a transistor 1200*c*. For simplification of the figure, some films are omitted in FIG. 26A. FIG. 26B is a cross-sectional view taken along dashed-dotted line X1-X2 in FIG. 26A, and FIG. 26C is a cross-sectional view taken along dashed-dotted line Y1-Y2 in FIG. 26A.

Note that in the transistor 1200*c* in each of FIGS. 26A to 26C, components having the same function as the components in the transistor 1200*a* in FIGS. 24A to 24C are denoted by the same reference numerals.

In the structure illustrated in FIGS. 26A to 26C, a region 1245*a* which functions as the one of the source region and the drain region and a region 1245*b* which functions as the other of the source region and the drain region are provided in the metal oxide 1230. The regions can be formed in such a manner that an impurity such as boron, phosphorus, or argon is added to the metal oxide 1230 using a conductor 1260 as a mask. Alternatively, the regions can be formed in such a manner that the insulator 1280 is formed of an insulator containing hydrogen, such as a silicon nitride film, and hydrogen is diffused to part of the metal oxide 1230. Thus, the number of masks can be reduced or the number of steps can be reduced. In addition, yield and productivity can be improved.

Structure Example 4 of Transistor

FIGS. 30A to 30D are a top view and cross-sectional views of a transistor 1400. FIG. 30A is a top view of the transistor 1400. FIG. 30B is a cross-sectional view taken along dashed-dotted line A1-A2 in FIG. 30A, and FIG. 30C is a cross-sectional view taken along dashed-dotted line A3-A4 in FIG. 30A. Note that the dashed-dotted line A1-A2 and the dashed-dotted line A3-A4 are sometimes referred to as a channel length direction and a channel width direction, respectively. The transistor 1400 has the s-channel structure like the transistor 1200a and the like.

The transistor 1400 includes a substrate 1450, an insulator 1401 over the substrate 1450, a conductor 1414 over the insulator 1401, an insulator 1402 provided to cover the conductor 1414, an insulator 1403 over the insulator 1402, an insulator 1404 over the insulator 1403, a stacked layer in which a metal oxide 1431, a metal oxide 1432, and a metal oxide 1433 are formed in this order (the stacked layer is collectively referred to as a metal oxide 1430 in some cases) over the insulator 1404, an insulator 1406 over the metal oxide 1433, a conductor 1412 over the insulator 1406, an insulator 1409 on side surfaces of the conductor 1412, an insulator 1407 provided to cover the insulator 1404, the metal oxide 1433, the insulator 1409, and the conductor 1412, and the insulator 1408 over the insulator 1407.

The insulator 1406 and the conductor 1412 overlap with the conductor 1414 and the metal oxide 1432 at least partly. It is preferable that the side edge of the conductor 1412 in the channel length direction be approximately aligned with the side edge of the insulator 1406 in the channel length direction. Here, the insulator 1406 serves as a gate insulator of the transistor 1400, the conductor 1412 serves as a gate electrode of the transistor 1400, and the insulator 1409 serves as a sidewall insulator of the transistor 1400.

The metal oxide 1432 has a region that overlaps with the conductor 1412 with the metal oxide 1433 and the insulator 1406 positioned therebetween. Preferably, the outer edge of the metal oxide 1431 is approximately aligned with the outer edge of the metal oxide 1432, and the outer edge of the metal oxide 1433 is positioned outward from the outer edges of the metal oxides 1431 and 1432. However, the shape of the transistor in this embodiment is not limited to that where the outer edge of the metal oxide 1433 is positioned outward from the outer edge of the metal oxide 1431. For example, the outer edge of the metal oxide 1431 may be positioned outward from the outer edge of the metal oxide 1433, or the side edge of the metal oxide 1431 may be approximately aligned with the side edge of the metal oxide 1433.

<<Substrate>>

As the substrate 1450, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 1450 has small thickness, the weight of the semiconductor device can be reduced. When the substrate 1450 has small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulator>>

The insulator 1401 has a function of electrically isolating the substrate 1450 from the conductor 1414.

The insulator 1401 or 1402 is formed using an insulator having a single-layer structure or a layered structure. Examples of materials used in the insulator includes aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulator 1402 may be formed using silicon oxide with high step coverage that is formed by reacting tetraethyl orthosilicate (TEOS), silane, or the like with oxygen, nitrous oxide, or the like.

After the insulator 1402 is formed, the insulator 1402 may be subjected to planarization treatment using a CMP method or the like to improve the planarity of the top surface thereof.

The insulator 1404 preferably contains an oxide. In particular, the insulator 1404 preferably contains an oxide material from which part of oxygen is released by heating. The insulator 1404 preferably contains an oxide containing oxygen more than that in the stoichiometric composition. Part of oxygen is released by heating from an oxide film containing oxygen more than that in the stoichiometric composition. Oxygen released from the insulator 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen in excess of that in the stoichiometric composition is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulator 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulator 1404.

To make the insulator 1404 contain excess oxygen, the insulator 1404 is formed in an oxygen atmosphere, for example. Alternatively, a region containing excess oxygen may be formed by introducing oxygen into the insulator 1404 that has been formed. Both the methods may be combined.

For example, oxygen (at least including any of oxygen radicals, oxygen atoms, and oxygen ions) may be introduced into the insulator 1404 that has been formed, so that a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Moreover, hydrogen or the like may be included. For example, a mixed gas of carbon dioxide, hydrogen, and argon may be used.

After the insulator 1404 is formed, the insulator 1404 may be subjected to planarization treatment using a CMP method or the like to improve the planarity of the top surface thereof.

The insulator 1403 has a passivation function of preventing oxygen contained in the insulator 1404 from decreasing by bonding to metal contained in the conductor 1414.

The insulator 1403 has a function of blocking oxygen, hydrogen, water, alkali metal, alkaline earth metal, and the like. Providing the insulator 1403 can prevent outward diffusion of oxygen from the metal oxide 1430 and entry of hydrogen, water, or the like into the metal oxide 1430 from the outside.

The insulator 1403 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect with respect to oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

The threshold voltage of the transistor 1400 can be controlled by injecting electrons into a charge trap layer. The charge trap layer is preferably provided in the insulator 1402 or the insulator 1403. For example, when the insulator 1403 is formed using hafnium oxide, aluminum oxide, tantalum oxide, aluminum silicate, or the like, the insulator 1403 can function as a charge trap layer.

<<Gate Electrode>>

The conductor 1412 functions as a first gate electrode. The conductor 1412 may have a layered structure in which a plurality of conductors overlap with each other. The conductor 1414 that is a gate electrode functions as a second gate electrode.

The conductors 1412 and 1414 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductors are preferably formed using a low-resistance conductive material such as aluminum or copper. The conductors are preferably formed using a Cu—Mn alloy, since in that case, manganese oxide formed at the interface with an insulator containing oxygen has a function of preventing Cu diffusion.

Alternatively, the conductor 1412 and/or 1414 may be formed using any one of the metal oxides 1431 to 1433. In this case, to make the metal oxides 1431 to 1433 function as a conductor, an additional step is needed. Specifically, any one of the metal oxides 1431 to 1433 is formed as the conductor 1412 and/or 1414, and a silicon nitride film is formed as the insulator 1407 by a method using plasma containing hydrogen such as a CVD method, thereby reducing the resistance of the metal oxides 1431 to 1433. As a result, the metal oxides 1431 to 1433 function as a conductor and can be used for the conductor 1412 or conductor 1414.

<<Metal Oxide Layer>>

For the details of the metal oxide 1431, the description of the metal oxide 1230a illustrated in FIGS. 24A to 24C may be referred to. For the details of the metal oxide 1432, the description of the metal oxide 1230b illustrated in FIGS. 24A to 24C may be referred to. For the details of the metal oxide 1433, the description of the metal oxide 1230c illustrated in FIGS. 24A to 24C may be referred to.

<<Low-Resistance Region>>

FIG. 30D is an enlarged view of part of FIG. 30B. As shown in FIG. 30D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, lower than or equal to 5%, lower than or equal to 2%, or lower than or equal to 1% of the maximum concentration of a dopant in the region 1461b or 1461c. Note that the dopant may be rephrased as a donor, an acceptor, an impurity, or an element.

As illustrated in FIG. 30D, in the metal oxide 1430, the region 1461a substantially overlaps with the conductor 1412, and the regions 1461b to 1461e are the regions other than the region 1461a. In the regions 1461b and 1461c, the top surface of the metal oxide 1433 is in contact with the insulator 1407. In the regions 1461d and 1461e, the top surface of the metal oxide 1433 is in contact with the insulator 1409 or 1406. That is, as illustrated in FIG. 30D, the border between the regions 1461b and 1461d overlaps with the border between the side edges of the insulators 1407 and 1409. The same applies to the border between the regions 1461c and 1461e. Here, part of the regions 1461d and 1461e preferably overlaps with part of a region (a channel formation region) where the metal oxide 1432 and the conductor 1412 overlap with each other. For example, preferably, the side edges of the regions 1461d and 1461e in the channel length direction are inside of the conductor 1412 and the distance between the side edge of the conductor 1412 and each of the side edges of the regions 1461d and 1461e is d. In that case, the thickness $t_{406}$ of the insulator 1406 and the distance d preferably satisfy $0.25t_{406} < d < t_{406}$.

In the above manner, the regions 1461d and 1461e are formed in part of the region where the metal oxide 1430 and the conductor 1412 overlap with each other. Accordingly, the channel formation region of the transistor 1400 is in contact with the low-resistance regions 1461d and 1461e and a high-resistance offset region is not formed between the region 1461a and each of the regions 1461d and 1461e, so that the on-state current of the transistor 1400 can be increased. Furthermore, since the side edges of the regions 1461d and 1461e in the channel length direction are formed so as to satisfy the above range, the regions 1461d and 1461e can be prevented from spreading inward too much in the channel formation region and thus the transistor 1400 can be prevented from being constantly in an on state.

The regions 1461b to 1461e are formed by ion doping treatment such as an ion implantation method. Therefore, as illustrated in FIG. 30D, the positions of the side edges of the regions 1461d and 1461e in the channel length direction are sometimes shifted to the side edge of the metal oxide 1430 in the channel length direction in a deeper area from the top surface of the metal oxide 1433. The distance d in that case is the distance between the side edge of the conductor 1412 in the channel length direction and each of the side edges of the regions 1461d and 1461e that are closest to the inner part of the conductor 1412.

In some cases, for example, the regions 1461d and 1461e in the metal oxide 1431 do not overlap with the conductor 1412. In that case, at least part of the regions 1461d and 1461e in the metal oxide 1431 or 1432 is preferably formed in a region overlapping with the conductor 1412.

In addition, low-resistance regions 1451 and 1452 are preferably formed in the metal oxide 1431, the metal oxide 1432, and the metal oxide 1433 in the vicinity of the interface with the insulator 1407. The low-resistance regions 1451 and 1452 contain at least one of elements included in the insulator 1407. Preferably, part of the low-resistance regions 1451 and 1452 is substantially in contact with or overlaps partly with the region (the channel formation region) where the metal oxide 1432 and the conductor 1412 overlap with each other.

Since a large part of the metal oxide 1433 is in contact with the insulator 1407, the low-resistance regions 1451 and 1452 are likely to be formed in the metal oxide 1433. The low-resistance regions 1451 and 1452 in the metal oxide 1433 contain a higher concentration of elements included in the insulator 1407 than the region other than the low-resistance regions 1451 and 1452 of the metal oxide 1433 (e.g., the region of the metal oxide 1433 that overlaps with the conductor 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b and 1461c to 1461e other than the low-resistance regions 1451 and 1452, and the lowest in the region 1461a. The added elements refer to a dopant for forming the regions 1461b and 1461c and an element added from the insulator 1407 to the low-resistance regions 1451 and 1452.

Although the low-resistance regions 1451 and 1452 are formed in the transistor 1400, the semiconductor device shown in this embodiment is not limited to this structure. For example, the low-resistance regions 1451 and 1452 need not be formed in the case where the regions 1461b and 1461c have a sufficiently low resistance.

<Gate Insulating Film>

The insulator 1406 preferably contains an insulator with a high relative dielectric constant. For example, the insulator 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulator 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulator 1407 has a function of blocking oxygen, hydrogen, water, alkali metal, alkaline earth metal, and the like. Providing the insulator 1407 can prevent outward diffusion of oxygen from the metal oxide 1430 and entry of hydrogen, water, or the like into the metal oxide 1430 from the outside.

The insulator 1407 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect with respect to oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

An aluminum oxide film is preferably used as the insulator 1407 because it is highly effective in preventing transmission of both oxygen and impurities such as hydrogen and moisture.

The insulator 1408 can be formed using an insulator containing at least one materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, neodymium oxide, and tantalum oxide. Alternatively, for the insulator 1408, a resin such as a polyimide resin, a polyamide resin, an acrylic resin, a siloxane resin, an epoxy resin, or a phenol resin can be used. The insulator 1408 may be a stack including any of the above materials.

Structure Example 5 of Transistor

Figure 31A:
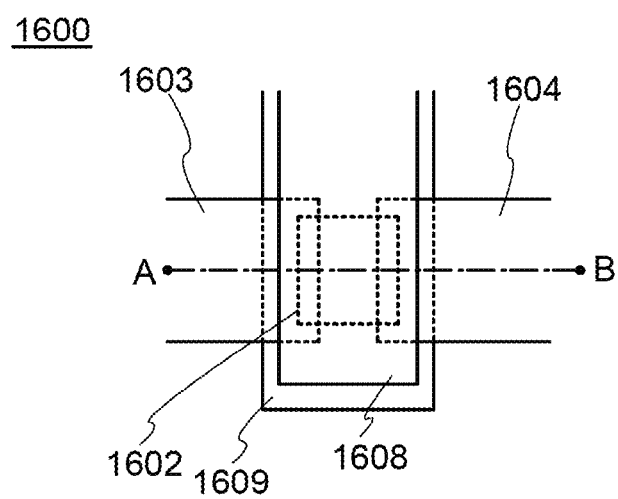
FIGS. 31A and 31B are a top view and a cross-sectional view illustrating a structure example of a transistor.
Figure 31B:
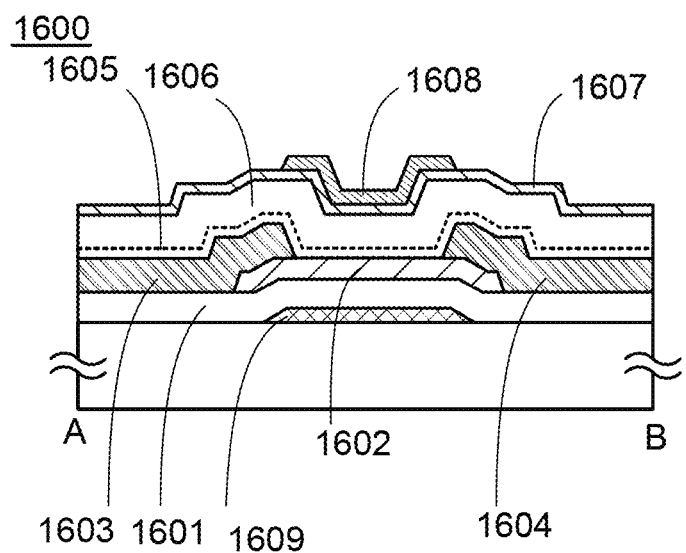

FIGS. 31A and 31B are a top view and a cross-sectional view of a transistor 1600. FIG. 31A is a top view, and FIG. 31B is a cross-sectional view taken along dashed-dotted line A-B in FIG. 31A. Note that for simplification of the drawing, some components are increased or reduced in size, or omitted in FIGS. 31A and 31B. The direction of the dashed-dotted line A-B may be referred to as a channel length direction.

The transistor 1600 illustrated in FIG. 31B includes a conductor 1609 serving as a first gate, a conductor 1608 serving as a second gate, a semiconductor 1602, a conductor 1603 and a conductor 1604 serving as a source and a drain, an insulator 1601, an insulator 1605, an insulator 1606, and an insulator 1607.

The conductor 1609 is on an insulating surface. The conductor 1609 overlaps with the semiconductor 1602 with the insulator 1601 provided therebetween. The conductor 1608 overlaps with the semiconductor 1602 with the insulators 1605, 1606, and 1607 provided therebetween. The conductors 1603 and 1604 are connected to the semiconductor 1602.

The description of the conductor 1412 or 1414 in FIGS. 30A to 30D can be referred to for the details of the conductors 1609 and 1608.

The conductors 1609 and 1608 may be supplied with different potentials, or may be supplied with the same potential at the same time. The conductor 1608 serving as a second gate electrode in the transistor 1600 leads to stabilization of threshold voltage. Note that the conductor 1608 may be omitted in some cases.

The description of the metal oxide 1230b in FIGS. 24A to 24C can be referred to for the details of the semiconductor 1602. The semiconductor 1602 may be a single layer or a stack of a plurality of semiconductor layers.

The conductors 1603 and 1604 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper. The conductors are preferably formed using a Cu—Mn alloy, since in that case, manganese oxide formed at the interface with an insulator containing oxygen has a function of preventing Cu diffusion.

The conductors 1603 and 1604 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The description of the insulator 1406 in FIGS. 30A to 30D can be referred to for the details of the insulator 1601.

The insulators 1605 to 1607 are sequentially stacked over the semiconductor 1602 and the conductors 1603 and 1604 in FIG. 31B; however, an insulator provided over the semiconductor 1602 and the conductors 1603 and 1604 may be a single layer or a stack including a plurality of insulators.

In the case of using an oxide semiconductor as the semiconductor 1602, the insulator 1606 preferably contains oxygen at a proportion higher than or equal to that in the stoichiometric composition and has a function of supplying part of oxygen to the semiconductor 1602 by heating. Note that in the case where providing the insulator 1606 directly on the semiconductor 1602 causes damage to the semiconductor 1602 at the time of formation of the insulator 1606, the insulator 1605 is preferably provided between the semiconductor 1602 and the insulator 1606, as illustrated in FIG. 31B. The insulator 1605 preferably allows oxygen to pass therethrough, and causes little damage to the semiconductor 1602 when the insulator 1605 is formed compared with the case of the insulator 1606. If damage to the semiconductor 1602 can be reduced and the insulator 1606 can be formed directly on the semiconductor 1602, the insulator 1605 is not necessarily provided.

For the insulators 1605 and 1606, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulator 1607 preferably has an effect of blocking diffusion of oxygen, hydrogen, and water. Alternatively, the insulator 1607 preferably has an effect of blocking diffusion of hydrogen and water.

As the insulator has higher density and is denser or has a fewer dangling bonds and is more chemically stable, the insulator has a higher blocking effect. An insulator that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulator that has an effect of blocking diffusion of hydrogen and water can be formed using, for example, silicon nitride or silicon nitride oxide.

In the case where the insulator 1607 has an effect of blocking diffusion of water, hydrogen, and the like, impurities such as water and hydrogen that exist in a resin in a panel or exist outside the panel can be prevented from entering the semiconductor 1602. In the case where an oxide semiconductor is used as the semiconductor 1602, part of water or hydrogen that enters the oxide semiconductor serves as an electron donor (donor). Thus, the use of the insulator 1607 having the blocking effect can prevent a shift in the threshold voltage of the transistor 1600 due to generation of donors.

In addition, since an oxide semiconductor is used for the semiconductor 1602, when the insulator 1607 has an effect of blocking diffusion of oxygen, diffusion of oxygen from the oxide semiconductor to the outside can be prevented. Accordingly, oxygen vacancies in the oxide semiconductor that serve as donors are reduced, so that a shift in the threshold voltage of the transistor 1600 due to generation of donors can be prevented.

Note that this embodiment can be combined with any of the other embodiments in this specification as appropriate.

Embodiment 8

Described in this embodiment are structures of an oxide semiconductor film capable of being used for the OS transistors described in the above embodiments.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 32A:
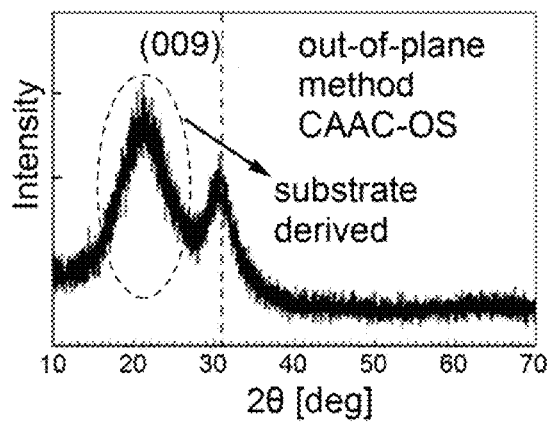
FIGS. 32A to 32E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 32A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 32B:
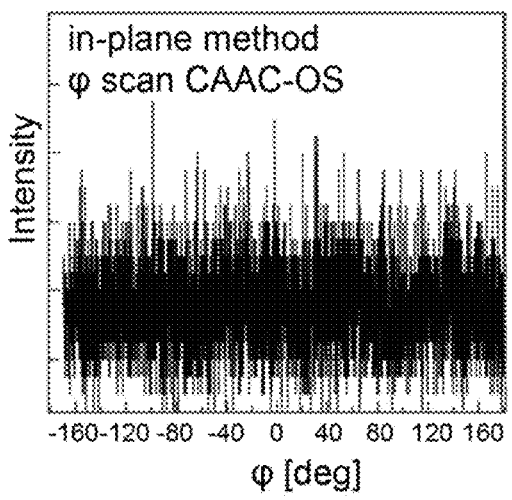
Figure 32C:
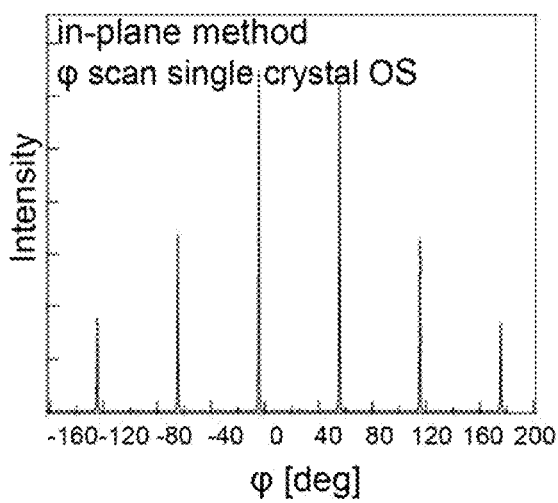

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 32B, a peak is not clearly observed. In contrast, in the case where single crystal $InGaZnO_4$ is subjected to φ scan with 2θ fixed at around 56°, as shown in FIG. 32C, six peaks which are derived from crystal planes equivalent to the (110) plane are observed. Accordingly, the structural analysis using XRD shows that the directions of a-axes and b-axes are irregularly oriented in the CAAC-OS.

Figure 32D:
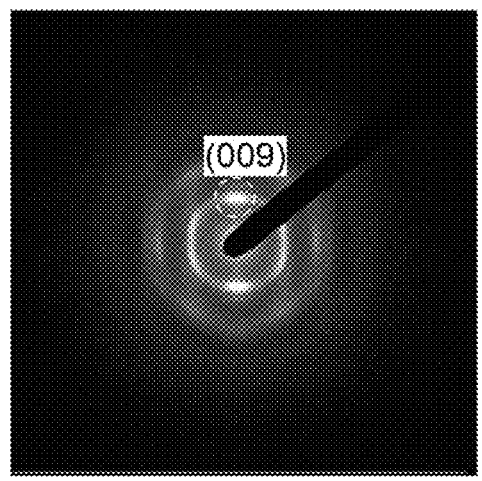
Figure 32E:
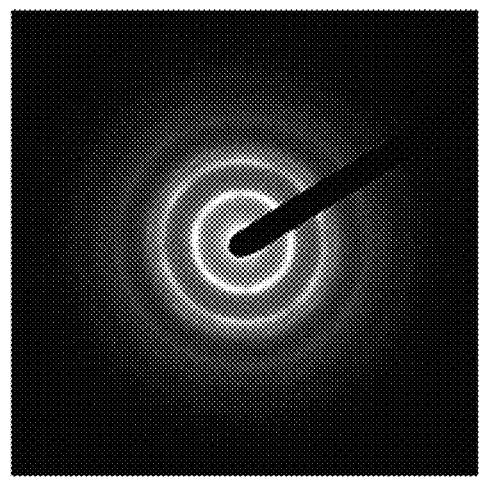

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 32D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 32E shows a diffraction pattern obtained in such a manner that an electron beam with a probe diameter of 300 nm is incident on the same sample in a direction perpendicular to the sample surface. As shown in FIG. 32E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 32E is considered to be derived from the (010) plane, the (100) plane, and the like of the $InGaZnO_4$ crystal. The second ring in FIG. 32E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 33A:
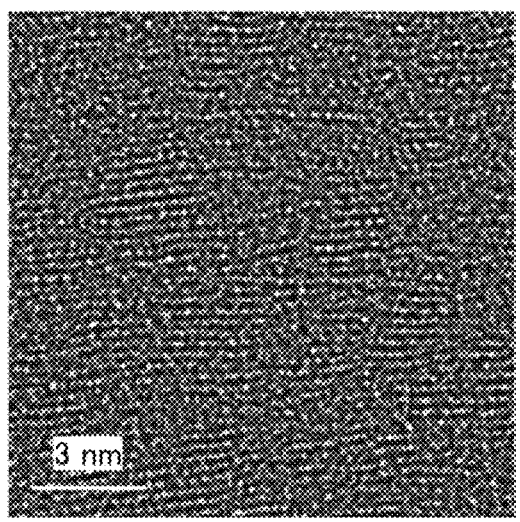
FIGS. 33A to 33E show a cross-sectional TEM image and plan-view TEM images of a CAAC-OS and images obtained through analysis thereof.

FIG. 33A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 33A shows pellets in which metal atoms are arranged in a layered manner. FIG. 33A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 33B:
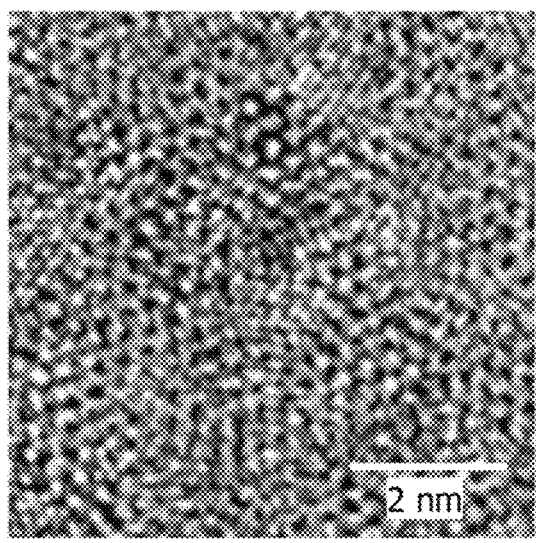
Figure 33C:
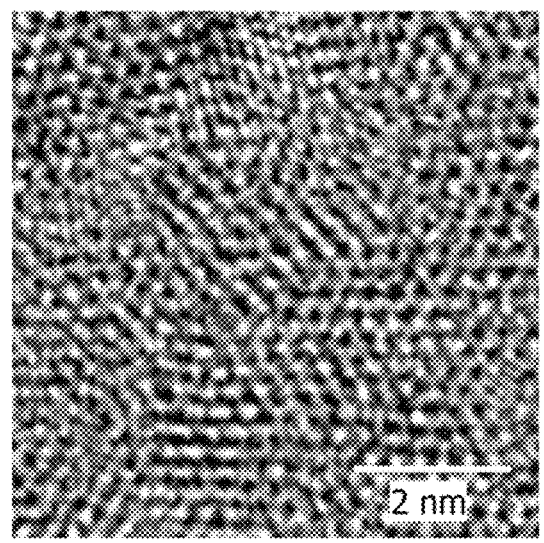
Figure 33D:
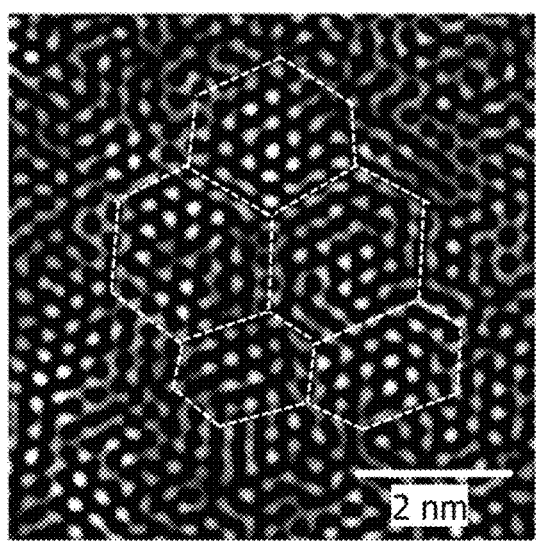
Figure 33E:
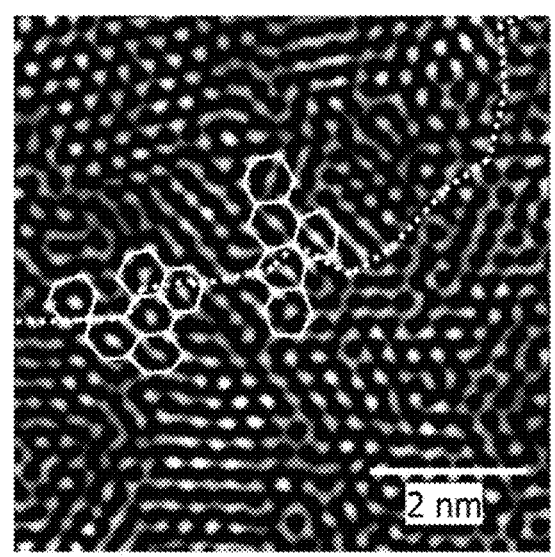

FIGS. 33B and 33C show Cs-corrected high-resolution TEM images of a plane of the CAAC-OS observed from a direction substantially perpendicular to the sample surface. FIGS. 33D and 33E are images obtained through image processing of FIGS. 33B and 33C. The method of image processing is as follows. The image in FIG. 33B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 33D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 33E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 34A:
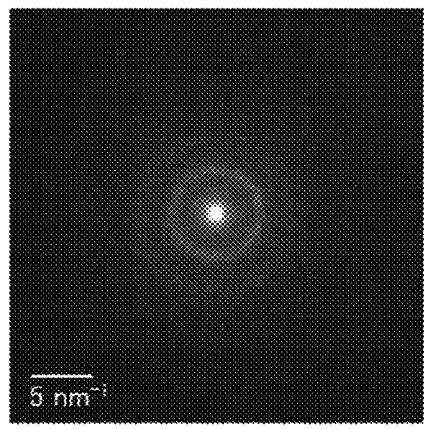
FIGS. 34A to 34D show electron diffraction patterns and a cross-sectional TEM image of an nc-OS.
Figure 34B:
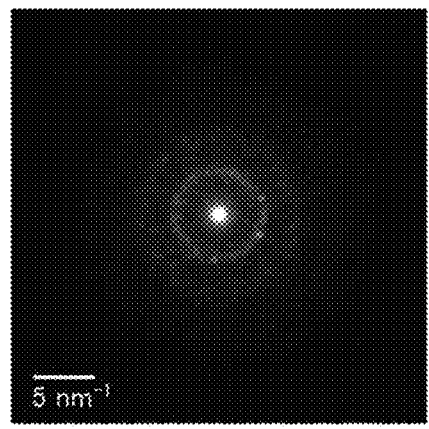

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 34A is observed. FIG. 34B shows a diffraction pattern (a nanobeam electron diffraction pattern) obtained when an electron beam with a probe diameter of 1 nm is incident on the same sample. As shown in FIG. 34B, a plurality of spots are observed in a ring-like region. In other words, ordering in an nc-OS is not observed with an electron beam with a probe diameter of 50 nm but is observed with an electron beam with a probe diameter of 1 nm.

Figure 34C:
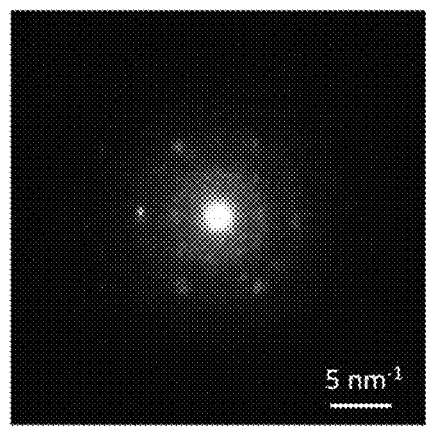

Furthermore, an electron diffraction pattern in which spots are arranged in an approximately regular hexagonal shape is observed in some cases as shown in FIG. 34C when an electron beam having a probe diameter of 1 nm is incident on a region with a thickness less than 10 nm. This means that an nc-OS has a well-ordered region, i.e., a crystal, in the range less than 10 nm in thickness. Note that an electron diffraction pattern having regularity is not observed in some regions because crystals are aligned in various directions.

Figure 34D:
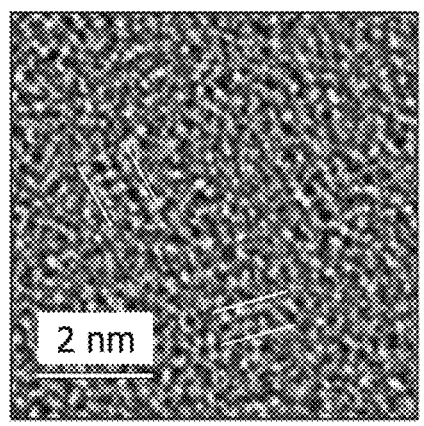

FIG. 34D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 34D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

Figure 35A:
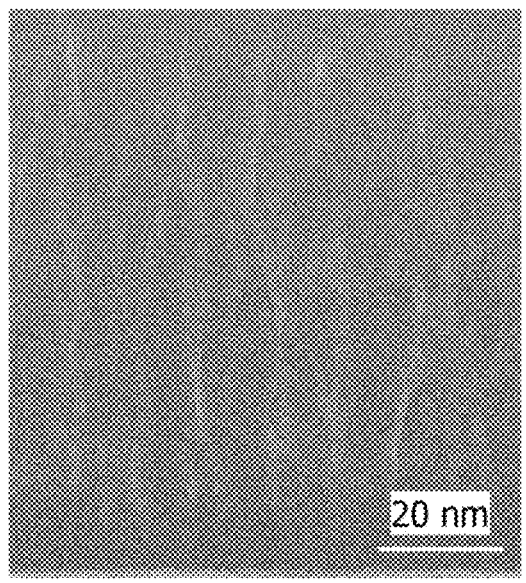
FIGS. 35A and 35B show cross-sectional TEM images of an a-like OS.
Figure 35B:
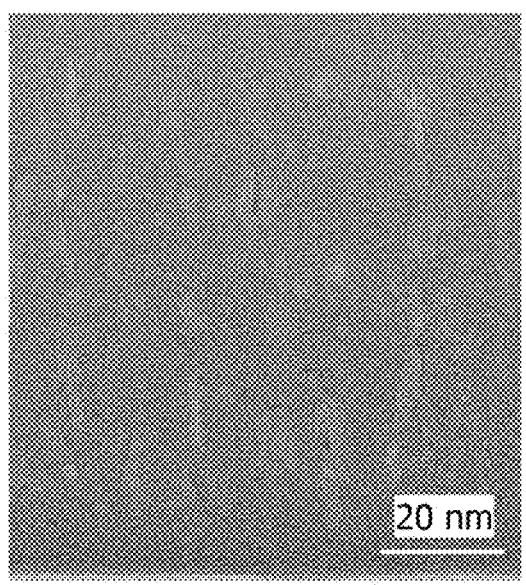

FIGS. 35A and 35B are high-resolution cross-sectional TEM images of an a-like OS. FIG. 35A is the high-resolution cross-sectional TEM image of the a-like OS at the start of the electron irradiation. FIG. 35B is the high-resolution cross-sectional TEM image of the a-like OS after the electron (e) irradiation at 4.3×10⁸ e⁻/nm². FIGS. 35A and 35B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 36:
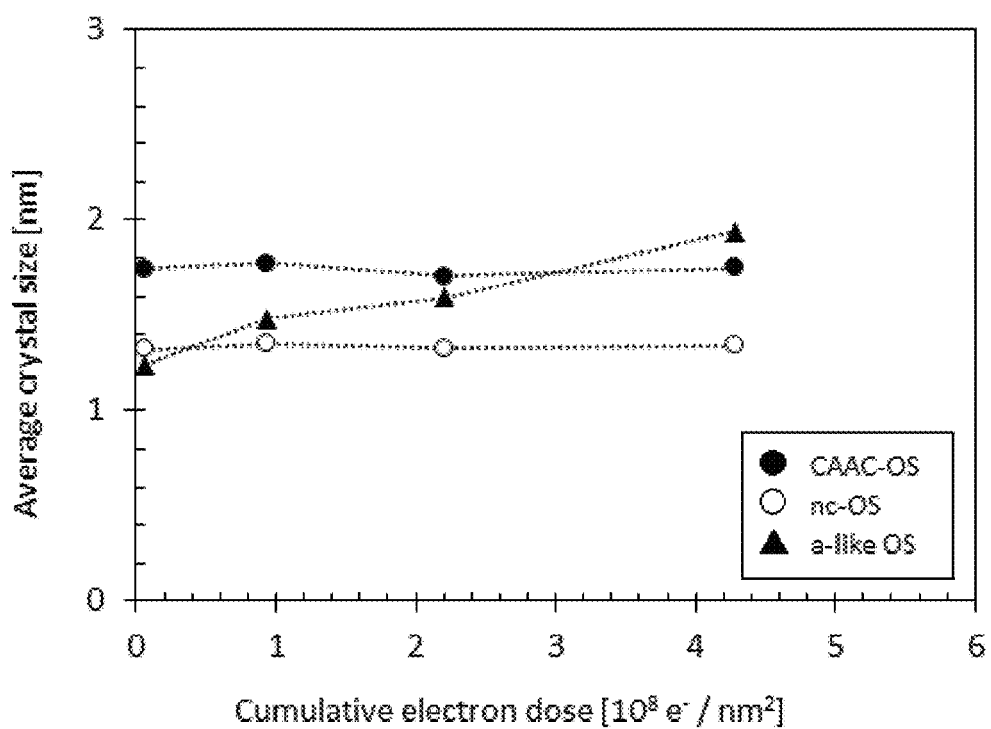
FIG. 36 shows a change in crystal part of an In—Ga—Zn oxide induced by electron irradiation.

FIG. 36 shows change in the average size of crystal parts (at 22 points to 30 points) in each sample. Note that the crystal part size corresponds to the length of a lattice fringe. FIG. 36 indicates that the crystal part size in the a-like OS increases with an increase in the cumulative electron dose in obtaining TEM images, for example. As shown in FIG. 36, a crystal part of approximately 1.2 nm (also referred to as an initial nucleus) at the start of TEM observation grows to a size of approximately 1.9 nm at a cumulative electron (e) dose of 4.2×10⁸ e⁻/nm². In contrast, the crystal part size in the nc-OS and the CAAC-OS shows little change from the start of electron irradiation to a cumulative electron dose of 4.2×10⁸ e⁻/nm². As shown in FIG. 36, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was 6.7×10⁵ e⁻/(nm²·s); and the diameter of the irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_OH$). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly intrinsic purified oxide semiconductor is lower than $8 \times 10^{15}$ cm⁻³, preferably lower than $1 \times 10^{11}$ cm⁻³, and further preferably lower than $1 \times 10^{10}$ cm⁻³ and is higher than or equal to $1 \times 10^{-9}$ cm⁻³.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ $cm^{-3}$ and lower than $1\times10^{18}$ $cm^{-3}$, further preferably higher than or equal to $1\times10^7$ $cm^{-3}$ and lower than or equal to $1\times10^{17}$ $cm^{-3}$, still further preferably higher than or equal to $1\times10^9$ $cm^{-3}$ and lower than or equal to $5\times10^{16}$ $cm^{-3}$, yet further preferably higher than or equal to $1\times10^{10}$ $cm^{-3}$ and lower than or equal to $1\times10^{16}$ $cm^{-3}$, and yet still preferably higher than or equal to $1\times10^{11}$ $cm^{-3}$ and lower than or equal to $1\times10^{15}$ $cm^{-3}$.

Note that this embodiment can be combined with any of the other embodiments in this specification as appropriate.

(Notes on the Description in this Specification and the Like)

The following are notes on the structures in the above embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as first, second, and third are used in order to avoid confusion among components. Thus, the terms do not limit the number or order of components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain)

electrode, or the like as appropriate depending on the situation. In this specification and the like, two terminals except a gate are sometimes referred to as a first terminal and a second terminal or as a third terminal and a fourth terminal. In this specification and the like, in the case where a transistor has two or more gates (this structure is referred to as a dual-gate structure in some cases), these gates are referred to as a first gate and a second gate or a front gate and a back gate in some cases. In particular, the term "front gate" can be replaced with a simple term "gate". Note that a "bottom gate" is a terminal which is formed before a channel formation region in manufacture of a transistor, and a "top gate" is a terminal which is formed after a channel formation region in manufacture of a transistor.

A transistor is an element having three terminals: a gate, a source, and a drain. A gate is a terminal which functions as a control terminal for controlling the conduction state of a transistor. Depending on the type of the transistor or levels of potentials applied to the terminals, one of a pair of input/output terminals functions as a source and the other functions as a drain. Therefore, the terms "source" and "drain" can be switched in this specification and the like. In this specification and the like, two terminals except a gate are sometimes referred to as a first terminal and a second terminal or as a third terminal and a fourth terminal.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

Notes on Definitions of Terms

The following are definitions of the terms mentioned in the above embodiments.

<<Semiconductor>>

In this specification, a "semiconductor" may have characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor layer is silicon, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow through the drain, the channel formation region, and the source. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<High-Level Potential and Low-Level Potential>>

In this specification, when there is a description saying that a high-level potential is applied to a wiring, the high-level potential sometimes means at least one of the following potentials: a potential high enough to turn on an n-channel transistor with a gate connected to the wiring; and a potential high enough to turn off a p-channel transistor with a gate connected to the wiring. Thus, when high-level potentials are applied to different two or more wirings, the high-level potentials applied to the wirings may be at different levels.

In this specification, when there is a description saying that a low-level potential is applied to a wiring, the low-level potential sometimes means at least one of the following potentials: a potential low enough to turn off an n-channel transistor with a gate connected to the wiring; and a potential low enough to turn on a p-channel transistor with a gate connected to the wiring. Thus, when low-level potentials are applied to different two or more wirings, the low-level potentials applied to the wirings may be at different levels.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a line, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines is greater than or equal to −30° and less than or equal to 30°. The terms "perpendicular" indicates that the angle formed between two straight lines is greater than or equal to 80° and less than or equal to 100°. Thus, the case where the angle is greater than or equal to 85° and less than or equal to 95° is also included. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial No. 2015-256428 filed with Japan Patent Office on Dec. 28, 2015, the entire contents of which are hereby incorporated by reference.

What is claimed is:

1. A semiconductor device comprising a word line divider and a memory cell,
   the word line divider comprising a first transistor, a second transistor, a third transistor, a first capacitor and a second capacitor,
      wherein one of a source and a drain of the first transistor is connected to a word line, and the other of the source and the drain of the first transistor is connected to a first wiring,
      wherein one of a source and a drain of the second transistor is connected to the first wiring,
      wherein a gate of the first transistor and a gate of the second transistor are connected to a second wiring,
      wherein one of a source and a drain of the third transistor is connected to a third wiring,
      wherein one electrode of the first capacitor is connected to the first wiring, and
      wherein the other electrode of the first capacitor and one electrode of the second capacitor are connected to the other of the source and the drain of the third transistor,
   the memory cell comprising a fourth transistor and a third capacitor,
      wherein one of a source and a drain of the fourth transistor is connected to a bit line, wherein the other of the source and the drain of the fourth transistor is connected to one electrode of the third capacitor, and wherein a first gate of the fourth transistor is connected to the first wiring, and a second gate of the fourth transistor is connected to the other of the source and the drain of the third transistor.

2. The semiconductor device according to claim 1, wherein the first transistor is a p-channel transistor, and the second transistor is an n-channel transistor.

3. The semiconductor device according to claim 1, wherein the fourth transistor includes an oxide semiconductor in a channel formation region.

4. The semiconductor device according to claim 1, wherein the third transistor includes an oxide semiconductor in a channel formation region.

5. A memory device comprising a driver circuit and the semiconductor device according to claim 1.

6. An electronic device comprising a housing and the memory device according to claim 5.

\* \* \* \* \*